United States Patent
Rotzoll et al.

(10) Patent No.: US 12,414,471 B2
(45) Date of Patent: Sep. 9, 2025

(54) PIEZOELECTRIC POWER COMPONENTS

(71) Applicant: X-Celeprint Limited, Dublin (IE)

(72) Inventors: Robert R. Rotzoll, Colorado Springs, CO (US); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 585 days.

(21) Appl. No.: 17/717,680

(22) Filed: Apr. 11, 2022

(65) Prior Publication Data

US 2022/0238790 A1 Jul. 28, 2022

Related U.S. Application Data

(63) Continuation-in-part of application No. 17/067,616, filed on Oct. 9, 2020, which is a continuation-in-part of application No. 16/865,257, filed on May 1, 2020.

(60) Provisional application No. 63/174,018, filed on Apr. 12, 2021.

(51) Int. Cl.
*H10N 30/30* (2023.01)
*H02N 2/18* (2006.01)

(52) U.S. Cl.
CPC ........... *H10N 30/306* (2023.02); *H02N 2/186* (2013.01)

(58) Field of Classification Search
CPC ............................ H10N 30/306; H02N 2/186
USPC ........................................................ 310/339
See application file for complete search history.

(56) References Cited

U.S. PATENT DOCUMENTS

| | | | |
|---|---|---|---|
| 5,394,969 A | 3/1995 | Harbaugh | |
| 5,439,840 A | 8/1995 | Jones, Jr. et al. | |
| 5,633,552 A | 5/1997 | Lee et al. | |
| 5,636,270 A | 6/1997 | Davey | |
| 6,078,229 A | 6/2000 | Funada et al. | |
| 6,131,718 A | 10/2000 | Witschorik | |
| 6,535,407 B1 | 3/2003 | Zaitsu | |

(Continued)

FOREIGN PATENT DOCUMENTS

| | | |
|---|---|---|
| KR | 2009/0061862 A | 6/2009 |
| KR | 2012/0074556 A | 7/2012 |

OTHER PUBLICATIONS

International Search Report, International Application No. PCT/EP2021/061358, 6 pages, (mailed Nov. 18, 2021).

(Continued)

*Primary Examiner* — Allyson N Trail
(74) *Attorney, Agent, or Firm* — Choate, Hall & Stewart LLP; Michael D. Schmitt

(57) ABSTRACT

A hybrid document includes a flexible document having visible markings. One or more light-controlling elements and a controller are embedded in or on the flexible document. The controller is electrically connected to the one or more light-controlling elements to control the one or more light-controlling elements. A power input connection is electrically connected to the controller, or one or more light-controlling elements, or both. A power source can be connected to the power input connection, for example a piezoelectric or photovoltaic power source. In response to applied power, the controller causes the one or more light-controlling elements to emit light. In some embodiments, the controller includes a memory and a value can be stored in the memory and displayed by the light-controlling element(s). In some embodiments, the value can be assigned or varied by a hybrid currency teller machine.

18 Claims, 59 Drawing Sheets

(56) References Cited

U.S. PATENT DOCUMENTS

| | | | |
|---|---|---|---|
| 6,566,981 B2 | 5/2003 | Urabe et al. | |
| 6,627,966 B2 | 9/2003 | Jeong et al. | |
| 6,911,708 B2 | 6/2005 | Park | |
| 7,463,117 B2 | 12/2008 | Ohara et al. | |
| 7,622,367 B1 | 11/2009 | Nuzzo et al. | |
| 7,982,364 B2 | 7/2011 | Takayama et al. | |
| 8,391,688 B2 | 3/2013 | Zhang et al. | |
| 8,506,867 B2 | 8/2013 | Menard | |
| 8,618,721 B2 | 12/2013 | Ichikawa et al. | |
| 8,722,458 B2 | 5/2014 | Rogers et al. | |
| 8,791,822 B2 | 7/2014 | Delia et al. | |
| 8,901,802 B1 | 12/2014 | Que | |
| 9,013,272 B2 * | 4/2015 | Kaminska | H04L 63/12 235/494 |
| 9,997,102 B2 | 6/2018 | Rotzoll et al. | |
| 10,150,325 B2 | 12/2018 | Cok et al. | |
| 10,150,326 B2 | 12/2018 | Cok et al. | |
| 10,198,890 B2 | 2/2019 | Rotzoll et al. | |
| 10,200,013 B2 | 2/2019 | Bower et al. | |
| 10,217,730 B2 | 2/2019 | Bower et al. | |
| 10,294,131 B2 | 5/2019 | Andelman | |
| 10,339,434 B2 | 7/2019 | Cox | |
| 10,361,677 B2 | 7/2019 | Bower et al. | |
| 10,804,880 B2 | 10/2020 | Cok | |
| 10,839,280 B2 | 11/2020 | Cox | |
| 11,274,035 B2 | 3/2022 | Gul et al. | |
| 2002/0197844 A1 | 12/2002 | Johnson et al. | |
| 2005/0150740 A1 | 7/2005 | Finkenzeller et al. | |
| 2007/0103666 A1 | 5/2007 | Ottens et al. | |
| 2008/0079333 A1 | 4/2008 | Ulm et al. | |
| 2008/0094775 A1 | 4/2008 | Sneh et al. | |
| 2009/0002199 A1 | 1/2009 | Lainonen et al. | |
| 2009/0009244 A1 | 1/2009 | Banba | |
| 2011/0062826 A1 | 3/2011 | Umeki et al. | |
| 2011/0140578 A1 | 6/2011 | Ko et al. | |
| 2012/0038463 A1 | 2/2012 | Kaminska et al. | |
| 2012/0212101 A1 | 8/2012 | Tabata et al. | |
| 2013/0043767 A1 | 2/2013 | Yamamoto et al. | |
| 2013/0065564 A1 | 3/2013 | Conner et al. | |
| 2013/0082569 A1 | 4/2013 | Hirabayashi et al. | |
| 2013/0185201 A1 | 7/2013 | Jain et al. | |
| 2014/0062389 A1 | 3/2014 | Ide et al. | |
| 2015/0125829 A1 | 5/2015 | Hyman | |
| 2015/0255701 A1 | 9/2015 | Kobayashi | |
| 2015/0372053 A1 | 12/2015 | Bower et al. | |
| 2016/0093600 A1 | 3/2016 | Bower et al. | |
| 2016/0149555 A1 | 5/2016 | Sarata et al. | |
| 2017/0038408 A1 | 2/2017 | Ha et al. | |
| 2017/0249983 A1 | 8/2017 | Park et al. | |
| 2018/0199127 A1 | 7/2018 | Hosoi et al. | |
| 2019/0058242 A1 | 2/2019 | Tabe | |
| 2020/0076372 A1 | 3/2020 | Schroegendorfer | |
| 2020/0296825 A1 | 9/2020 | Ozdoganlar et al. | |
| 2021/0002128 A1 | 1/2021 | Cok et al. | |
| 2021/0135648 A1 | 5/2021 | Trindade et al. | |
| 2021/0135649 A1 | 5/2021 | Trindade et al. | |
| 2021/0169417 A1 | 6/2021 | Burton | |
| 2021/0339552 A1 * | 11/2021 | Cok | B42D 25/305 |
| 2022/0001192 A1 * | 1/2022 | Kim | D06B 1/02 |
| 2022/0112078 A1 | 4/2022 | Rubino | |
| 2022/0115582 A1 * | 4/2022 | Tsuruoka | H10N 30/872 |
| 2022/0131519 A1 | 4/2022 | Ohnishi et al. | |
| 2022/0146076 A1 * | 5/2022 | Bourke, Jr. | A23L 2/50 |
| 2022/0223781 A1 | 7/2022 | Sadr | |
| 2022/0238790 A1 * | 7/2022 | Rotzoll | H10N 30/306 |
| 2022/0285291 A1 | 9/2022 | Trindade et al. | |
| 2022/0344970 A1 * | 10/2022 | Affleck | H10N 30/306 |
| 2023/0055056 A1 * | 2/2023 | Suzuki | H10N 35/85 |
| 2023/0168138 A1 | 6/2023 | Hou et al. | |
| 2023/0351235 A1 * | 11/2023 | Clark | G06N 10/20 |
| 2024/0006674 A1 * | 1/2024 | Osada | H01M 10/48 |
| 2024/0152718 A1 | 5/2024 | Yee et al. | |
| 2024/0153933 A1 * | 5/2024 | Cok | H02N 2/18 |
| 2024/0348228 A1 * | 10/2024 | Stolt | H03H 9/02086 |

OTHER PUBLICATIONS

Written Opinion, International Application No. PCT/EP2021/061358, 9 pages, (mailed Nov. 18, 2021).

\* cited by examiner

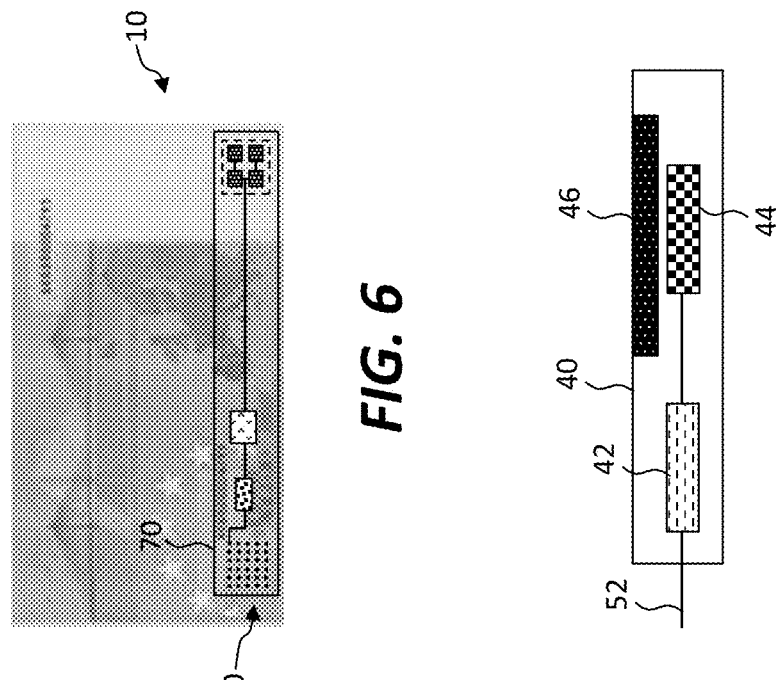
FIG. 6
FIG. 7
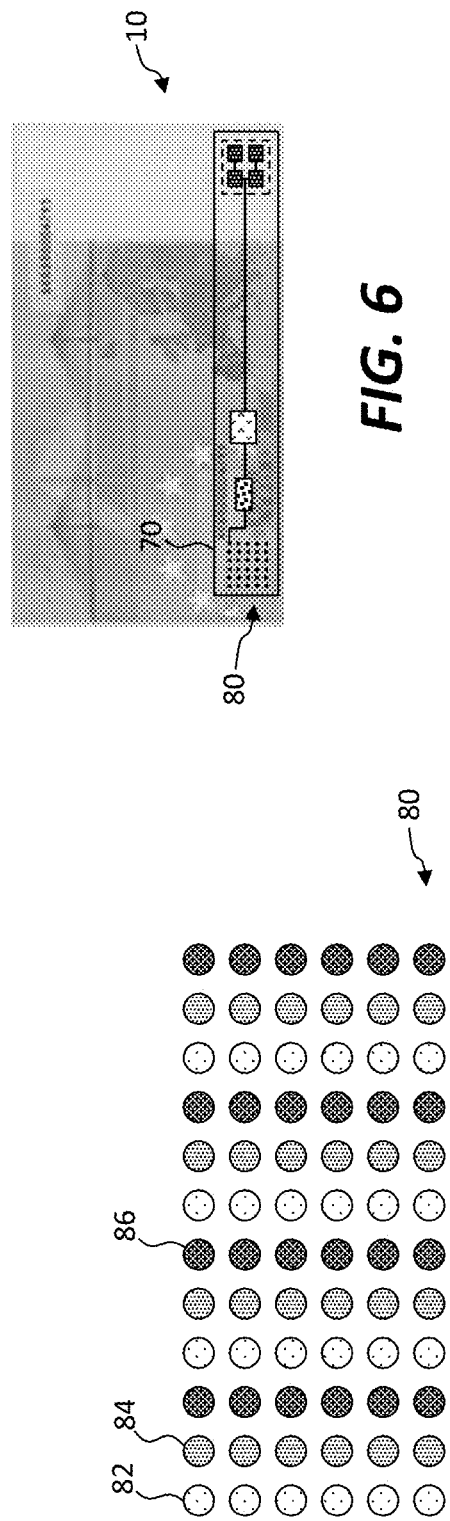
FIG. 5

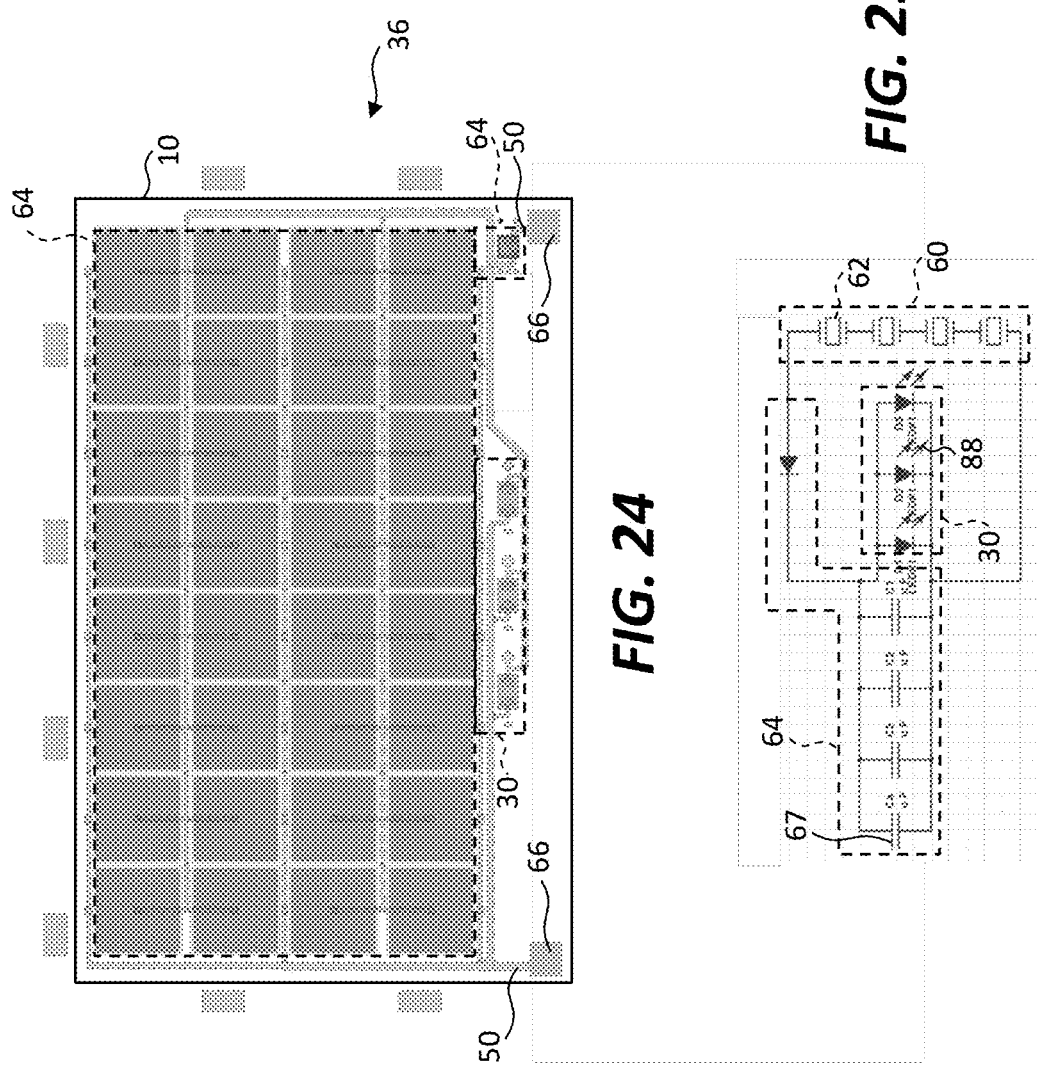

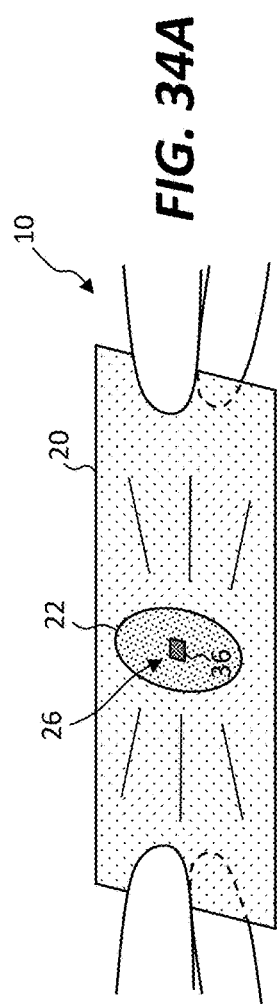
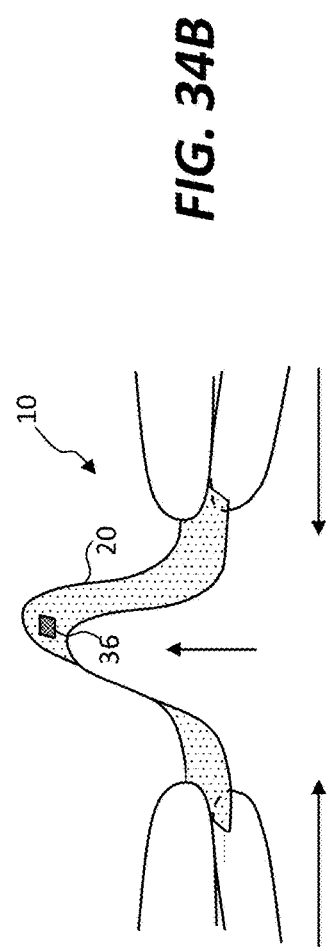
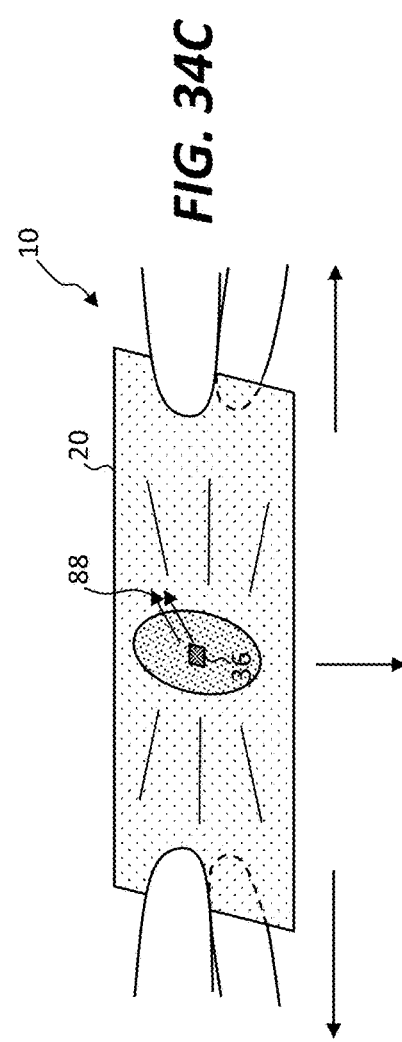

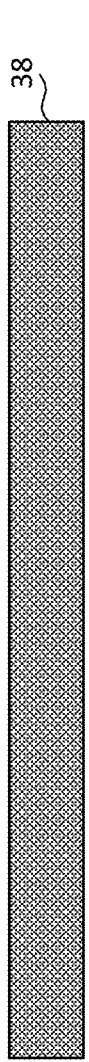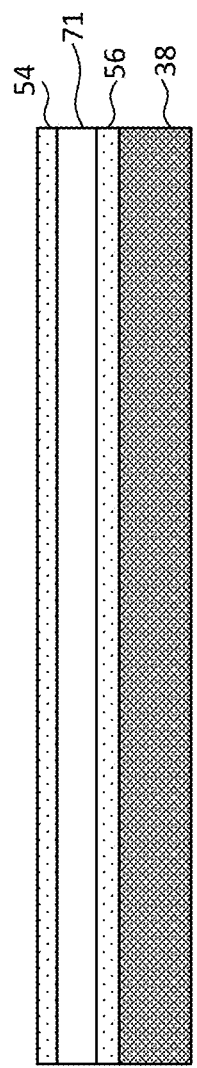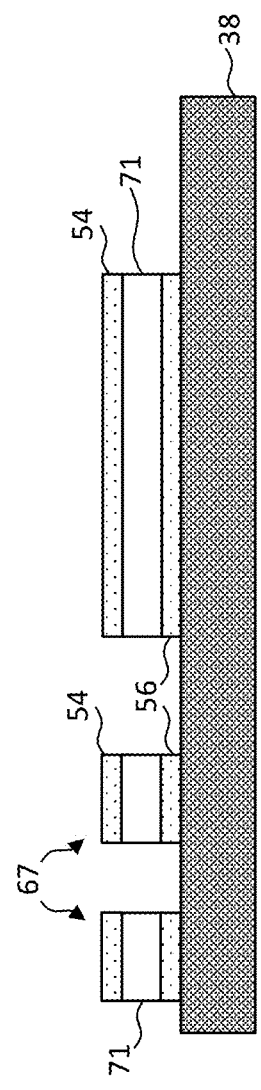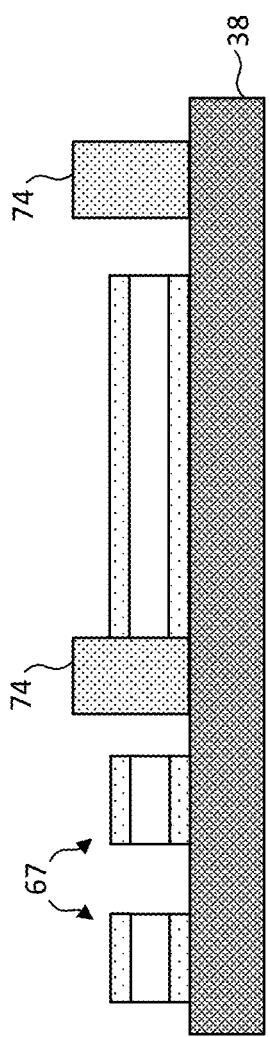

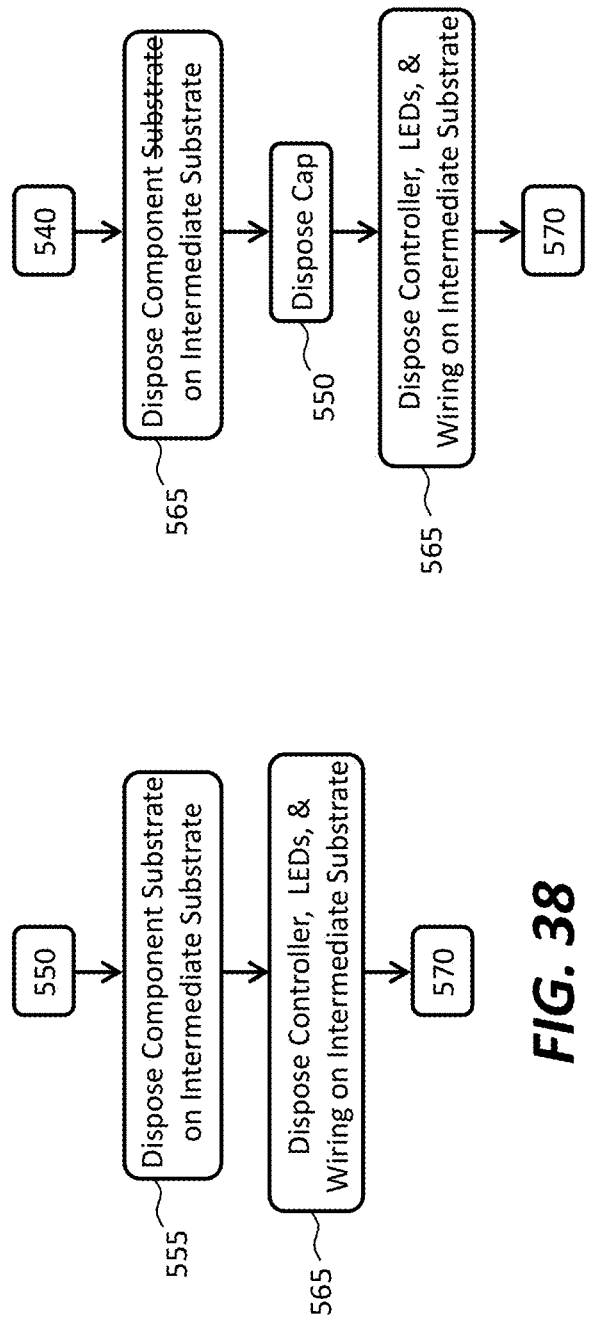

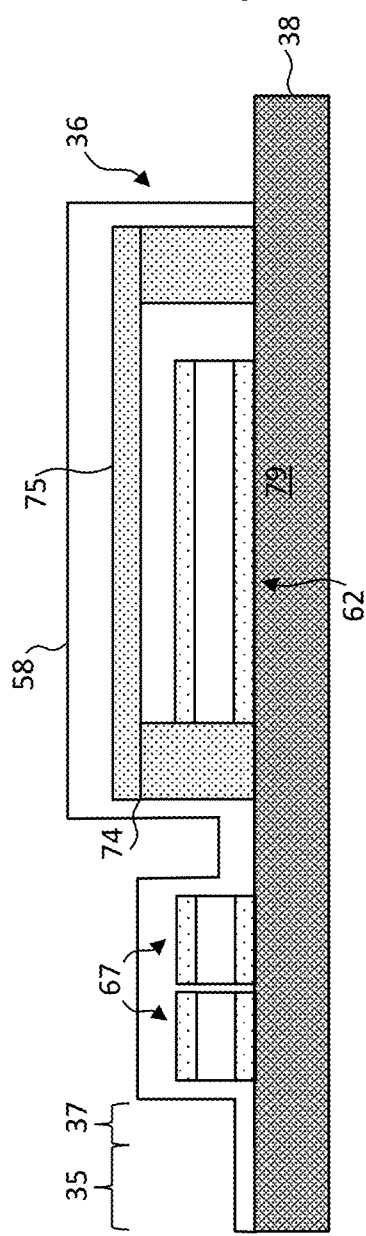
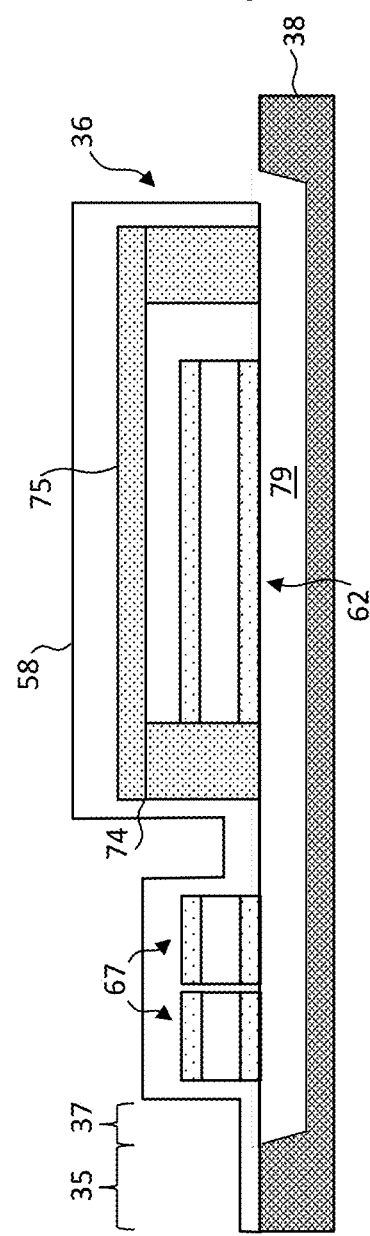

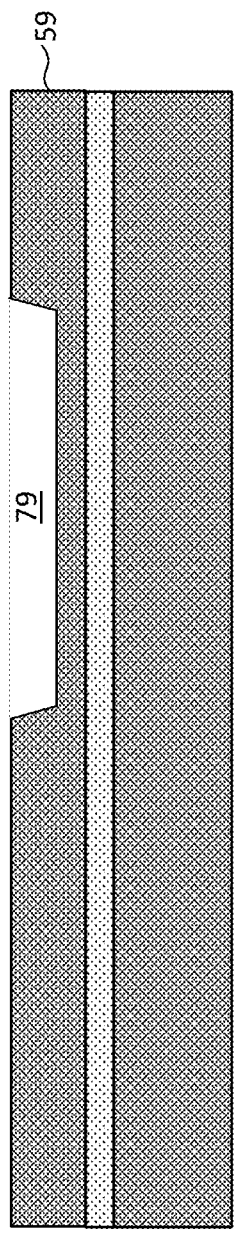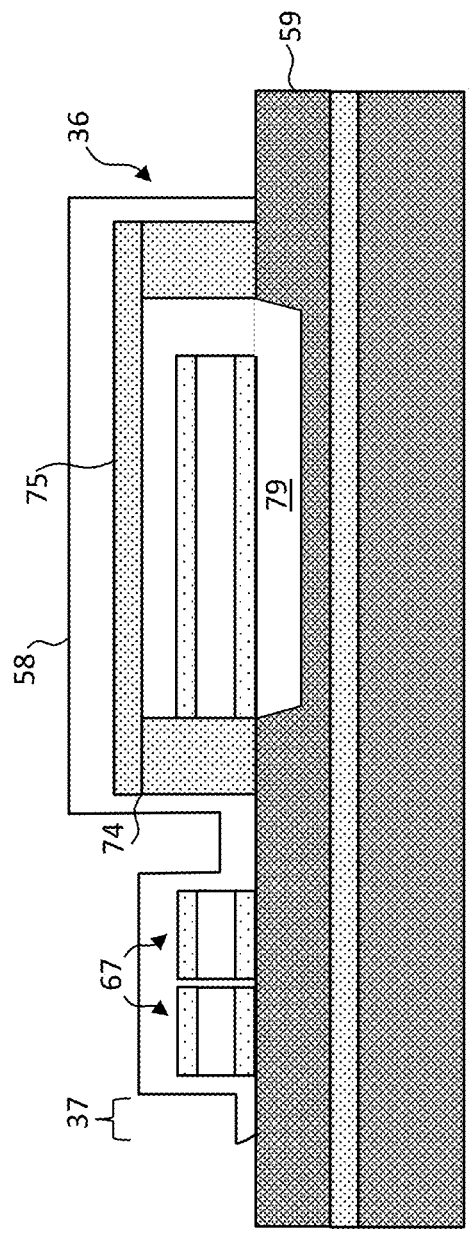

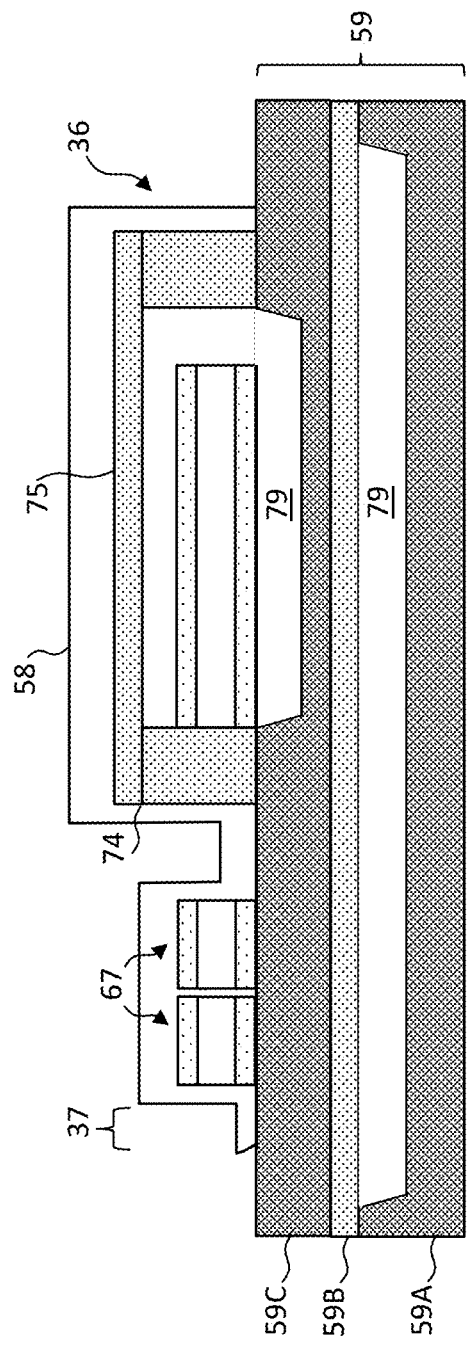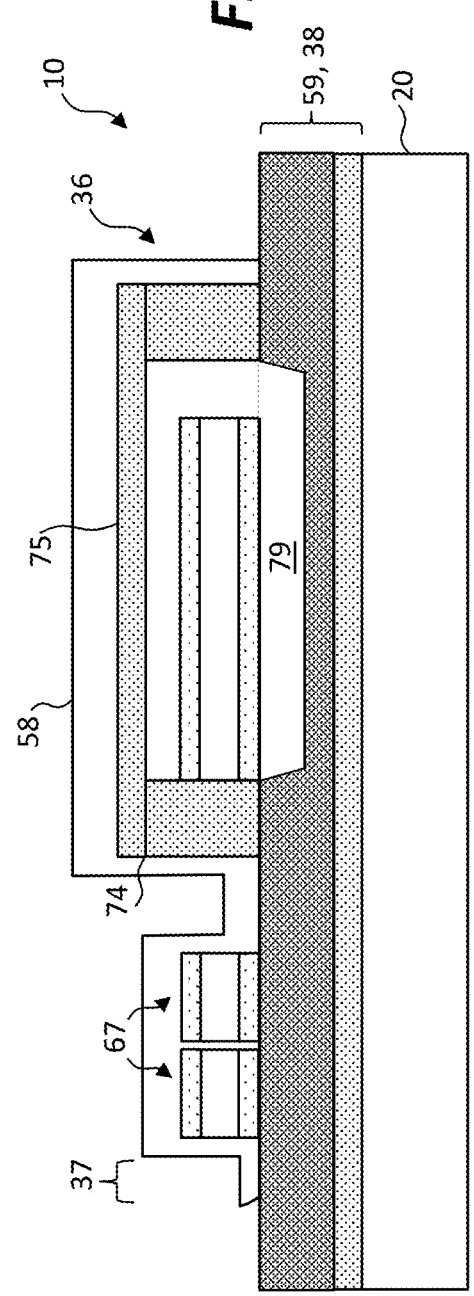

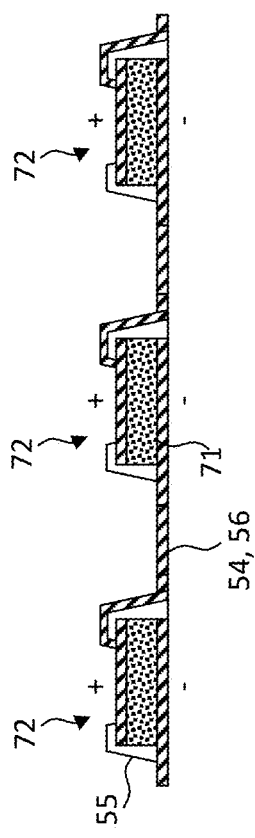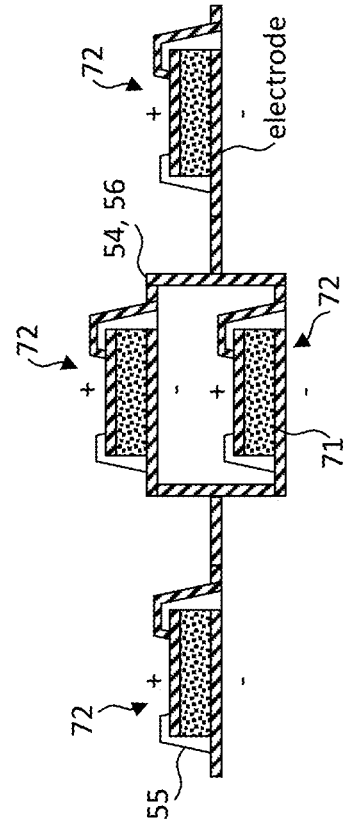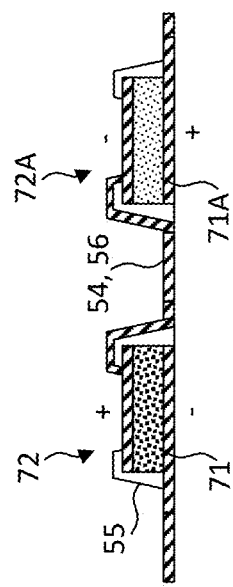
FIG. 52A
FIG. 52B
FIG. 52C

PIEZOELECTRIC POWER COMPONENTS

This application is a continuation-in-part of U.S. patent application Ser. No. 17/067,616, filed on Oct. 9, 2020, and is also a continuation-in-part of U.S. patent application Ser. No. 16/865,257, filed on May 1, 2020, and also claims the benefit of U.S. Provisional Patent Application No. 63/174,018, filed on Apr. 12, 2021, the disclosure of each of which is hereby incorporated by reference herein in its entirety.

CROSS REFERENCE TO RELATED APPLICATIONS

This patent application is also related to U.S. patent application Ser. No. 16/181,294 entitled Hybrid Banknote with Electronic Indicia, filed Nov. 5, 2018, which is a continuation of U.S. Pat. No. 10,150,325 entitled Hybrid Banknote with Electronic Indicia, filed Feb. 15, 2016, the disclosure of each of which is hereby incorporated by reference herein in its entirety.

TECHNICAL FIELD

The present disclosure relates to currency and particularly to banknotes having electronically controlled inorganic light-emitting diodes embedded in the banknotes.

BACKGROUND

Monetary instruments issued by governments such as money or currency are used throughout the world today. Government-issued currency typically includes banknotes (also known as paper currency or bills) having visible markings printed on high-quality paper, plastic, or paper impregnated with other materials, such as plastic. The visible markings indicate the denomination (value) of the banknote, includes a serial number, and has decorations such as images, and anti-counterfeiting structures such as special threads, ribbons, and holograms. Currency circulates within an economic system as a medium of monetary exchange having a fixed value until it is physically worn out. Worn out banknotes are generally returned by banks or other financial institutions and then replaced.

Other privately issued monetary instruments are also used, such as credit cards and gift cards. These cards typically include an electronically accessible value (e.g., stored in a magnetic stripe or in a chip in the card) or an electronically accessible account that can be used to make purchases. However, the value or validity of the card is not readily viewed by a user without special equipment, such as a reader.

In the past, banknotes have not been electronically enabled. However, more recently there have been proposals to use RFID (radio-frequency identification device) in banknotes to validate the banknote and avoid counterfeiting. For example, U.S. Pat. Nos. 8,391,688 and 8,791,822 disclose systems for currency validation. U.S. Pat. No. 5,394,969 describes a capacitance-based verification device for a security thread embedded within currency paper to defeat counterfeiting. Security systems for scanning a paper banknote and checking identification information in the banknote (e.g., the serial number) with a network-accessible database have been proposed, for example in U.S. Pat. No. 6,131,718. In all of these systems, however, there is no way to visibly and electronically or optically validate a banknote without using a separate electronic or optical reader.

There remains a need therefore, for currency providing validation that is electronically accessible with visible indicia without using a separate electronic or optical reader.

SUMMARY

The present disclosure provides a hybrid currency banknote having visible markings and one or more light-controlling elements, for example inorganic light-emitting diodes (iLEDs), and a controller embedded in or on the banknote and electrically connected to control the light-controlling elements to emit light. A power input connection is electrically connected to the controller, or one or more light-controlling elements, or both. In a further embodiment, a power source, such as a piezoelectric or photovoltaic device, is electrically connected to the power input connection, with or without a power convertor. In various embodiments, the visible markings include printed images or value indicators. The light-controlling elements can form a graphic indicator such as a number, letter, or pictogram or can highlight a visible marking on the banknote. The light-controlling elements can form a display, for example a monochrome or full-color display.

In one embodiment, the light-controlling elements or controller are printed on the pre-printed banknote. In another embodiment, the light-controlling elements or controller is printed on a ribbon or thread that is subsequently woven or otherwise incorporated into the banknote. The ribbon or thread can also include electrical conductors to electrically connect the controller, the light-controlling elements, and the power source in a circuit. When operated by applying power, the controller controls the light-controlling elements to emit light, for example in a spatial pattern, or in a temporal pattern (for example with flashing lights or sequentially flashing lights), or both. Different light-controlling elements 30 can be activated in response to sequential squeezes of the piezoelectric power source 60.

The currency can also include light pipes (optical waveguides) arranged in association with the light-controlling elements. The light pipes can conduct light to desired locations on the banknote or can form patterns such as graphic indicators. The light pipes can include light-emitting portions, for example diffusers, along the length of the light pipes to emit light at locations along the length of the light pipe as well as at the end of the light pipe.

The controller can include a memory, for example a read-only memory or a write-once memory storing one or more values and the light-controlling elements can be controlled to display numerals corresponding to the values. Multiple values can be stored in a sequential order corresponding to a temporally sequential set of values and can monotonically decline in magnitude. Values stored in the banknote can be electronically read by a teller machine having a reader and the value of the banknote displayed on the teller machine. In a further embodiment, the teller machine can write a value to the banknote using a writer. In some embodiments, the controller controls the written value so that it must be equal to or smaller than a value already stored in the banknote.

A method of making a hybrid currency banknote includes providing a banknote having visible markings, a wafer having a plurality of micro-transfer printable light-controlling elements, and a wafer having a plurality of controllers. One or more of the light-controlling elements and at least one controller are embedded in the banknote, for example by micro-transfer printing onto the banknote or onto a thread or ribbon that is subsequently incorporated into the banknote.

The controller is electrically connected to the one or more light-controlling elements and to a power input connection. A power source can also be provided, for example by micro-transfer printing the power source on the banknote or ribbon. An issuer of the hybrid currency banknote can provide a memory with a value or write the value to a memory in the banknote to provide the banknote with a value.

The hybrid currency banknote of the present disclosure can be used by receiving the banknote and providing power to the power input connection, for example by a teller machine that then displays the value of the banknote on the banknote itself or on a display incorporated into the teller machine. Alternatively, the banknote includes a piezoelectric power source and upon squeezing the power source the controller controls the light-controlling elements to emit light. In another embodiment, the banknote includes a photovoltaic power source and upon exposure to electromagnetic radiation (such as infrared or ultraviolet radiation), the controller controls the light-controlling elements to emit light.

A user can insert a received banknote into a teller machine, input an input value to the teller machine, and the teller machine can write a value derived from the input value into the banknote. The input value can represent the value of a monetary transaction, for example a purchase of goods or payment of debt and the difference between the input value and the current value can be written into the hybrid currency banknote.

According to some embodiments of the present disclosure, a hybrid document comprises a flexible document having visible markings and a component embedded in or on the flexible document or in or on a ribbon or thread incorporated into the flexible document. The component comprises a component substrate, one or more relatively rigid inorganic light-emitting diodes disposed on the component substrate, a controller disposed on the component substrate and electrically connected to the one or more inorganic light-emitting diodes for controlling the one or more inorganic light-emitting diodes, and a power input connection electrically connected to (i) the controller, (ii) the one or more inorganic light-emitting diodes, or (iii) both (i) and (ii).

According to some embodiments, the component comprises a power convertor disposed on the component substrate connected to the power input connection and the controller or the one or more inorganic light-emitting diodes to convert the power provided from the power input connection to a form that is used by the controller or the inorganic light-emitting diodes. The power convertor can comprise (but is not limited to) a unitary capacitor, a disaggregated capacitor comprising multiple capacitors electrically connected in parallel, a diode, or any one or combination of these.

The one or more inorganic light-emitting diodes can each comprise a fractured or separated tether, the controller (or power convertor) can comprise a fractured or separated tether, the component or component substrate can comprise a fractured or separated tether, or any one or combination of these. Fractured or separated tethers can be a consequence of micro-transfer printing.

In some embodiments, the power source is provided in the component, for example on the component substrate. In some embodiments, the power source is provided external to the component, for example on the flexible document. The power source can be a photovoltaic power source, an electromagnetic energy harvester, for example comprising an antenna or photodiode or other photosensor, a piezoelectric power source activated by pressure, or a piezoelectric power source activated by movement. The power source or component can be indicated by the visible markings, the power source or component can form a part of the visible markings, or the power source or component can be obscured by the visible markings. In some embodiments, the component is disposed in a location corresponding to a portion of the visible markings to indicate (e.g., highlight) the portion of the visible markings. The controller controls the one or more-inorganic light-emitting diodes to flash or flash sequentially.

In some embodiments, the power source comprises a plurality of electrically connected individual power source components. In some embodiments, the power convertor comprises a plurality of electrically connected individual power convertor components.

The flexible document can be a government-issued banknote indicated by the visible markings. In some embodiments, the hybrid document is a banknote, a bond, a stock certificate, a commercial certificate, a printed value-bearing document, an identification document, or a government-issued document. The flexible document can include a flexible substrate that includes paper, plastic, or impregnated paper, and the component and component substrate can be printed (e.g., micro-transfer printed) on the flexible substrate. In some embodiments, the flexible document comprises a ribbon or thread woven into the flexible document and the component is disposed on the ribbon or thread. The ribbon or thread or portions of the ribbon or thread can be at least partially electrically conductive or include conductive wires.

According to some embodiments, a plurality of components are disposed on the flexible document in a random arrangement or in a regular array. Each of the plurality of components can include a component substrate, one or more relatively rigid inorganic light-emitting diodes disposed on the component substrate, a controller disposed on the component substrate and electrically connected to the one or more inorganic light-emitting diodes for controlling the one or more inorganic light-emitting diodes, and a power input connection electrically connected to (i) the controller, (ii) the one or more inorganic light-emitting diodes, or (iii) both (i) and (ii). In some embodiments, (i) each of the one or more inorganic light-emitting diodes comprises a fractured or separated tether, (ii) the controller comprises a fractured or separated tether, (iii) the component substrate comprises a fractured or separated tether, or (iv) any one or combination of (i), (ii), and (iii) According to some embodiments of the present disclosure, a method of making a hybrid document comprises providing a flexible document having visible markings, providing a light-emitting diode source wafer having a plurality of relatively rigid printable inorganic light-emitting diodes connected by light-emitting diode tethers to the light-emitting diode source wafer, providing a controller source wafer having at least a portion of a plurality of controllers connected by controller tethers to the controller source wafer, providing a component substrate, and printing at least a portion of at least one or a portion of the plurality of controllers, power convertors, and one or more of the plurality of inorganic light-emitting diodes from the controller source wafer, a power convertor source wafer, and the light-emitting diode source wafer, respectively, to the component substrate, thereby fracturing or separating each light-emitting diode tether that connected the one or more of the plurality of inorganic light-emitting diodes to the light-emitting diode source wafer, each controller tether that connected the at least one of the plurality of controllers to the controller source wafer, and each power convertor tether that connected the at least one of the plurality of power convertors to the power convertor source wafer to provide a component, printing the component in or on the flexible banknote or in or on a ribbon or thread (e.g., thereby embedding the component in or on the flexible banknote or in or on the ribbon or thread), and electrically connecting the at least one of the plurality of controllers to the one or more of the plurality of inorganic light-emitting diodes and to a power input connection. In some embodiments, the power convertor is the controller or the controller is the power convertor in a single device or electrical circuit. Either the power convertor or controller can comprise multiple circuit elements.

In some embodiments, methods of the present disclosure comprise providing a component wafer having relatively rigid component substrates. The relatively rigid component substrates can be connected by component tethers to the component wafer and the method can comprise printing the components after printing the at least one of the plurality of controllers and the one or more of the plurality of inorganic light-emitting diodes to the component substrate.

In some embodiments, the at least one of the plurality of controllers is electrically connected to the one or more of the plurality of light-emitting diodes before the component is printed in or on the flexible banknote or the ribbon or thread. In some embodiments, the at least one of the plurality of controllers is electrically connected to the one or more of the plurality of light-emitting diodes after the component is printed in or on the flexible banknote or the ribbon or thread.

According to some embodiments of the present disclosure, a hybrid document comprises a document and a component. The component can comprise a power component disposed on or in the document, a controller disposed in or on the document and electrically connected to the power component, and a light-emitting diode (LED) (e.g., an inorganic light-emitting diode (iLED)) disposed in or on the document. The controller can be an integrated circuit or can be a simple circuit comprising a diode, rectifier, or bridge circuit with or without capacitors. The power component can comprise a power support and a piezoelectric cantilever extending from the power support. The piezoelectric cantilever can comprise a layer of piezoelectric material, a first electrode on a first side of the piezoelectric material and a second electrode on a second side of the piezoelectric material opposite the first side. In some embodiments, the power component, the controller, and the inorganic light-emitting diode are comprised in a circuit that emits light from the inorganic light-emitting diode in response to power received from the power component. According to some embodiments, the document has a document surface and any one or combination of the circuit, the power component, the controller, and the inorganic light-emitting diode can comprise a component that is disposed on the document surface.

According to some embodiments of the present disclosure, the piezoelectric cantilever extends in a cantilever plane that is non-orthogonal to a surface of the document and the piezoelectric cantilever is operable to oscillate in a direction non-parallel to the cantilever plane. The cantilever plane can be substantially or desirably parallel to a surface of the document and the piezoelectric cantilever can oscillate in a direction substantially or desirably orthogonal (e.g., perpendicular) to the cantilever plane.

According to some embodiments, the hybrid document or component comprises a component substrate disposed on the document and the power component, the controller, and the inorganic light-emitting diode are each disposed on or in the component substrate. A plurality of power components can be disposed on the component substrate. In some embodiments, the document is flexible or is more flexible than the component or the component substrate. In some embodiments, the component substrate comprises a fractured or separated component tether.

According to some embodiments of the present disclosure, the piezoelectric cantilever is disposed over or in a cavity in the component substrate. The cavity can be enclosed, for example with a cap. The component can comprise an encapsulation layer disposed around the cavity such that the cavity is enclosed at least by the encapsulation layer.

In some embodiments of the present disclosure, the hybrid document comprises a plurality of components disposed on the document. Each component can comprise a respective component substrate and a respective circuit. Each circuit comprises at least a respective light-emitting diode, a respective controller, and a respective power component. Each circuit is disposed on a different component substrate and each component substrate is independent and separate from any other component substrate of any other component and is disposed on the document surface.

According to some embodiments, the piezoelectric cantilever is disposed over a cavity in the component substrate.

The hybrid document can be a banknote.

According to embodiments of the present disclosure, (i) the controller comprises a fractured or separated controller tether, (ii) the inorganic light-emitting diode comprises a fractured or separated LED tether, or (iii) any one or combination of (i) and (ii). According to some embodiments, the circuit comprises a capacitor electrically connected to the power component such that power transmitted from the power component is stored in the capacitor and subsequently discharged to cause the light-emitting diode to emit the light. In some embodiments, the hybrid document comprises a plurality of inorganic light-emitting diodes connected to the circuit and disposed on the document.

In some embodiments, the piezoelectric cantilever and the capacitor comprise a same dielectric material disposed in a common layer.

In some embodiments, the inorganic light-emitting diode is disposed on the document closer to a center of the document than to an end or edge of the document, for example a central portion of the document. In some embodiments, the hybrid document has a length greater than a width, and the inorganic light-emitting diode is disposed closer to the center than to the length-wise ends. In some embodiments, the hybrid document comprises a security feature such as a thread or ribbon, and the circuit or the component is disposed on or in the security structure (security feature), and the security structure is disposed on or in the document.

According to some embodiments of the present disclosure, the piezoelectric cantilever comprises a plurality of piezoelectric fingers. The fingers can be electrically connected in series or in parallel. The power component can comprise one or more masses and the one or more masses are disposed on ends of the plurality of piezoelectric fingers opposite opposing ends of the plurality of piezoelectric fingers that are adjacent to, on, or physically connected to the power support. The piezoelectric cantilever can extend from a side of the power support or an end of the piezoelectric cantilever can be disposed on the power support. Each component can comprise a plurality of power components; the plurality of power components can be electrically connected in series or in parallel.

According to embodiments of the present disclosure, a method of operating a hybrid document comprises providing a document, wherein the document is flexible and has a first end opposing a second end, grasping the document at the first end and at the second end, wherein the first end is separated from the second end and the document is at least partially flat, moving the first end and the second end closer together so that the document is at least partially folded or at least less flat, and moving the first end and the second end apart so that the document is at least partially flat and less folded, thereby moving the central portion in a vertical direction, making the piezoelectric cantilever move and generating electrical power, causing the inorganic light-emitting diode to emit light. In some embodiments, grasping comprises grasping with one or more fingers of one or more hands. In some embodiments, light is emitted with no perceptible delay between moving the first end and the second end apart and light emission (e.g., by a human).

According to some embodiments, a method of making a hybrid document comprises providing a component substrate on a component source wafer, patterning a first electrode, piezoelectric material, and a second electrode on or over the component substrate, patterning a power support in contact with the piezoelectric material on or over the component substrate, releasing the first electrode, piezoelectric material, and second electrode from the component substrate to form a released piezoelectric cantilever comprising the first electrode, the piezoelectric material, and the second electrode extending from the power support and a cavity, wherein the released piezoelectric cantilever is disposed over or in the cavity. In some embodiments, methods comprise capping the released piezoelectric cantilever to enclose the cavity. In some embodiments, methods comprise disposing the component substrate having the released piezoelectric cantilever and power support disposed thereon on a document after capping the released piezoelectric cantilever.

According to some embodiments, methods of the present disclosure comprise disposing a component comprising a component substrate having the released piezoelectric cantilever and the power support disposed thereon. Some embodiments comprise disposing a controller and one or more light-emitting diodes on the component substrate and electrically connecting the controller, one or more light-emitting diodes (e.g., iLEDs), and the released piezoelectric cantilever on the component substrate. According to some embodiments, methods of the present disclosure comprise patterning one or more capacitors on or over the component substrate using one or more same materials as the first electrode, the piezoelectric material, and the second electrode and in a common patterning step with the first electrode, piezoelectric material, and second electrode.

According to some embodiments, methods of the present disclosure comprise capping the piezoelectric cantilever with a cap before disposing the component substrate on a document (e.g., by removing the removed component substrate from the component source wafer).

According to some embodiments, methods of the present disclosure comprise disposing the removed component substrate on an intermediate substrate and disposing the intermediate substrate on the document. Some embodiments comprise disposing and electrically connecting a controller and one or more inorganic light-emitting diodes on the intermediate substrate. Some embodiments comprise capping the piezoelectric cantilever after disposing the removed component substrate on the intermediate substrate.

According to embodiments of the present disclosure, methods comprise providing the component substrate on a component source wafer, releasing the component substrate from the component source wafer after the cavity is enclosed, and disposing the component substrate having the released piezoelectric cantilever and the power support disposed thereon on a document.

According to some embodiments, the piezoelectric material extends from a side of the power support or an end of the piezoelectric material is disposed on the power support.

Some methods of the present disclosure comprise encapsulating the enclosed cavity with an encapsulation layer.

According to embodiments of the present disclosure, a hybrid document comprises a document and a component disposed in or on the document. The component can comprise a power component comprising a power support and a piezoelectric cantilever extending from the power support. The piezoelectric cantilever comprises a layer of piezoelectric material, a first electrode on a first side of the piezoelectric material and a second electrode on a second side of the piezoelectric material opposite the first side. The component can also comprise a controller disposed in or on the document and electrically connected to the power component and a light-controlling element disposed in or on the document and electrically connected to the power component, the controller, or both. The power component, the controller, and the light-controlling element can be comprised in a circuit that causes light to be directed away from the light-controlling element in response to power received from the power component. The circuit can cause light to be emitted from the light-controlling element in response to power received from the power component. The light-controlling element can be an inorganic light-emitting diode, organic light-emitting diode, controllable reflective element, or controllable electrophoretic element. The component can comprise a component substrate on or in which power component is formed. The controller and light-controlling element can be disposed on the component substrate. In some embodiments, the power component is disposed on an intermediate substrate and the controller and light-controlling element can be disposed on the intermediate substrate. In some embodiments, a plurality of power components are disposed on the intermediate substrate.

According to some embodiments of the present disclosure, a hybrid document comprises a document and a component disposed on or in the document. The component can comprise a piezoelectric cantilever and a light-controlling element. The light-controlling element can be operable to cause light to be directed away in response to power received from the piezoelectric cantilever. The light-controlling element can be an inorganic light-emitting diode and the light-emitting diode can emit light in response to power received from the piezoelectric cantilever. The piezoelectric cantilever can be disposed on or in a cavity and the cavity can be enclosed. The component can comprise a component substrate disposed on or in the document, the piezoelectric cantilever and the light-controlling element can be disposed on the component substrate, and the component substrate can comprise a cavity. The piezoelectric cantilever can be disposed over or in the cavity. The component can be disposed on or in a security structure and the security structure can be a ribbon or thread.

According to some embodiments of the present disclosure, a method of making a hybrid document comprises providing a component substrate, patterning a first electrode, piezoelectric material, and a second electrode on the component substrate, patterning a power support in contact with the piezoelectric material on or over the component substrate, releasing the power support and the first electrode, the piezoelectric material, and the second electrode from the component substrate to form a piezoelectric cantilever comprising the first electrode, the piezoelectric material, and the second electrode extending from the power support, and printing the power support and the piezoelectric cantilever together from the component substrate to an intermediate substrate. Some methods of the present disclosure comprise printing the power support and the piezoelectric cantilever to the intermediate substrate such that the piezoelectric cantilever is disposed over or in a cavity disposed in the intermediate substrate. Some methods of the present disclosure comprise disposing the intermediate substrate on a document. Some methods of the present disclosure comprise thinning the intermediate substrate prior to disposing the intermediate substrate on the document. Some methods of the present disclosure comprise printing the intermediate substrate having the power support and the piezoelectric cantilever disposed thereon to a document. Some methods of the present disclosure comprise capping the piezoelectric cantilever prior to the printing. Some methods of the present disclosure comprise disposing an encapsulation layer around the capped piezoelectric cantilever and the power support, forming a component tether with the encapsulation layer, the component tether connected to a component anchor; and printing together the encapsulated capped piezoelectric cantilever and power support to the intermediate substrate, thereby fracturing or separating the component tether. Some methods of the present disclosure comprise disposing a controller and one or more light-emitting diodes and electrically connecting the controller and the one or more light-emitting diodes to the piezoelectric cantilever either (i) on the component substrate before the printing and before the disposing of the encapsulation layer or (ii) on the intermediate substrate after the printing of the encapsulated capped piezoelectric cantilever and power support. Some methods of the present disclosure comprise patterning one or more capacitors on the component substrate before disposing the encapsulation layer, such that the encapsulation layer physically connects the one or more capacitors with the capped piezoelectric cantilever after disposing the encapsulation layer, and printing together the encapsulated capped piezoelectric cantilever and power support comprises printing together the one or more capacitors to the intermediate substrate. Some methods of the present disclosure comprise patterning one or more capacitors comprises using one or more same materials and in a common patterning step with patterning of the first electrode, the piezoelectric material, and the second electrode.

According to some embodiments of the present disclosure, a piezoelectric power component comprises a power support and piezoelectric cantilevers extending from the power support. Each piezoelectric cantilever extends a common distance from the power support and comprises a layer of piezoelectric material, a first electrode on a first side of the piezoelectric material, and a second electrode on a second side of the piezoelectric material opposite the first side. At least two of the piezoelectric cantilevers can be electrically connected in series, at least two of the piezoelectric cantilevers can be electrically connected in parallel, or multiple piezoelectric cantilevers can be electrically connected in a circuit that includes both series and parallel electrical connections.

A mass can be disposed on an end of each piezoelectric cantilever opposite the power support and (i) a separate single, unitary mass can be disposed on an end of each piezoelectric cantilever, (ii) a single, unitary mass can be disposed in common on two or more adjacent piezoelectric cantilevers, or (iii) a single, unitary mass can be disposed in common on the ends of all of the piezoelectric cantilevers. The mass can be native or non-native.

According to some embodiments, the power support extends around the piezoelectric cantilever, for example surrounds the piezoelectric cantilever in a direction horizontal to an extent (e.g., the longest dimension such as the length) of the piezoelectric cantilever. The power support can form a polygon around the piezoelectric cantilevers and the piezoelectric cantilevers can extend from a common side of the power support polygon. In some embodiments, different piezoelectric cantilevers extend from different sides of the power support polygon. The polygon can be a rectangle. According to some embodiments, at least one piezoelectric cantilever extends in a first direction from the power support and at least one piezoelectric cantilever extends in a second direction from the power support, and the first direction is different from the second direction. In some embodiments the first and second directions are opposite; in some embodiments the first and second directions are orthogonal. The power support (e.g., a perimeter or convex hull of the power support) can form an enclosure surrounding the piezoelectric cantilevers and the power support can extend into the enclosure, for example can subdivide the enclosure or otherwise protrude into the enclosure.

According to some embodiments of the present disclosure, the piezoelectric cantilevers can each comprise a cantilever support layer and the piezoelectric layer and the first and second electrodes of the piezoelectric cantilevers are disposed on the cantilever support layer. According to some embodiments, the piezoelectric layer and first and second electrodes cover less than all of the piezoelectric cantilever, for example less than half of the piezoelectric cantilever. According to some embodiments of the present disclosure, the piezoelectric layer and first and second electrodes are disposed in two or more separate portions along the cantilever support layer and each portion extends along the cantilever support layer a distance less than one half of the length of the cantilever support layer. Thus, the cantilever support layer is only partially covered by the piezoelectric layer, the first electrode, and the second electrode. The piezoelectric layer and first and second electrodes can comprise first and second separate portions along the cantilever support layer and the first portion can be adjacent to a first end of the cantilever support layer proximate to the power support and the second portion can be adjacent to a second end of the cantilever support layer opposite to the first end. The piezoelectric layer can be disposed on the cantilever support layer between the power support and one half of the length of the cantilever support layer.

According to some embodiments of the present disclosure, the power support comprises or is physically connected to a component tether. The component tether can be fractured as a consequence of micro-transfer printing the power component.

According to some embodiments of the present disclosure, (i) a piezoelectric power component comprises a component substrate and the power support and piezoelectric cantilever are disposed on the component substrate, (ii) a piezoelectric power component is disposed on a system substrate and the power support and piezoelectric cantilever are disposed on the system substrate, or (iii) a piezoelectric power component comprises a component substrate, the power support and piezoelectric cantilever are disposed on the component substrate and the component substrate is disposed on a system substrate.

The piezoelectric cantilever can extend from the power support a height above a bottom of the power support a distance that is less than a displacement distance of the piezoelectric cantilever and the component substrate or destination substrate can comprise a cavity or sacrificial portion disposed beneath the piezoelectric cantilever. The system substrate can be a secure document, an element of a secure document, a banknote, an element of a banknote, a foil, or a ribbon.

According to some embodiments, the component support or system substrate, or both, form a bottom for the power component, the power support. According to some embodiments, the component substrate or system substrate, or both, form an enclosure enclosing the piezoelectric cantilevers. According to some embodiments, the power support has an open bottom.

According to some embodiments of the present disclosure, the piezoelectric cantilever extends from the power support a height above a bottom of the power support a distance that is no less than a displacement distance of the piezoelectric cantilever.

According to some embodiments of the present disclosure, the piezoelectric cantilever is a non-linear piezoelectric cantilever.

According to some embodiments of the present disclosure, the power support comprises a first power support portion and a second power support portion. The second power support portion can, but does not necessarily, extend from the first power support portion. The piezoelectric cantilever is a first piezoelectric cantilever extending from the first power support portion. Some embodiments comprise a second piezoelectric cantilever extending from the second power support portion, the second piezoelectric cantilever comprising a layer of piezoelectric material, a first electrode on a first side of the piezoelectric material and a second electrode on a second side of the piezoelectric material opposite the first side. The second power support portion and the second piezoelectric cantilever can be disposed within an area surrounded by the first power support portion so that the piezoelectric power component is a nested power component.

According to embodiments of the present disclosure, a piezoelectric power component comprises a power support and a piezoelectric cantilever extending from the power support. The piezoelectric cantilever can comprise a layer of piezoelectric material, a first electrode on a first side of the piezoelectric material and a second electrode on a second side of the piezoelectric material opposite the first side. According to some embodiments, a component tether can be attached to the power support. According to some embodiments, the power support extends around the piezoelectric cantilever. According to some embodiments, the piezoelectric cantilever is a non-linear piezoelectric cantilever.

According to some embodiments, the power support is a first power support, the piezoelectric cantilever is a first piezoelectric cantilever, and the piezoelectric power component comprises a second power support and a second piezoelectric cantilever extending from the second power support. The second piezoelectric cantilever comprises a layer of piezoelectric material, a first electrode on a first side of the piezoelectric material and a second electrode on a second side of the piezoelectric material opposite the first side. The second power support and the second piezoelectric cantilever are disposed within the first power support so that the piezoelectric power component is a nested power component.

According to some embodiments of the present disclosure, a piezoelectric power component comprises a power support, a piezoelectric cantilever extending from the power support, and a mass. The piezoelectric cantilever comprises a layer of piezoelectric material, a first electrode on a first side of the piezoelectric material and a second electrode on a second side of the piezoelectric material opposite the first side. According to some embodiments, the piezoelectric cantilever is a linear piezoelectric cantilever physically connecting the mass to the power support. According to some embodiments, the piezoelectric power component comprises a plurality of linear piezoelectric cantilevers, each piezoelectric cantilever attached to a corresponding separate location on the power support. According to some embodiments, the piezoelectric cantilever is a non-linear piezoelectric cantilever physically connecting the mass to the power support. The non-linear piezoelectric cantilever can be curved, folded, or comprise line segments that are not in a common line. According to some embodiments, the piezoelectric power component comprises a plurality of non-linear piezoelectric cantilevers, each non-linear piezoelectric cantilever attached to a corresponding separate location on the power support. The mass can be native or non-native to the piezoelectric cantilever.

According to some embodiments, at least two of the plurality of linear or non-linear piezoelectric cantilevers are electrically connected in series. According to some embodiments, at least two of the plurality of linear or non-linear piezoelectric cantilevers are electrically connected in parallel. According to some embodiments, the plurality of linear or non-linear piezoelectric cantilevers form an electrical circuit and the electrical circuit can comprise linear or non-linear piezoelectric cantilevers that are electrically connected in any combination of series or parallel connections.

According to some embodiments of the present disclosure, the power support extends around the piezoelectric cantilever, for example in a plane that is substantially parallel to an extended surface, e.g., the greatest extent such as the length of a top surface, of the piezoelectric cantilever. The power support can extend around the non-linear piezoelectric cantilever. The non-linear piezoelectric cantilever can comprise a plurality of linear or non-linear piezoelectric cantilevers each attached to a corresponding separate location on the power support. The separate locations can be distributed substantially equidistant around a perimeter or along an edge of the power support. The power support can be substantially rectangular.

According to some embodiments of the present disclosure, the non-linear piezoelectric cantilever has a U-shape. According to some embodiments of the present disclosure, the non-linear piezoelectric cantilever divides into two physically separate portions. The two physically separate portions can each have a U-shape and the two U-shapes can be opposed, for example mirror reflections of each other. According to some embodiments, a portion of the piezoelectric layer and first and second electrodes can be disposed on the support at the bottom of the U-shape.

According to some embodiments of the present disclosure, the non-linear piezoelectric cantilever comprises a cantilever support layer and the piezoelectric layer is disposed on the cantilever support layer. The piezoelectric layer and first and second electrodes can extend along the cantilever support layer a distance less than one half of the length of the support layer. The piezoelectric layer and first and second electrodes can be disposed on the cantilever support layer between the power support and one half of the length of the cantilever support layer. The piezoelectric layer and first and second electrodes can be disposed on the cantilever support layer between the mass and one half of the length of the support layer.

According to some embodiments of the present disclosure, the power support is a first power support, the piezoelectric cantilever is a first piezoelectric cantilever, the mass is a first mass, and embodiments of the piezoelectric power component comprise a second power support and a second piezoelectric cantilever extending from the second power support. The second piezoelectric cantilever can comprise a layer of piezoelectric material, a first electrode on a first side of the piezoelectric material and a second electrode on a second side of the piezoelectric material opposite the first side, and a second mass. The second piezoelectric cantilever is a non-linear piezoelectric cantilever physically connecting the mass to the power support and the second power support, the second piezoelectric cantilever, and the second mass are disposed within the first power support so that the piezoelectric power component is a nested power component. The second mass can be native or non-native to the second piezoelectric cantilever.

The power support can form an enclosure enclosing the piezoelectric cantilever and the power support can extend into the enclosure.

According to some embodiments of the present disclosure, the non-linear piezoelectric cantilever comprises a plurality of non-linear piezoelectric cantilevers each attached to a corresponding separate location on the power support and at least one non-linear piezoelectric cantilever extends in a first direction from the power support and at least one non-linear piezoelectric cantilever extends in a second direction from the power support, and the first direction is different from the second direction.

According to embodiments of the present disclosure, a method of making a piezoelectric power system comprises providing a piezoelectric power component physically connected to a component source wafer with a component tether, providing a system substrate, and micro-transfer printing the piezoelectric power component from the component source wafer to the system substrate. The piezoelectric power component can comprise a layer of piezoelectric material, a first electrode disposed on a first side of the piezoelectric material, and a second electrode disposed on a second side of the piezoelectric material opposite the first side. Methods of the present disclosure can comprise fracturing the component tether by micro-transfer printing the piezoelectric power component from the component source wafer to the system substrate.

Some embodiments of the present disclosure comprise disposing a cap over the piezoelectric power component, disposing a cap on the component substrate, or disposing a cap on the system substrate. According to some embodiments, the piezoelectric power component comprises a power support and a piezoelectric cantilever extending from the power support and methods of the present disclosure can comprise disposing the cap on the power support over the piezoelectric cantilever. The cap can be disposed before micro-transfer printing the piezoelectric power component from the component source wafer to the system substrate or after micro-transfer printing the piezoelectric power component from the component source wafer to the system substrate.

Methods of the present disclosure can comprise forming a cavity in the system substrate and micro-transfer printing the piezoelectric power component to the system substrate with the piezoelectric cantilever disposed over the cavity.

Methods of the present disclosure can comprise electrically connecting the first electrode and the second electrode to an electrical load. The electrical load can be disposed on the system substrate or on the component substrate.

According to embodiments of the present disclosure, a method of operating a piezoelectric power system comprises providing a piezoelectric power component on a system substrate, the piezoelectric power component comprising layer of piezoelectric material, a first electrode on a first side of the piezoelectric material, and a second electrode on a second side of the piezoelectric material opposite the first side, providing an electrical load electrically connected to the first electrode and to the second electrode, and mechanically perturbing the piezoelectric power component to generate a current between the first electrode and the second electrode through the electrical load. The piezoelectric power component can comprise a fractured component tether.

The system substrate can have a surface on which the piezoelectric power component or power source is disposed and methods of the present disclosure can comprise moving the system substrate in a direction orthogonal to the surface to mechanically accelerate the piezoelectric power component or power source.

According to embodiments of the present disclosure, a method of operating a piezoelectric power system comprises providing a piezoelectric power component, the piezoelectric power component comprising a piezoelectric cantilever comprising a layer of piezoelectric material, a first electrode on a first side of the piezoelectric material, and a second electrode on a second side of the piezoelectric material opposite the first side, providing an electrical power load electrically connected to the first electrode and the second electrode, and mechanically perturbing the piezoelectric power component.

According to some embodiments, the piezoelectric power component comprises a fractured component tether. According to some embodiments, the piezoelectric power component has a thickness less than 1 mm (e.g., no greater than 500, 200, 100, 50, 20, 10, 5, 1, or 0.5 microns). According to some embodiments, the piezoelectric device has a length or width less than 1 mm (e.g., no greater than 500, 200, 100, 50, 20, or 10 microns).

According to some embodiments of the present disclosure, a piezoelectric power component system comprises a piezoelectric power component disposed on a substrate, wherein the piezoelectric power component is non-native to the substrate (e.g., non-native to a system substrate). The piezoelectric power component can have an open bottom adjacent to the substrate. The piezoelectric power component can comprise a cap disposed over the piezoelectric power component, the cap affixed to the substrate or to the piezoelectric power component. The piezoelectric power component can have a thickness no greater than 1 mm (e.g., no greater than 500, 200, 100, 50, 20, or 10 microns). The piezoelectric power component can have a length or width no greater than 1 mm, (e.g., no greater than 500, 200, 100, 50, 20, or 10 microns).

According to some embodiments, a piezoelectric power component is disposed on a substrate, the piezoelectric power component is non-native to the substrate, and the piezoelectric power component comprises a fractured or separated component tether. According to some embodiments, a piezoelectric power component comprises piezoelectric cantilevers electrically connected in serial. According to some embodiments, a piezoelectric power component comprises piezoelectric cantilevers electrically connected in parallel.

According to some embodiments, a piezoelectric power component comprises a power support and one or more piezoelectric cantilevers extending from the power support at a proximal end of the one or more piezoelectric cantilevers, and a mass. Each piezoelectric cantilever of the one or more piezoelectric cantilevers can extend a common distance from the power support. Each piezoelectric cantilever can comprise a layer of piezoelectric material, a first electrode on a first side of the piezoelectric material, and a second electrode on a second side of the piezoelectric material opposite the first side. The mass is disposed on, attached to, or a part of the one or more piezoelectric cantilevers. The mass has a top side and an opposing bottom side. One or more openings are disposed in the mass, the one or more openings extending through the mass from the top side to the bottom side. The mass can be native or non-native to the piezoelectric cantilever(s). The mass can comprise piezoelectric material.

According to embodiments of the present disclosure, at least one opening of the one or more openings comprises a slit forming high-aspect-ratio rectangles in the mass. At least one opening of the one or more openings can comprise intersecting slits forming 'X', 'Y', 'T', '+', or right angle shapes. At least one opening of the one or more openings can extend parallel to, orthogonal to, or diagonally to an edge of the mass. The diagonal can be a 45 degree angle to an edge of the mass.

According to some embodiments, the mass comprises piezoelectric material. According to some embodiments, the first and second electrodes comprise an electrode material and the mass comprises electrode material. According to some embodiments, the first and second electrodes extend onto or are a part of the mass. According to some embodiments, the first and second electrodes extending onto or into the mass are offset in a direction parallel to the top side.

According to some embodiments, at least one opening of the one or more openings is a slit having a length much greater than a width and the first and second electrodes are disposed at least one end of the slit in the length direction, for example can surround the end of the slit in the length direction on one side, two sides, or three sides for a distance at least equal to the width of the slit.

In some embodiments, the one or more openings are disposed in the mass such that an applied stress results in an enhanced piezoelectric response in the one or more piezoelectric cantilevers (e.g., all of the one or more piezoelectric cantilevers) relative to an equivalent mass without the one or more openings. The enhanced piezoelectric response can be at least 1.5×, at least 2×, at least 3×, at least 4×, at least 5×, at least 6×, or at least 8× and, optionally, no more than 15× or no more than 10× higher than a piezoelectric response of the equivalent mass without the one or more openings.

The piezoelectric power component can comprise a power support. A proximal end of each of the one or more piezoelectric cantilevers can be attached to the power support. The enhanced piezoelectric response can be concentrated at least partly at the proximal end.

According to some embodiments, a piezoelectric power component comprises a piezoelectric material comprising one or more openings disposed such that an applied stress results in an enhanced piezoelectric response relative to an equivalent piezoelectric material without the one or more openings. The one or more openings can extend through the piezoelectric material from a top side of the piezoelectric material to a bottom side of the piezoelectric material. The piezoelectric material can be comprised in a piezoelectric cantilever.

According to some embodiments, a piezoelectric power component comprises a power support, a proximal end of the piezoelectric material is attached to the power support, and the enhanced piezoelectric response is concentrated at least partly at the proximal end. According to some embodiments the one or more openings form high-aspect-ratio rectangles having lengths that are greater than widths and the enhanced piezoelectric response is concentrated at least partly at the ends of the slits in the length direction.

In some embodiments, the piezoelectric power component comprises first and second electrodes for collecting power. The first and second electrodes can extend onto or into the piezoelectric material. In some embodiments, at least a portion of the first electrode and at least a portion of the second electrode are offset in a direction parallel to the top side.

In some embodiments, the enhanced piezoelectric response is at least 1.5×, at least 2×, at least 3×, at least 4×, at least 5×, at least 6×, or at least 8× and, optionally, no more than 15× or no more than 10× higher than a piezoelectric response of the equivalent piezoelectric material.

In some embodiments, a piezoelectric power component comprises one or more piezoelectric cantilevers and a mass comprising one or more openings. The mass can be disposed on or attached to the one or more piezoelectric cantilevers. The one or more openings can be disposed in the mass such that power collected from the piezoelectric power component due to an applied stress is greater than power collected that would be collected from an otherwise equivalent piezoelectric power component wherein the mass does not comprise the one or more openings, for example at least 1.5×, at least 2×, at least 3×, at least 4×, at least 6×, or at least 8× (and optionally no more than 15× or 10× more than) the power that would be collected from the otherwise equivalent piezoelectric power component.

In some embodiments, a piezoelectric power component comprises one or more piezoelectric cantilevers comprising piezoelectric material comprising one or more openings. The one or more openings can be disposed in the piezoelectric material such that power collected from the piezoelectric power component due to an applied stress is greater than power collected that would be collected from an otherwise equivalent piezoelectric power component wherein the piezoelectric material does not comprise the one or more openings, for example at least 1.5×, at least 2×, at least 3×, at least 4×, at least 6×, or at least 8× (and optionally no more than 15× or 10× more than) the power that would be collected from the otherwise equivalent piezoelectric power component.

The present disclosure provides an anonymous, government-issued currency with anti-counterfeiting light emitters whose value or validity can be visibly ascertained without requiring specialized equipment and modified electronically.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 5 is a schematic illustration of a display according to an embodiment of the present disclosure;

FIG. 6 is a schematic diagram of one side of a hybrid currency banknote according to another embodiment of the present disclosure;

FIG. 7 is a schematic diagram illustrating a controller and circuit according to another embodiment of the present disclosure;

FIG. 24 is a schematic illustration of a component exclusive of a power source according to illustrative embodiments of the present disclosure;

FIG. 25 is an electrical schematic diagram of a power source, convertor, and light-emitting diodes according to illustrative embodiments of the present disclosure;

FIGS. 34A-34C are temporally successive representations of operating a banknote according to illustrative embodiments of the present disclosure;

FIGS. 36A-36G are successive structures formed according to illustrative methods of the present disclosure;

FIGS. 37-39 are flow diagrams according to illustrative embodiments of the present disclosure;

FIGS. 40A-40F are successive structures formed according to illustrative methods of the present disclosure;

FIGS. 52A-52C illustrate various electrical connections for piezoelectric material in a piezoelectric cantilever or in separate piezoelectric cantilevers according to illustrative embodiments of the present disclosure;

Figure 1:
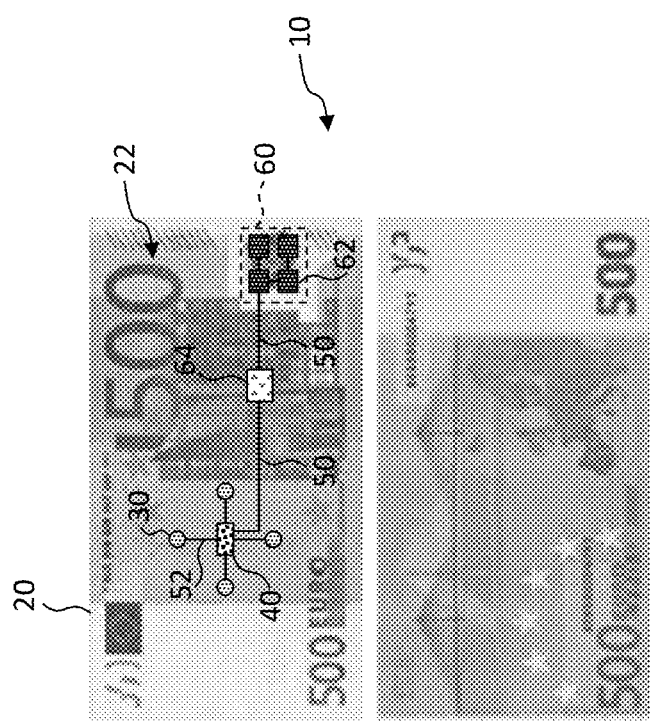
FIG. 1 is a plan view of the front and back sides of an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Referring to FIG. 1, in some embodiments of the present disclosure a hybrid currency banknote 10 includes a banknote 20 having visible markings 22. The banknote 20 can be a government-issued banknote 20 indicated by the visible markings 22 and can comprise a flexible substrate that includes paper, plastic, or impregnated paper. One or more light-controlling elements 30 are embedded in or on the banknote 20 and can be printed on the flexible substrate. A controller 40 is embedded in or on the banknote 20 and electrically connected to the one or more light-controlling elements 30 for controlling the one or more light-controlling elements 30. A power input connection 50 is electrically connected to the controller 40, one or more light-controlling elements 30, or both. In a further embodiment, a power source 60 is electrically connected to the power input connection 50, for example directly to the power input connection 50 (not shown) or through a power convertor 64 (as shown). The power source 60 and the controller 40 can be a common element or a common circuit and the controller 40 can be a power conditioning circuit or can include analog or digital control circuitry. The controller 40, the light-controlling elements 30 and the power input connection 50 can be electrically connected, for example with wires 52. Multiple controllers 40 can be used to provide redundancy, reduce failures, and increase lifetime. The multiple controllers 40 can be connected in parallel with common input, output, power, and ground connections. In other embodiments, the controller 40 can include multiple circuits in multiple integrated circuits and include discrete components, such as capacitors and resistors that can provide additional control support, for example as timing or trimming devices to support light-controlling element 30 flash rates, filter devices such as acoustic wave devices (either bulk or surface).

The power source 60 can be a piezoelectric power source or a photovoltaic power source and the power convertor 64 can convert the power provided by the power source 60 to a form that is used by the controller 40, the light-controlling elements 30, or both. The power convertor 64 can include power storage, for example using capacitors such as thin-film capacitors with a high-K dielectric to provide power over a time period. The capacitors can be distributed, for example located among the power components 62. Output diodes can be used to isolate the power source 60 or light-controlling elements 30. In one arrangement, the power source 60 is indicated by the visible markings 22, the power source 60 forms a part of the visible markings 22, or the power source 60 is obscured by the visible markings 22. Multiple power sources 60 and multiple power convertors 64 can be used to provide redundancy.

In some embodiments, the power source 60 comprises a plurality of electrically connected but physically separated individual power components 62. The power components 62 can be arranged in a 2-d array (as shown) or a 1-d array (not shown) and operated by squeezing, waving, or sliding an object across the power components 62. The power components 62 can be a group of elements that are operated at the same time with a single action, for example pressure applied to all of the power components 62 simultaneously. The power components 62 can be electrically arranged in series to achieve a desired voltage or in parallel to achieve a desired current or some combination of series and parallel to achieve the desired power characteristics.

The light-controlling elements light-controlling elements 30 can be inorganic light-emitting diodes 30 such as micro-light-emitting diodes suitable for micro-transfer printing, for example made on a semiconductor wafer adapted to the manufacture of inorganic light-emitting diodes 30. In general, the light-controlling elements 30 can be light-emitting elements, light-reflecting elements, inorganic light-emitting diodes, organic light-emitting diodes, micro-electromechanical reflective elements, reflective electrophoretic elements, or reflective electrochromic display elements. For clarity of exposition, the light-controlling elements 30 of the present disclosure are referred to below as inorganic light-emitting diodes (iLEDs) 30. However, in various embodiments the present disclosure contemplates the use of a corresponding variety of light-controlling elements 30. In another embodiment, the light-controlling elements 30 are also energy harvesting elements (for example silicon photodiodes) and provide power as part of the power source 60.

The controller 40 can also be an integrated circuit, for example a small chiplet, suitable for micro-transfer printing. The controller 40 can include digital circuits or logic (for example CMOS circuits) and power circuits (for example for driving an iLED 30). The controller 40 can include information storage circuits, a state machine, or a stored program machine to implement the desired functionality of the hybrid currency banknote 10. The controller 40 can read or write information such as currency values, process information, respond to input and provide output. The power input connection 50 can be directly connected to the controller 40 (as shown) or to the iLEDs 30, or both. Alternatively, the power input connection 50 can indirectly connect to the controller 40 or the iLEDs 30, or both through the power convertor 64 (not shown). The power input connection 50 can be an electrical conductor, for example small wires 52, and can include power connection pads that, when electrically connected to a power source, (such as a 3.3-volt, 5-volt, or 12-volt power source), provides power to the controller 40 and iLEDs 30 to enable them to function. The power source can be external (not shown) or can be provided by the internal power source 60.

It can be desirable to fold or spindle the hybrid currency banknote 10 of the present disclosure. To facilitate such a manipulation, in some embodiments of the present disclosure, the power source 60 comprises a plurality of electrically connected smaller individual power components 62. A single large power source 60 can be too rigid to readily fold or curve, whereas an arrangement of individual smaller physically separate power components 62 can allow folding between the smaller power components 62, even if the smaller power components 62 themselves are relatively rigid.

In a further embodiment, the iLEDs 30 and controller 40 are too small to be readily visible with the unaided human eye. Furthermore, the iLEDs 30 and controller 40 can be located in areas of the banknote 20 that include visible markings 22 to further obscure the presence of the iLEDs 30 and controller 40, as well as any wires 52. Similarly, the power source 60 or an arrangement of individual smaller power components 62 can be obscured by the visible markings 22. In one embodiment, any of the iLEDs 30, controller 40, wires 52, power source 60, power components 62, or power convertor 64 are marked with visible markings 22. For example, ink can be printed over the iLEDs 30, controller 40, wires 52, power source 60, power components 62, or power convertor 64 to obscure them or otherwise make them a part of the visible markings 22 on the banknote 20. Since the the iLEDs 30, controller 40, wires 52, power source 60, power components 62, or power convertor 64 can each be very small, for example having a size in the micron range, they can be effectively invisible to the unaided human eye. For example, the one or more inorganic micro light-emitting diodes 30 or the controller 40 of the hybrid currency banknote 10 can have a width from 2 to 5 µm, 5 to 10 µm, 10 to 20 µm, or 20 to 50 µm, a length from 2 to 5 µm, 5 to 10 µm, 10 to 20 µm, or 20 to 50 µm, or a height from 2 to 5 µm, 4 to 10 µm, 10 to 20 µm, or 20 to 50 µm.

Figure 2:
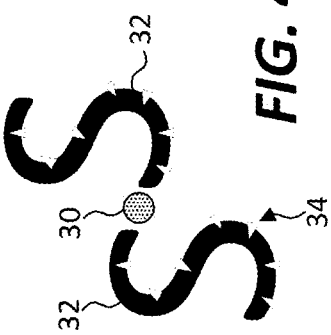
FIG. 2 is a schematic diagram according to an embodiment of the present disclosure.

In one embodiment of the present disclosure, the iLEDs 30 and controller 40 are directly printed onto a banknote 20, for example before or after the banknote 20 is printed with ink. In this embodiment, wires 52 can be woven into the banknote 20 in predetermined locations at which the iLEDs 30 and controller 40 are printed before or after the iLEDs 30 and controller 40 are printed. Referring to FIG. 2 in another embodiment, the banknote 20 includes a metalized or metallic ribbon 70 or thread, for example Mylar, with a pattern of electrical conductors or wires 52. The iLEDs 30 and controller 40 are printed, for example micro-transfer printed, onto the ribbon 70 before or after the electrical conductors such as wires 52 are formed, patterned, or impressed into the ribbon 70 to make an electrical circuit. In some such embodiments, the iLEDs 30 and controller 40 can include at least a portion of an LED tether 31 (see FIG. 20, for example), resulting from the fracturing of an LED tether 31 on an iLED source wafer from which the iLEDs 30 and controller 40 originate and that connects the iLEDs 30 and controller 40 to an anchor on the source wafer in the micro-transfer printing process. The ribbon 70 or thread is then incorporated into the banknote 20 to make an embodiment of a hybrid currency banknote 10 of the present disclosure. The power source 60 (and any power components 62), power convertor 64, or power input connection 50 can likewise be formed in the ribbon 70. Alternatively, some components can be on the ribbon 70 and others not on the ribbon 70, in particular the power source 60.

Figure 3:
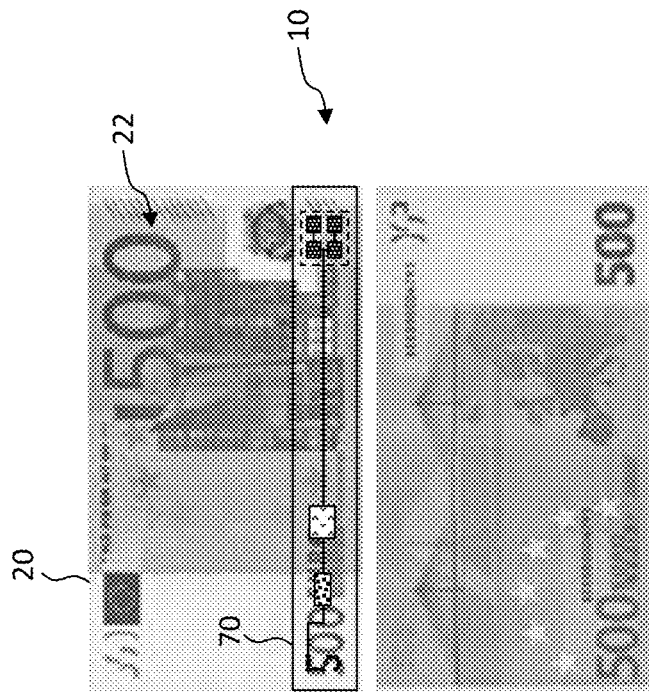
FIG. 3 is a plan view of the front and back sides of another embodiment of the present disclosure.

Referring to FIG. 3, in some embodiments, the one or more inorganic LEDs 30 are disposed in a location corresponding to a portion of the visible markings 22 to highlight or otherwise indicate the portion of the visible markings 22. For example, the one or more inorganic LEDs 30 can underline or surround a graphic element of the visible markings 22. As shown in FIG. 3, the one or more inorganic LEDs 30 outline the numeral 5. Thus, the one or more inorganic LEDs 30 can be disposed to form a graphic indicator such as any of one or more of a number, a letter, and a pictogram. The graphic indicator can have semantic content, for example indicating a value, a date, or a person.

Figure 4:
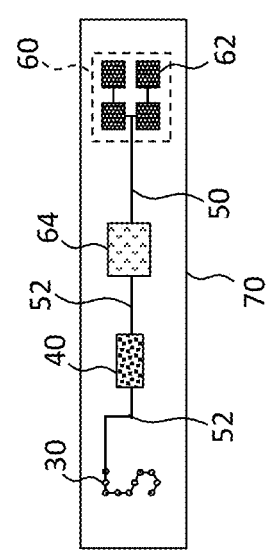
FIG. 4 is an illustration of a light pipe according to an embodiment of the present disclosure.

Referring next to FIG. 4, one or more light pipes 32 are located in association with the one or more inorganic light-emitting diodes 30 to transmit light emitted by the inorganic light-emitting diodes 30 through the light pipes 32 and emit the transmitted light from the opposite end of the light pipe 32. In some embodiments, the light pipes 32 include portions that leak light at desired locations, for example by purposefully forming nicks, scratches, or other forms of light diffusers 34 in the light pipes 32 to allow light to leak from the light pipe 32. Thus, the arrangement of the light pipes 32 can also correspond to a portion of the visible markings 22 to indicate (e.g., highlight) the portion of the visible markings 22, form a graphic indicator, or form any one or all of a number, a letter, and a pictogram to indicate a value, a date, or a person.

The controller 40 can control the one or more inorganic light-emitting diodes 30 to flash or sequentially flash individual iLEDs 30, forming spatial, temporal, or temporal-spatial light patterns. Referring to FIG. 5, in some embodiments, the inorganic light-emitting diodes 30 can emit different colors of light. For example, a red light-emitting diode 82 can emit red light, a green light-emitting diode 84 can emit green light, and a blue light-emitting diode 86 can emit blue light. The different inorganic light-emitting diodes 30 can be arranged spatially to form a display 80, a two-dimensional array, or a graphic element.

In another embodiment of the present disclosure and referring to FIG. 6, the hybrid currency banknote 10 includes visible markings 22 that do not include a value. Such a hybrid currency banknote 10 can be a non-denominational banknote that either has an assigned value or a variable value stored in a memory 44 in the controller 40, as shown in FIG. 7. Referring to FIG. 7, an assigned value can be provided by providing a circuit 42 and memory 44 in the controller 40 or providing circuits 42, such as the memory 44, connected to the controller 40. The memory 44 can be a read-only memory that encodes a desired assigned value. The assigned value can be a currency value or can include an electronic serial number, or both. The assigned value can be discovered by providing power to the power input connection 50. The power energizes the controller 40 which, in turn, controls the iLEDs 30 to display or otherwise indicate the assigned value. The memory 44 can be protected from overwriting, damage, or alternative discovery by protective layers such as a protective shield 46 formed over the memory 44 to discourage exposure by light and protect the memory 44 from heat. The shield 46 can be a light shield, a light reflector, a light absorber, or a heat conductor.

Figure 9:
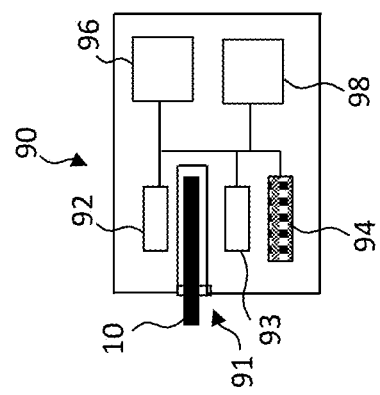
FIG. 9 is a schematic of a teller machine according to an embodiment of the present disclosure.
Figure 8:
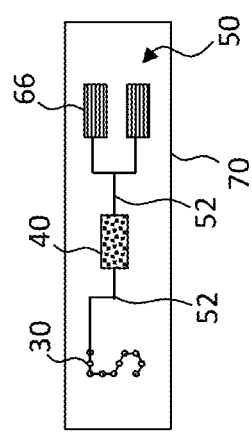
FIG. 8 is a schematic diagram illustrating a circuit according to another embodiment of the present disclosure.

In the case in which the assigned value is variable, the memory 44 can be a write-once memory that stores multiple values in memory locations that are ordered in a sequential order, for example by memory address. The write-once memory can, for example, employ fuses that are electrically destroyed and cannot be rewritten. Alternatively, the memory 44 can be a non-volatile read-write memory. In this case, the value stored by the hybrid currency banknote 10 can change over time. The current value can be discovered by providing power to the power input connection 50. The power energizes the controller 40 which, in turn, controls the iLEDs 30 to display or otherwise indicate the current value. The current value can be modified by, for example, a teller machine. Referring to FIGS. 8 and 9, in some embodiments of the present disclosure, the hybrid currency banknote 10 is adapted to a hybrid currency teller machine 90 that writes a value into the memory 44 in a memory storage location having an address sequentially after the address of a previous written value. As shown in FIG. 8, the power input connection 50 includes or is connected to power connection pads 66 that can be contacted by an external power source to provide power to the controller 40 and iLEDs 30 through wires 52. Referring to FIG. 9, a hybrid currency teller machine 90 includes a slot 91 into which a hybrid currency banknote 10 can be inserted. Once inserted into the hybrid currency teller machine 90, the hybrid currency banknote 10 is read by a reader 92 that can access the controller 40 or memory 44, for example by contacting electrical conductors to the power connection pads 66. (Only two power connection pads 66 are illustrated, but one or more power connection pads 66 can be included in various embodiments of the present disclosure). Once the current value of the hybrid currency banknote 10 is read, it can be displayed, for example on an optional teller machine display 96. If a change in the current value of the hybrid currency banknote 10 is desired, an input value can be input by a user with an input device 94. A teller machine controller 98 can then calculate or otherwise determine a new stored value responsive to the input value and store the new value in the hybrid currency banknote 10, for example by communicating the new stored value to the controller 40 which then writes the new stored value in the memory 44 with a writer 93. In some embodiments, the controller 40 only writes new stored values in the memory 44 that are smaller than the current value. In another embodiment, the controller 40 can write new stored values in the memory 44 that are larger than the current value, or that are larger than the current value but are limited to a maximum value. The change in current value of the hybrid currency banknote 10 can represent or be the result of a financial transaction, for example a purchase or a financial exchange with or facilitated by a financial institution such as a bank. Read-only memories, write-once memories, and read/write memories together with controllers and read/write circuitry (e.g., reader 92 and writer 93) can be formed in integrated circuits and electrical circuits. Devices for currency handling, optical inspection, making physical electronic contacts, displays, input devices (such as keyboards or touch screens) can be made using electromechanical, electronic, and optical technologies.

Figure 10:
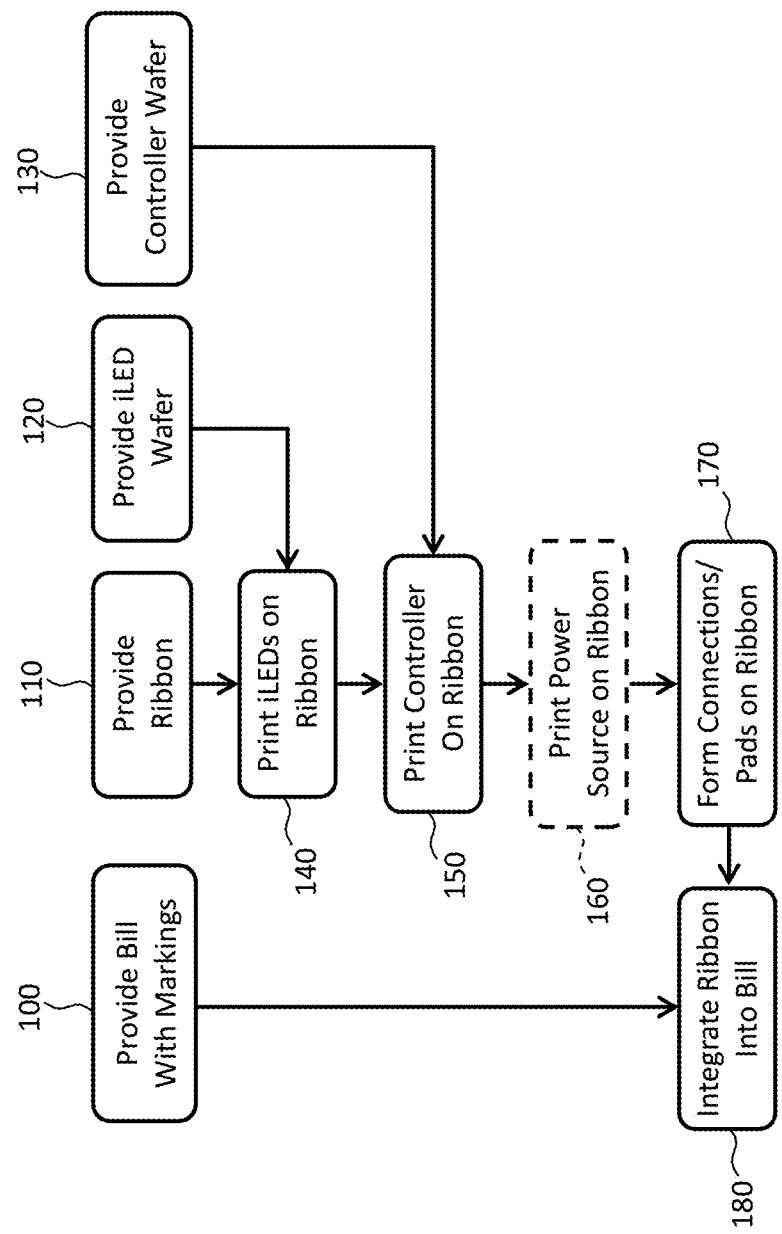
FIGS. 10-12 are flow charts illustrating methods of the present disclosure.

Referring to FIG. 10, a hybrid currency banknote 10 of the present disclosure can be made by providing a banknote 20 with markings in step 100, for example by printing on a high-quality paper with ink using intaglio printing. A ribbon 70 is provided in step 110, an inorganic LED wafer having micro-transfer printable iLEDs 30 is provided in step 120, and a controller source wafer having micro-transfer printable controllers 40 is provided in step 130. The iLEDs 30 are micro-transfer printed from the inorganic LED wafer onto the ribbon 70 using a stamp to fracture LED tethers 31 connecting the iLEDs 30 to the inorganic LED wafer leaving at least a portion of an LED tether 31 on the iLEDs 30 in step 140. The controllers 40 are micro-transfer printed from the controller source wafer onto the ribbon 70 using a stamp to fracture controller tethers 65 connecting the controllers 40 to the controller source wafer leaving at least a portion of a controller tether 65 on the controllers 40 in step 150. Optionally, the power source 60 is similarly micro-transfer printed to the ribbon 70 in step 160. Power connection pads 66, wires 52 and any other necessary electrical conductors are formed in step 170 to make an electronic circuit having electrical conductors. The electrical conductors can be provided before or after the iLEDs 30 and controllers 40 are micro-transfer printed. The ribbon 70 can be further processed, for example to provide environmental robustness by coating with protective layers. The ribbon 70 is then integrated into the banknote 20 in step 180 to make the hybrid currency banknote 10 of the present disclosure. The hybrid currency banknote 10 can be further processed, for example by over coating or printing to provide environmental robustness, decoration, or to obscure the micro-transfer printed elements.

Figure 11:
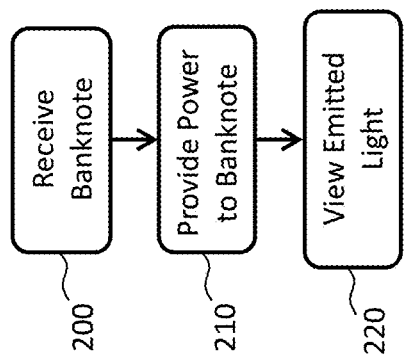

Referring to FIG. 11, the hybrid currency banknote 10 of the present disclosure can be used by first receiving the hybrid currency banknote 10 in step 200, providing power to the hybrid currency banknote 10 in step 210, and viewing light emitted by the hybrid currency banknote 10 in step 220. Power can be provided by connecting the hybrid currency banknote 10 to an external power source (e.g., using the power connection pads 66), squeezing a piezoelectric power source 60, or exposing a photovoltaic power source 60 to light.

Figure 12:
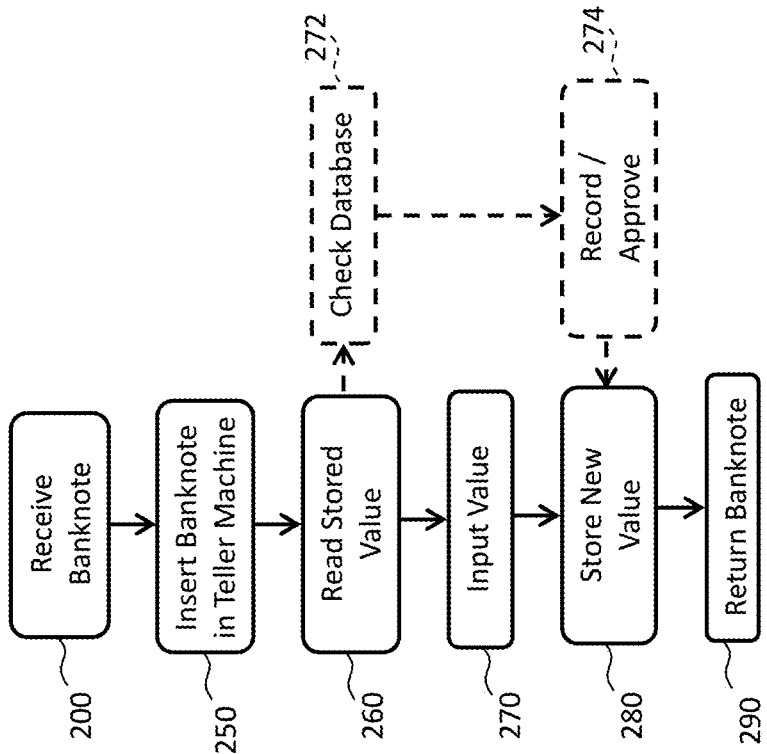

Referring to FIG. 12, an assigned or current value can be programmed into the controller 40 or an associated memory 44 (also micro-transfer printed if it is a separate integrated circuit or chiplet) either before or after the controller 40 or memory 44 is micro-transfer printed. Alternatively, an external device such as a hybrid currency teller machine 90 can communicate with the controller to write an assigned or current value to the hybrid currency banknote 10. For example, the hybrid currency banknote 10 can be received in step 200, inserted into the hybrid currency teller machine 90 in step 250, the current value read by the reader 92 in step 260, an input value input by the input device 94 in step 270, a new stored value responsive to the input value computed by the teller machine controller 98 and stored by the writer 93 in step 280 and the hybrid currency banknote 10 returned in step 290. Optionally, the hybrid currency teller machine 90 can also communicate with a central or remote database (step 272) to establish the legitimacy of the hybrid currency banknote 10, track its use or location, or approve a transaction and record or approve the transaction (step 274). The communication can include an electronic serial number.

U.S. patent application Ser. No. 14/743,981, filed Jun. 18, 2015, entitled Micro Assembled Micro LED Displays and Lighting Elements, incorporated herein by reference describes micro-transfer printing structures and processes useful with the present disclosure. For a discussion of micro-transfer printing techniques see also U.S. Pat. Nos. 8,722,458, 7,622,367 and 8,506,867, each of which is hereby incorporated by reference in its entirety. Micro-transfer printing using compound micro assembly structures and methods can also be used with the present disclosure, for example, as described in U.S. patent application Ser. No. 14/822,868, filed Aug. 10, 2015, entitled Compound Micro-Assembly Strategies and Devices, which is hereby incorporated by reference in its entirety.

Figure 13:
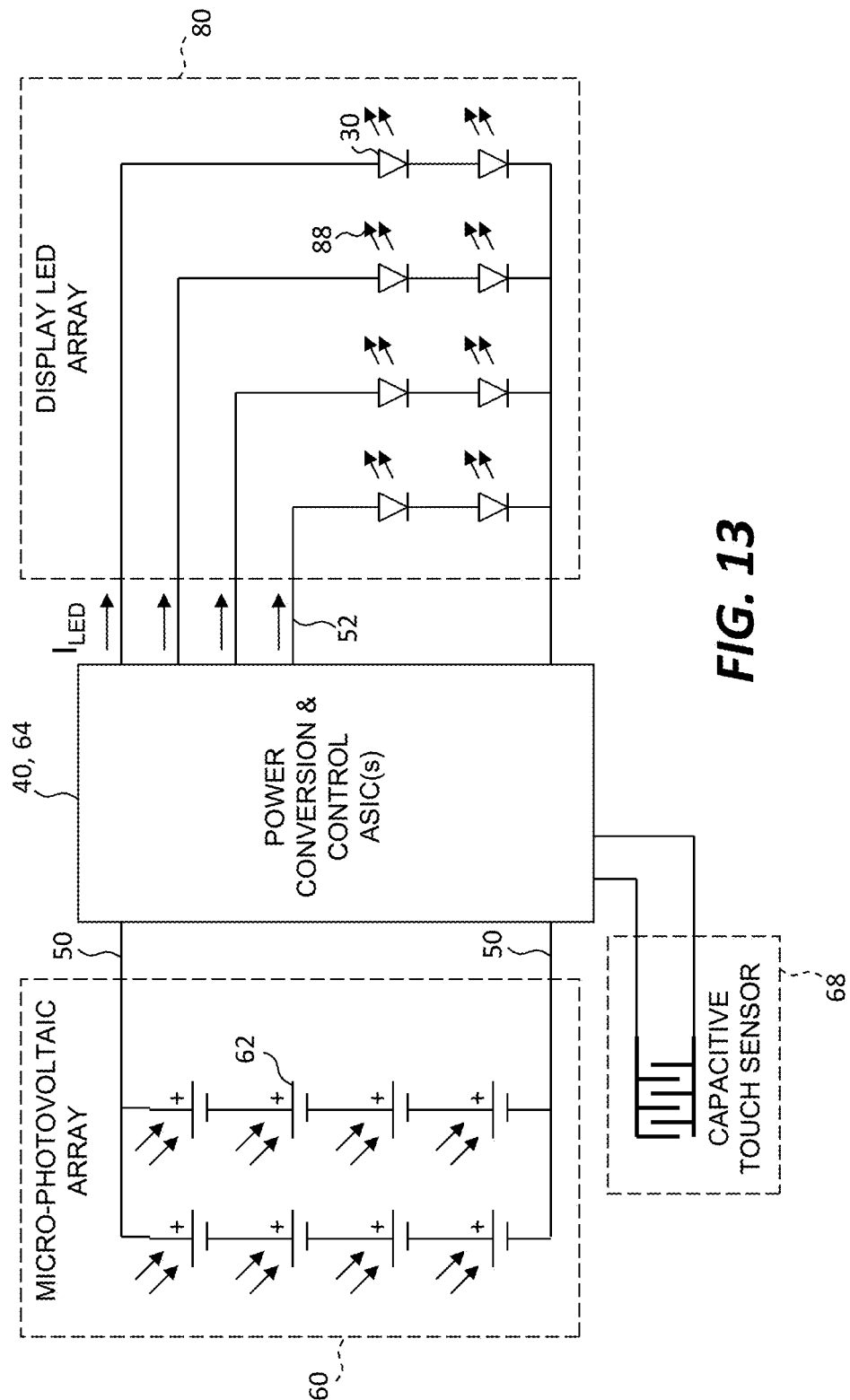
FIGS. 13-15 are schematic diagrams according to embodiments of the present disclosure.
Figure 14:
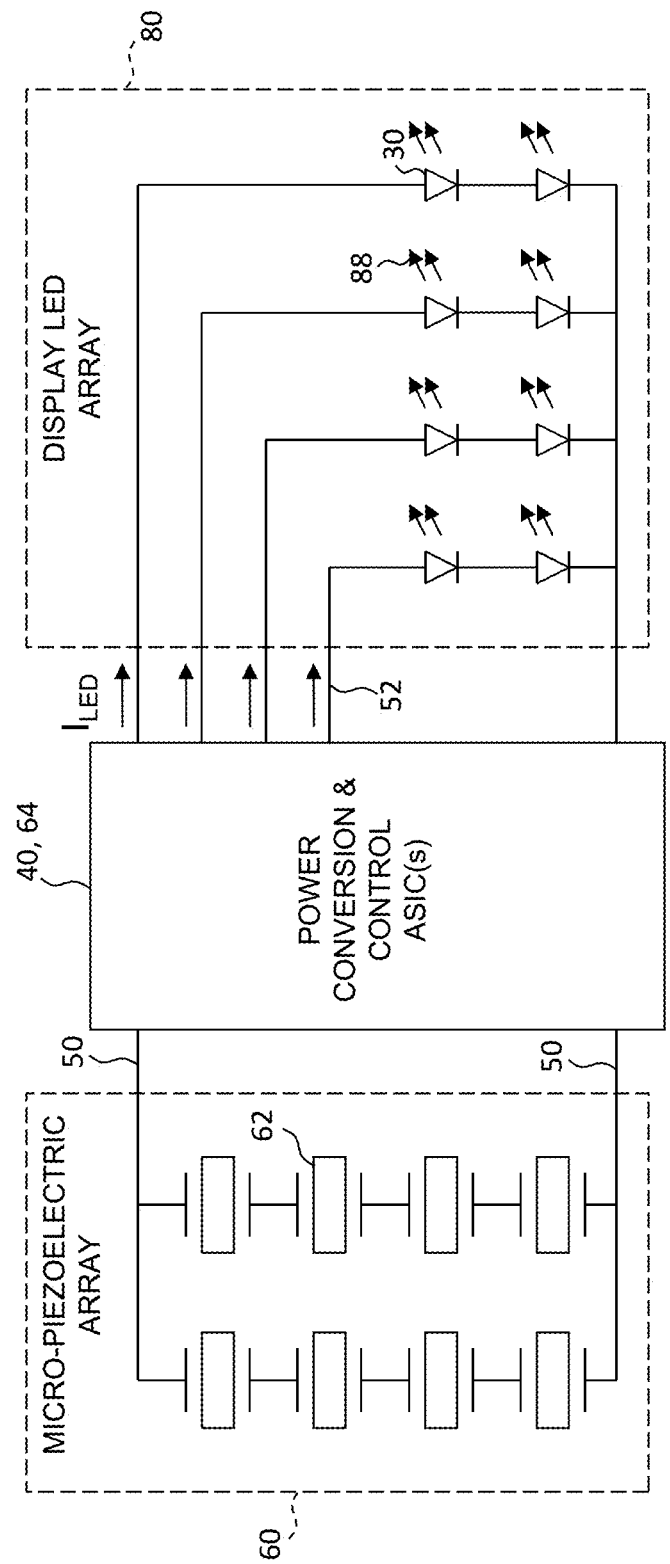
Figure 15:
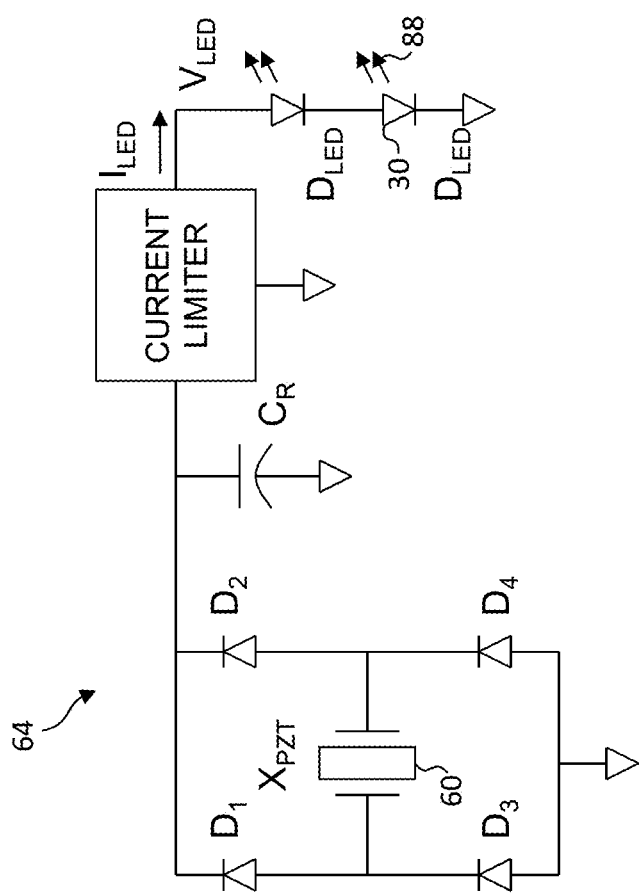

A simplified schematic of some embodiments of the present disclosure is illustrated in FIGS. 13 and 14. As shown in these Figures, a power source 60 includes two parallel groups of four series-connected power components 62 electrically connected to the power input connection 50 and the power convertor 64 and controller 40. The power convertor 64 and controller 40 can be a single component, as shown, or include multiple different components such as separate integrated circuits. Control current from the power convertor 64 and controller 40 drives the iLEDs 30 of the display 80 to emit light 88. A capacitive touch sensor 68 is also included (FIG. 13). In FIG. 13, the power source 60 is a photovoltaic power source. In FIG. 14, the power source 60 is a piezoelectric power source. FIG. 15 illustrates an example power convertor 64 and controller 40 having a four-diode bridge rectifier and storage capacitor $C_R$ (for example, see capacitor 67 in FIG. 22) providing power from a piezoelectric power source 60 to a current limiter that, in turn, provides current to the iLEDs 30 to emit light 88. (The controller 40 can be powered by the power source 60 to control the iLEDs 30 but is not illustrated in FIG. 15. As noted above, the controller 40 and power source 60 can be a common component or circuit or can be separate or individual components or circuits.)

Figure 16:
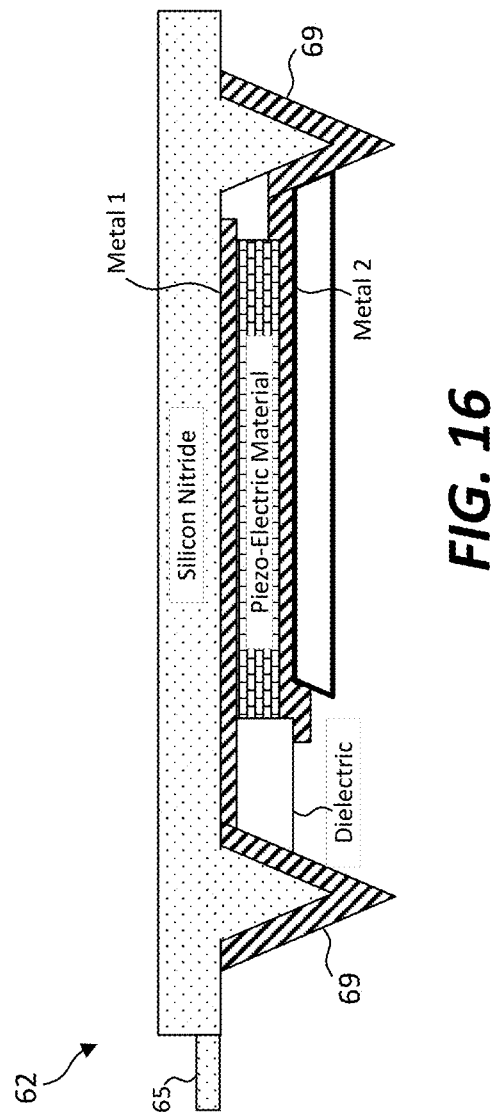
FIG. 16 is a cross section of a piezoelectric power component according to an embodiment of the present disclosure.

Referring to FIG. 16, a power component 62 can include a dielectric layer such as a silicon nitride layer with a first metal layer providing a first connection post 69 or spike. A piezoelectric material layer is in electrical contact with the first metal layer and, on a side of the piezoelectric material layer opposite the first metal layer, a second metal layer is in electrical contact with a second metal layer and forms a second connection post 69 or spike. The power component 62 of FIG. 16 can be micro-transfer printed onto two conductors (e.g., wires 52) so that the first and second connection posts 69 are in contact with the conductors. The first and second connection posts 69 can pierce or otherwise deform and adhere to the conductors after micro-transfer printing.

Figure 17:
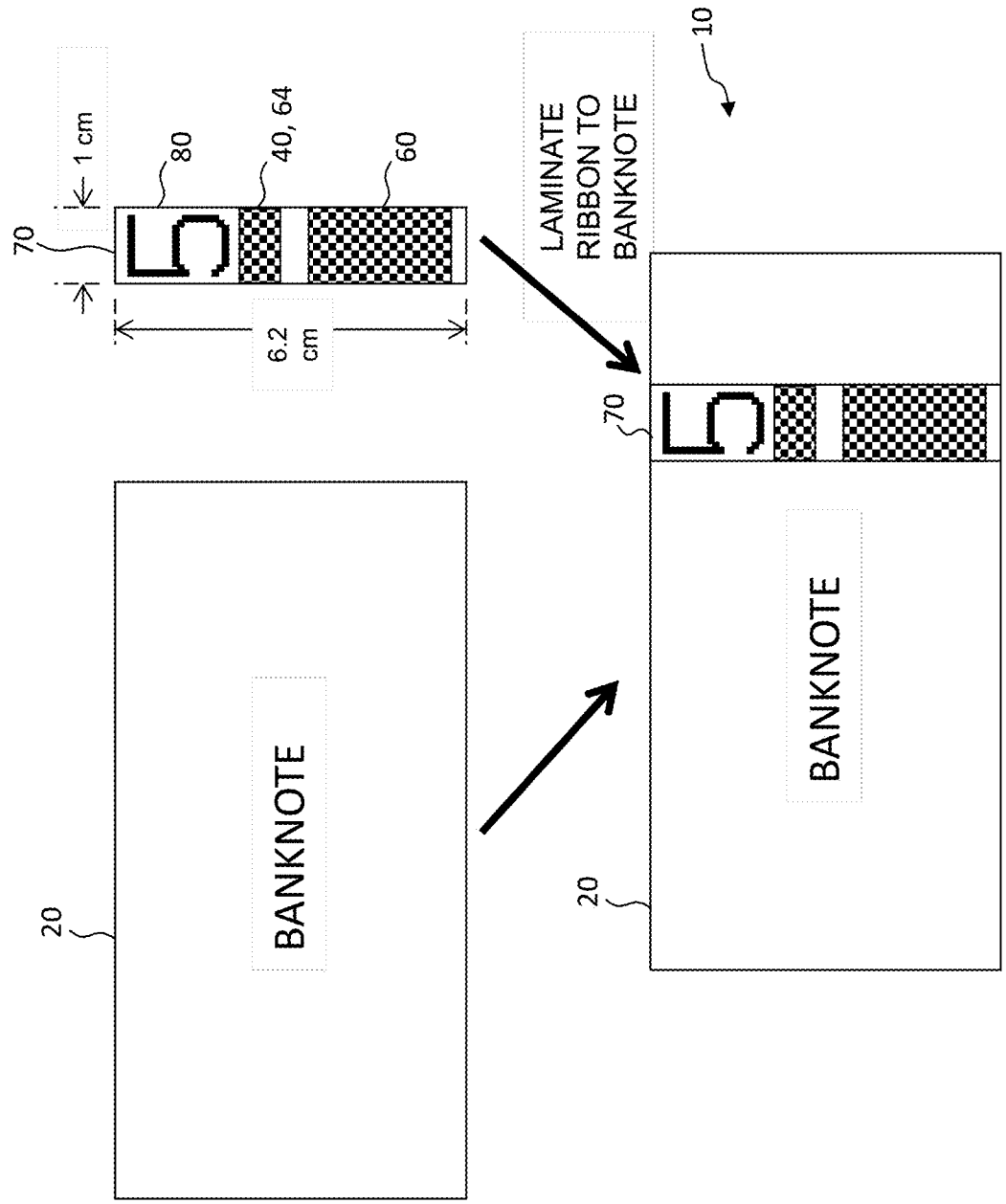
FIG. 17 is a schematic illustration of a method according to an embodiment of the present disclosure.

FIG. 17 illustrates the process of making a banknote 20 according to some embodiments of the present disclosure. A printed banknote is provided together with a ribbon 70 having an array of micro-transfer printed iLEDs 30 electrically connected to a controller, a power convertor 64, and a power source 60. The ribbon 70 is laminated or otherwise integrated into the banknote 20 to make a hybrid currency banknote 10.

Figure 18:
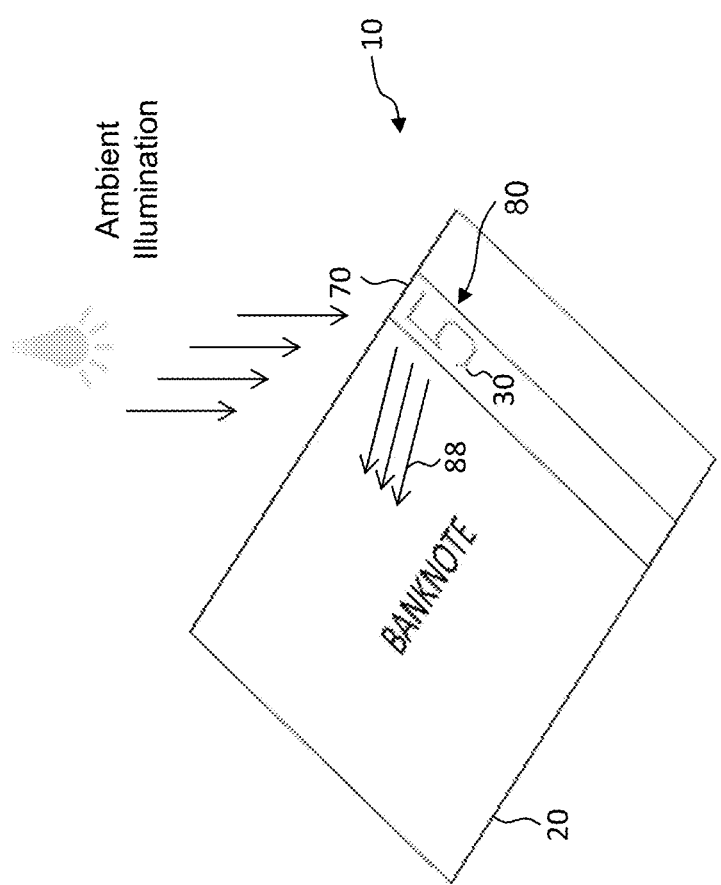
FIGS. 18 and 19 are schematic illustrations of methods of operating an embodiment of the present disclosure.

As shown in FIG. 18, a hybrid currency banknote 10 of the present disclosure having a photovoltaic power source 60 can be exposed to ambient illumination to provide power to iLEDs 30 in a display 80, causing the iLEDs 30 to emit light 88. It has been calculated that conventional ambient office light provides sufficient illumination (e.g., 500 lux) to operate a photovoltaic embodiment of the present disclosure, including digital control for iLEDs 30 sequencing, for example flashing. Photovoltaic cells (e.g., power components 62) can be GaAs having lateral dimensions of 50 µ by 50 µ and providing 66 µW in an array of 50,000 power components 62 and requiring approximately 1.27 $cm^2$. The array of power components 62 can occupy a larger area with a lower fill factor to provide apparent transparency and improved flexibility to the power source 60. A 20×20 array of 400 iLEDs 30 (for example, green-light-emitting iLEDs 30) can provide a readable display 80 in these conditions over a viewing angle of 140 degrees similar to displays found in body-worn electronic devices (e.g., watches, fitness trackers) and can consume 66 µW.

Figure 19:
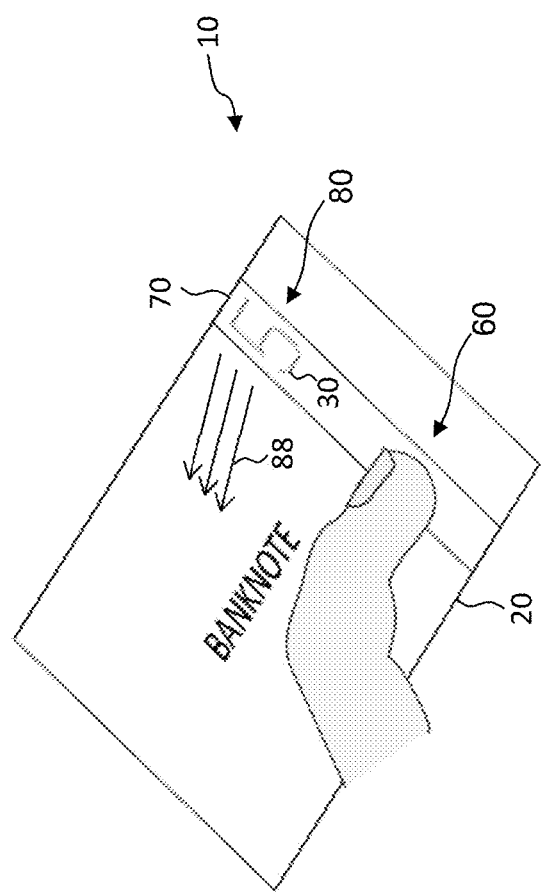

As shown in FIG. 19, a hybrid currency banknote 10 of the present disclosure having a piezoelectric power source 60 can be pressed or squeezed, for example, by a finger, to provide power to iLEDs 30 in a display 80, causing the iLEDs 30 to emit light 88. Power is provided both when pressing and releasing (hence the use of a bridge rectifier in FIG. 15). It has been demonstrated that a fingertip having a one square cm area can provide a force of 35 N. Even with a smaller force of 10 N, a piezoelectric power source 60 with a total area of 0.06 $cm^2$ provides sufficient power to operate a piezoelectric embodiment of the present disclosure, including digital control for iLEDs 30 sequencing, for example flashing. The array of power components 62 can occupy a larger area (e.g., 0.5 $cm^2$) with a lower fill factor to provide apparent transparency and improved flexibility to the power source 60.

According to another embodiment of the present disclosure, a hybrid currency banknote 10 can have one or more energy output devices embedded in or on hybrid currency banknote 10. The one or more energy output devices can be one or more of one or more light-emitting elements, a sound-emitting element, and a vibration element. The sound-emitting element can be a piezoelectric speaker and the vibration device can be a piezoelectric device. The elements can be controlled, powered, hidden, constructed, or otherwise provided in ways similar to those of the light-emitting elements 30 discussed at greater length above. Such alternative energy output modalities can be useful for persons with impaired vision.

In a further embodiment of the present disclosure, a hybrid document 10 (e.g., a hybrid currency banknote 10) comprises a document 20 having visible markings 22 and one or more light-controlling elements 30 (e.g., inorganic light-emitting diodes 30) embedded in or on document 20 (FIG. 1). A controller 40 is embedded in or on document 20 and is electrically connected to the one or more light-controlling elements 30 for controlling the one or more light-controlling elements 30. The electrical connection can be a wire connection or other methods, such as capacitive alternating current coupling, can be used to control light-controlling element 30. The one or more light-controlling elements 30 can emit or control light of different colors and can be located in a variety of locations in or on documents 20, for example in an array and controlled by controller 40 to display fixed or programmable patterns. A power input connection 50 can be electrically connected to any one or all of controller 40, power convertor 64, circuit 42, memory 44, or the one or more light-controlling elements 30. Controller 40 can control light-controlling elements 30 (e.g., iLEDs 30).

In various embodiments, document 20 is a banknote 20 (as shown in FIG. 1), a bond, a stock certificate, a commercial certificate, a printed value-bearing document, an identification document, or a government-issued document, for example a passport or license. A bond can be a commercial, municipal, or corporate bond, a government-issued bond, or bearer bond, or other debt security.

As with hybrid currency banknote 10 described above, light-controlling elements 30 of hybrid documents 10 can be light-emitting elements, light-reflecting elements, inorganic light-emitting diodes 30, organic light-emitting diodes, micro-electromechanical reflective elements, reflective electrophoretic elements, or reflective electrochromic display elements. In some embodiments of the present disclosure, hybrid document 10 vibrates or emits acoustic signals, such as audible sounds, tones, or sequences of sound, for example in a melody using, for example, polymer piezo films or electrostatic speakers. A hybrid document 10 can include one or more output modes, for example a light-controlling mode or an acoustic mode, or both a light-controlling mode and an acoustic mode.

In some configurations of the present disclosure, a power source 60 can be connected to power input connection 50 of hybrid document 10 (as shown in FIG. 1). Power source 60 can be a piezoelectric power source or a photovoltaic power source, can incorporate MEMs devices, and can be integrated into hybrid document 10. Piezoelectric power source 60 can provide power in response to pressure, as described above, or, in other embodiments, in response to pushing, pulling, stretching, flapping, or waving hybrid document 10 or providing other rapid movement, for example along the longest dimension of hybrid document 10. Power can be provided using IR, UV, visible light, or other electromagnetic radiation to a photovoltaic unit via optical coupling. The electromagnetic radiation can be pulsed or encoded to provide information or signals. The electromagnetic energy source could be ambient light (for example the sun), broadband or narrowband artificial light (for example light bulbs or LEDs of various types), or narrowband high-energy sources, such as LEDs or lasers. In another embodiment, power source 60 is external to hybrid document 10 and power is transmitted to controller 40 or light-controlling elements 30, for example through electrical conductors (e.g., wires 52) in hybrid documents 10. In other configurations, inductive or magnetic coupling is employed to transmit power.

Figure 20:
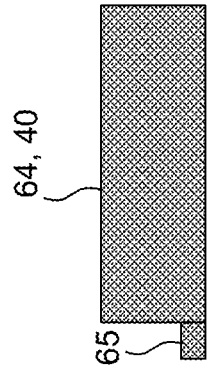
FIG. 20 is a schematic cross section illustration of an inorganic light-emitting diode with an LED tether according to illustrative embodiments of the present disclosure.
Figure 21:
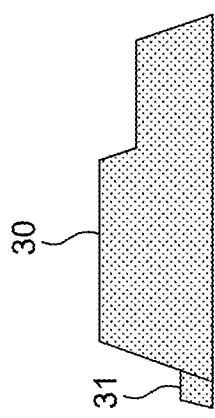
FIG. 21 is a schematic cross section illustration of a convertor or controller, or both with a convertor tether according to illustrative embodiments of the present disclosure.

Inorganic light-emitting diodes (iLEDs) 30 can be horizontal diodes with LED tethers 31, as shown in FIG. 20. Similarly, controller 40 or power convertor 64 can be comprise or be attached to a controller tether 65 or convertor tether 65, as shown in FIG. 21. A fractured or separated tether on or attached to a device indicates that the device was transfer printed (e.g., micro-transfer printed) from a source device wafer. For example, inorganic light-emitting diodes 30 can be micro-transfer printed from an inorganic light-emitting diode source wafer, controller 40 can be micro-transfer printed from a controller source wafer, and power convertor 64 (if distinct from controller 40) can be micro-transfer printed from a power convertor source wafer.

According to some embodiments of the present disclosure, a hybrid currency banknote 10 comprises a flexible banknote 20 (document 20) having visible markings 22 (e.g., as shown in FIG. 1). A component 36 (shown in FIG. 22) is embedded in or on relatively flexible banknote 20 or in or on a ribbon 70 or thread incorporated into flexible banknote 20. Component 36 comprises a component substrate 38 and one or more relatively rigid inorganic light-emitting diodes 30 (rigid compared to flexible banknote 20) disposed on component substrate 38. Component substrate 38 can also be relatively rigid compared to flexible banknote 20. A controller 40 is disposed on component substrate 38 and electrically connected to one or more inorganic light-emitting diodes 30 for controlling the one or more inorganic light-emitting diodes 30. Controller 40 can also be a power convertor 64 or power convertor 64 can be a controller 40. In some embodiments, controller 40 and power convertor 64 are a same device or a common device. A power input connection 50 is electrically connected to controller 40, power convertor 64, the one or more inorganic light-emitting diodes 30, or any combination of these. The one or more inorganic light-emitting diodes 30 each can comprise a fractured or separated LED tether 31, controller 40 can comprise a fractured or separated controller tether 65 (convertor tether 65), component substrate 38 can comprise a fractured or separated component tether 37, or any one or combination of these. Component 36 can be constructed on a component source wafer and then micro-transfer printed from the component source wafer, thereby fracturing or separating component tether 37.

Figure 22:
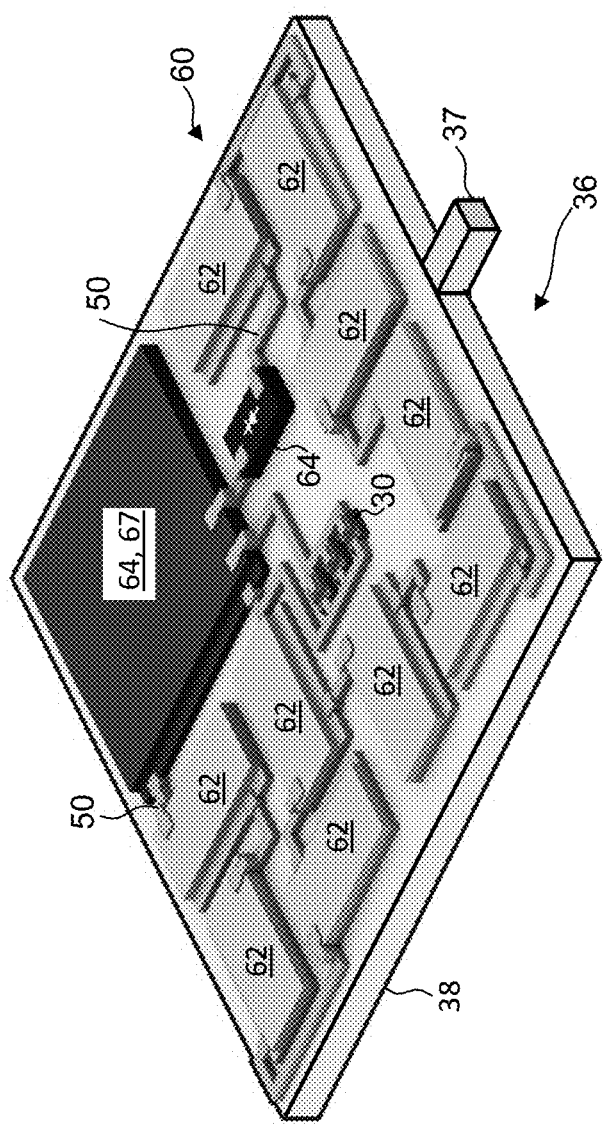
FIG. 22 is a perspective of a component with a component tether according to illustrative embodiments of the present disclosure.
Figure 23:
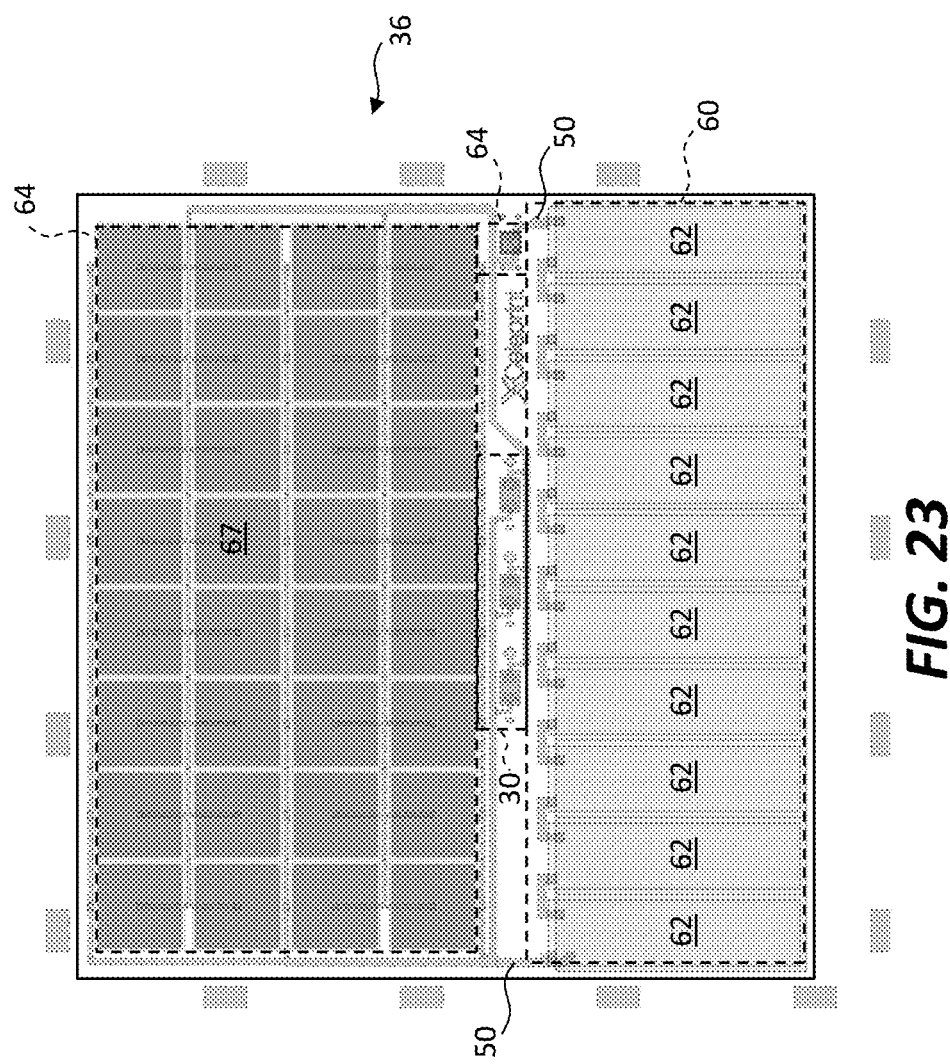
FIG. 23 is a schematic illustration of a component comprising a power source according to illustrative embodiments of the present disclosure.
Figure 27:
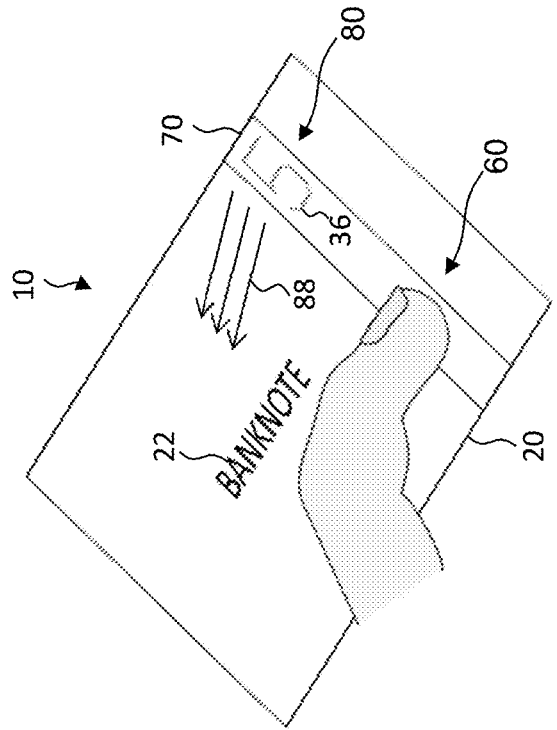
FIG. 27 is a schematic illustration of a hybrid banknote according to illustrative embodiments of the present disclosure.
Figure 26:
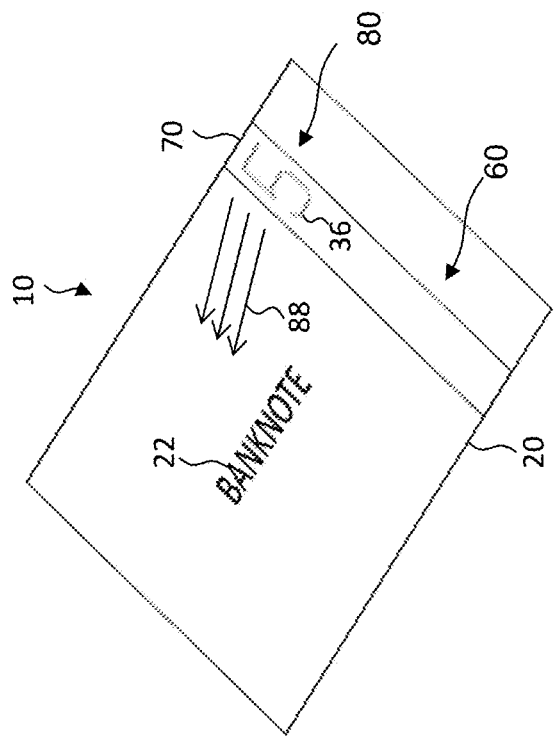
FIG. 26 is a schematic illustration of a hybrid banknote according to illustrative embodiments of the present disclosure.
Figure 28:
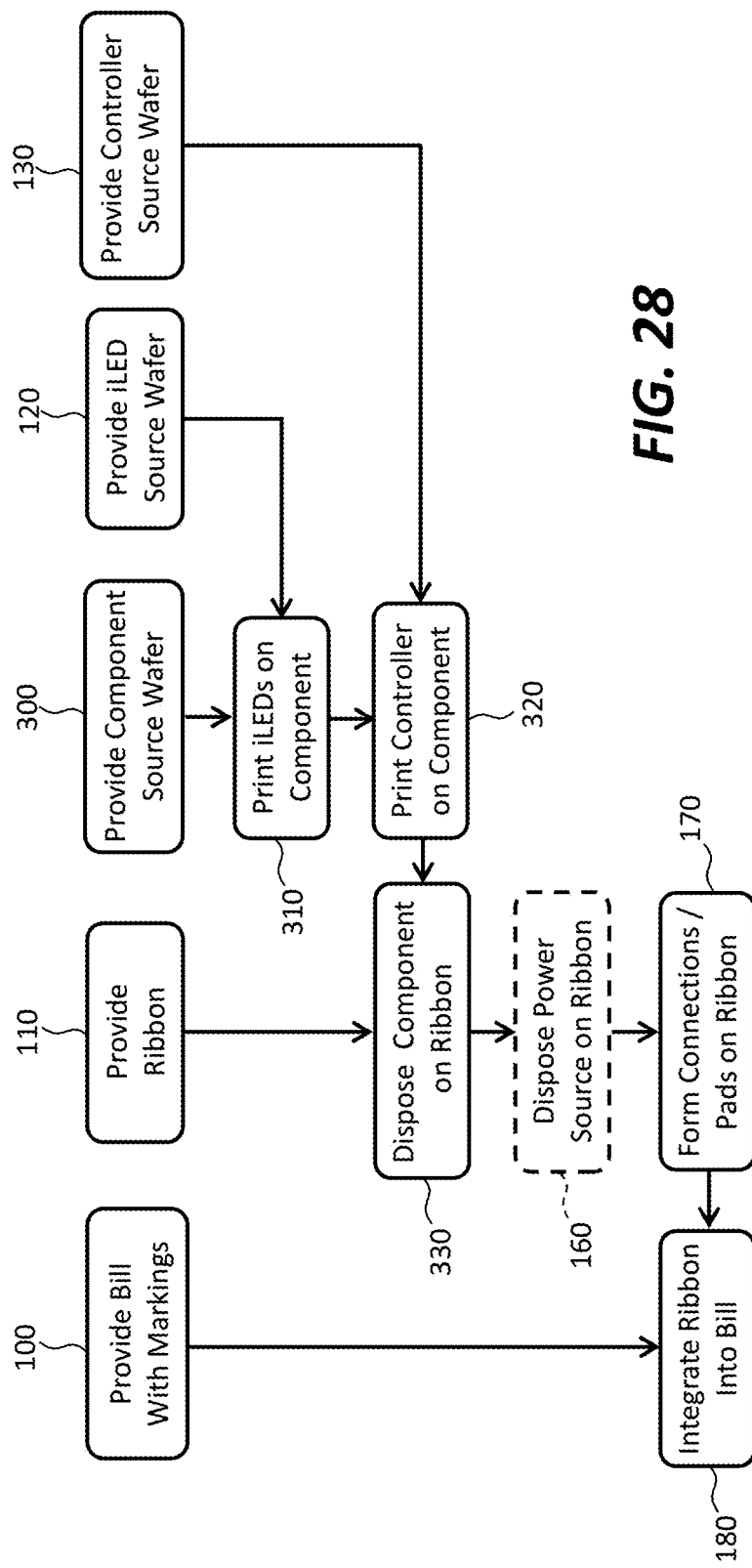
FIGS. 28-29 are flow diagrams of methods according to illustrative embodiments of the present disclosure.

According to embodiments of the present disclosure and as illustrated in FIG. 22, a power source 60 is connected to power input connection 50. Power source 60 can be disposed on component substrate 38, as shown in FIGS. 22 and 23, for example by constructing power source 60 on component substrate 38, e.g., with potassium sodium niobate (KNN), or by micro-transfer printing power source 60 from a power source substrate to component substrate 38. In some embodiments, power source 60 is disposed on flexible banknote 20 external to component substrate 38 (as shown in FIG. 24) and electrically connected to power input connections 50 and component 36, as shown in the electrical diagram of FIG. 25, for example by wires 52 embedded in flexible banknote 20. Power source 60 can be photovoltaic power source, a piezoelectric power source activated by pressure, or a piezoelectric power source activated by movement, for example flapping flexible banknote 20 or bringing ends of flexible banknote 20 near to each other (e.g., as in folding flexible banknote 20 in half) and then separating the ends of flexible banknote 20 from each other to the extent possible, e.g., flattening flexible banknote 20, thereby mechanically moving power source 60. In some embodiments, power source 60 harvests electromagnetic energy and comprises an antenna or a photodiode. Power source 60 or component 36 can be indicated by visible markings 22, power source 60 or component 36 can form a part of visible markings 22, or power source 60 or component 36 can be obscured by visible markings 22. FIG. 26 illustrates embodiments in which power source 60 is provided on component substrate 38 and emits light 88 when power is provided, for example by exposure to electromagnetic radiation or mechanical movement. FIG. 27 illustrates embodiments in which power source 60 is provided on component substrate 38 and emits light 88 when power is provided, for example by exposure to electromagnetic radiation or mechanical movement, for example as disclosed in FIGS. 22 and 23. FIG. 28 illustrates embodiments in which power source 60 is provided external to component substrate 38 and emits light when power is provided, for example by mechanical pressure on flexible banknote 20, for example as disclosed in FIG. 24.

As shown in the perspective of FIG. 22, power source 60 can comprise a plurality of electrically connected individual power components 62. Power components 62 can be electrically connected in series (as shown), in parallel, or in a combination of series and parallel. Component 36 can comprise a power convertor 64 disposed on component substrate 38 and connected to power input connection 50. Power convertor 64 can be electrically connected to controller 40 or one or more inorganic light-emitting diodes 30. In some embodiments, power convertor 64 and controller 40 are a common device or circuit. Power convertor 64 converts the power provided from power input connection 50 from power source 60 to a form that is used by controller 40 (if controller 40 is distinct from power convertor 64) or inorganic light-emitting diodes 30, or both.

In some embodiments of the present disclosure and as shown in FIG. 22, power convertor 64 comprises a unitary capacitor 67. In some embodiments, power convertor 64 comprises a disaggregated capacitor 67 comprising multiple capacitors 67 electrically connected in parallel, as shown in FIGS. 23-25 with 32 individual capacitors 67 each 200 by 200 microns square. In some embodiments, power convertor 64 comprises a diode, as shown in FIG. 22. Thus, in the illustrated embodiments, power convertor 64 or controller 40, can include multiple elements (e.g., a capacitor, multiple capacitors, and a diode) that can be constructed and assembled separately of different materials. For example, capacitor 67 can be constructed on component substrate 38 (e.g., constructed of KNN) and the diode can be micro-transfer printed onto component substrate 38 from a diode source wafer. In some embodiments, power convertor 64 comprises any one or combination of these. A disaggregated structure for power convertor 64 or power source 60 can provide a more mechanically robust structure that can be at least somewhat flexed without cracking. In embodiments illustrated in FIG. 22, power convertor 64 (comprising a capacitor 67 and diode) rectifies and stores charge generated by power source 60 until the charge exceeds the amount needed to pass through three inorganic light-emitting diodes 30, causing the inorganic light-emitting diodes 30 to emit light. The emitted light can flash or flash sequentially. In some embodiments, power source 60 and at least some portions of power convertor 64 are constructed of common materials in common steps, for example using KNN using photolithographic methods and can be formed on component substrate 38 using photolithographic methods and materials.

According to embodiments of the present disclosure, flexible banknote 20 is a government-issued banknote 20 indicated by visible markings 22. Flexible banknote 20 can include or comprise a flexible substrate that includes paper, plastic, or impregnated paper, and component substrate 38 can be transfer printed or otherwise disposed on or in the flexible substrate. In some embodiments, flexible banknote 20 comprises a ribbon 70 or thread woven into flexible banknote 20 and component 36 is disposed on the ribbon 70 or thread. The ribbon 70 or thread or portions of the ribbon 70 or thread can be at least partially electrically conductive or include conductive wires 52, for example electrically connecting power source 60 to component 36 through power input connections 50. Component 36 can be disposed in a location corresponding to a portion of visible markings 22 to highlight or otherwise indicate the portion of visible markings 22. Some embodiments of the present disclosure comprise a plurality of components 36 disposed on flexible banknote 20 in a random arrangement or in a regular array. Components 36 can form a one-dimensional (e.g., a line), a two-dimensional array (e.g., a display), or form a symbol.

Figure 29:
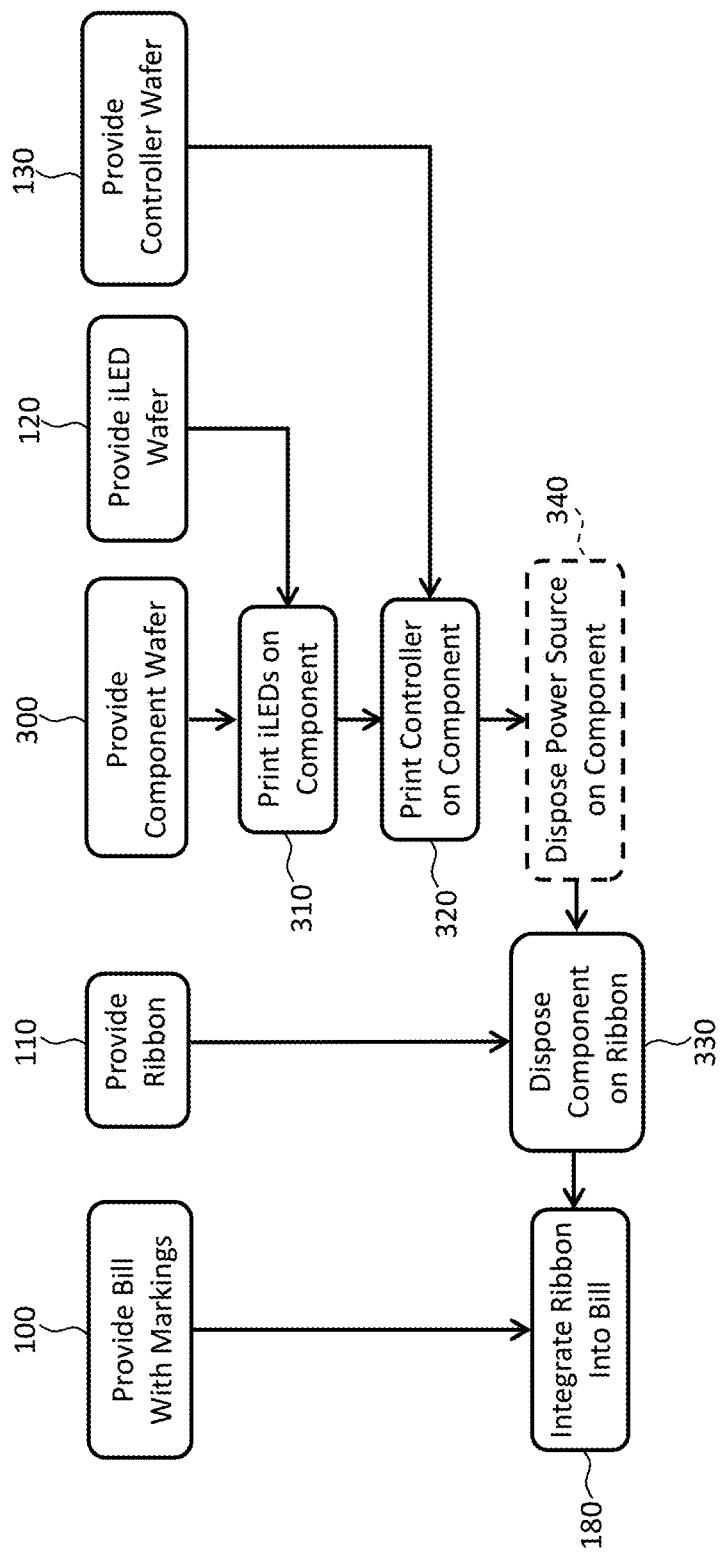

As illustrated in FIGS. 28 and 29, a method of making a hybrid currency banknote 10 comprises providing a flexible banknote 20 having visible markings 22 in step 100, providing a ribbon 70 in step 110, and providing a component source wafer in step 300 comprising relatively rigid component substrates 38 (relative to flexible banknote 20). An inorganic light-emitting diode (iLED) source wafer is provided in step 120. The light-emitting diode source wafer has a plurality of relatively rigid micro-transfer printable inorganic light-emitting diodes 30 connected by LED tethers 31 to the light-emitting diode source wafer. A controller source wafer having a plurality of controllers 40 (or power convertors 64) connected by controller tethers 65 to the controller source wafer is provided in step 130. Controllers 40 on controller source wafer can comprise power convertors 64 or a separate power convertor source wafer can be provided from which power convertors 64 can be transfer printed (generally included in step 130 in FIGS. 28 and 29).

In step 310, iLEDs 30 are micro-transfer printed from the iLED source wafer and controllers 40 (or power convertors 64) are micro-transfer printed from the controller source wafer with a stamp to component substrate 38 in step 320 thereby fracturing or separating each LED tether 31 that connected the one or more of the plurality of inorganic light-emitting diodes 30 to the light-emitting diode source wafer and each controller tether 65 that connected the at least one of the plurality of controllers 40 to the controller source wafer to provide a component 36. In step 330 component 36 is embedded in or on flexible banknote 20 or in or on a ribbon 70 or thread. Controllers 40 (and power convertors 64) are electrically connected to the one or more of the plurality of inorganic light-emitting diodes 30 and to a power input connection 50 in step 160. In embodiments in which power source 60 is provided on flexible banknote 20 external to component substrate 38 and component 36, the electrical connections (step 170) can be made after power source 60 is disposed on the ribbon 70 (in step 160, FIG. 28). In FIG. 29, power source 60 is disposed on or in component 36 (e.g., on component substrate 38) and the electrical connections can be made, for example by photolithographic methods and materials, before disposing component 36 on the ribbon 70 (or flexible banknote 20) in step 330, for example by micro-transfer printing components 36 from the component source wafer onto the ribbon 70 (or flexible banknote 20). Once components 36 are disposed in or on the ribbon 70, the ribbon 70 can be integrated into flexible banknote 20 in step 180.

Embodiments of the present disclosure, and as illustrated in FIGS. 19 and 27, provide power to hybrid currency banknote 10 by pressing or squeezing a power source 60, for example by a finger, to provide power to iLEDs 30, causing iLEDs 30 to emit light 88. Light 88 is emitted remotely from power source 60 and remotely from the location of the pressing. Either electrical power or light can be transmitted from power source 60 (e.g., from the location of pressing) to the light emission location on hybrid currency banknote 10 by wires 52 or light pipes 32 (light guides 32), respectively. In some embodiments, such as those illustrated in FIGS. 22 and 23, power source 60 and iLEDs 30 are disposed together on a relatively small common component substrate 38 and thus an object used to press or squeeze power source 60 (e.g., a finger) obscures light 88 emitted from iLEDs 30. In some such embodiments, controller 40 (e.g., power convertor 64 and an electrically connected array of capacitors 67) can accumulate electrical power and delay light 88 output from light-emitting diodes 30 until the pressing or squeezing object is removed and no longer obscures light 88 emitted from iLEDs 30, allowing a user to view light 88 emitted by iLEDs 30. Thus, in some embodiments, hybrid document 10 (e.g., hybrid currency banknote 10) is constructed to emit light 88 immediately on activation (e.g., pressing) of power source 60 and, in some embodiments, hybrid document 10 (e.g., hybrid currency banknote 10) is constructed to emit light 88 after a short period of delay after activation (e.g., pressing) of power source 60 (e.g., within two seconds, within one second, within one half second, or within one tenth second).

According to some embodiments of the present disclosure, power source 60 and light-emitting diodes 30 are provided together on a relatively small common component substrate 38 without obscuring light 88 output from iLEDs 30 when power source 60 is activated. For example, embodiments relying on photovoltaic or other electromagnetic sources or relying on electrical or magnetic fields can accumulate electrical power and cause iLEDs 30 to emit light without mechanical stimulation by an obscuring object. Embodiments relying on mechanical stimulation, such as pushing, pulling, stretching, flapping, or waving hybrid document 10 or providing other rapid movement, for example along the longest dimension of hybrid document 10 or in a direction perpendicular to a surface of hybrid document 10, can also provide power without obscuring iLEDs 30. Such embodiments can be made to immediately emit light 88 without delay, making operating hybrid document 10 more responsive and intuitive and thereby increasing user satisfaction.

According to some embodiments of the present disclosure and as illustrated in FIGS. 22 and 30-31B, a hybrid document 10 comprises a document 20 and a power component 62 disposed on or in document 20. Power component 62 comprises a power support 74 and a piezoelectric cantilever 72 extending from power support 74. Piezoelectric cantilever 72 comprises piezoelectric material 71, a first electrode 54 on a first side of piezoelectric material 71, and a second electrode 56 on a second side of piezoelectric material 71 opposite the first side. Piezoelectric cantilever 72 is affixed at one end to power support 74 and an opposite end of piezoelectric cantilever 72 projects over document 20 and is free to move, for example to mechanically oscillate in an oscillation direction 78 perpendicular to a document surface 24 of a document substrate of document 20.

Piezoelectric material 71 can comprise (K, NA)NbO$_3$ (KNN) or lead zirconate titanate (PZT) or another piezoelectric material 71, for example having a thickness from 0.5 microns to 2 microns, that can be used to generate electrical power in response to mechanical stimulation (e.g., physical motion). The electrical power is transmitted by first and second electrodes 54, 56 and transmitted (e.g., by electrically connected wires 52) to controller 40 or iLED(s) 30, or both. First and second electrodes 54, 56 can be a patterned metal, metal alloy, or can comprise layers of metal, for example 100 nm-500 nm of Ti/Au. Controller 40 can be an integrated circuit (e.g., a silicon CMOS integrated circuit). Controller 40 can be an integrated circuit or can be a simple circuit comprising one or more of a diode, rectifier, and bridge circuit, with or without capacitor(s) 67. Controller 40 and capacitor(s) 67 can receive and control the generated electrical power from power component 62 and cause inorganic light-emitting diode(s) 30 to emit light.

Capacitor(s) 67 can comprise or be a same material as piezoelectric cantilever 72, for example comprising first and second electrodes 54, 56 on either side of piezoelectric material 71 provided in common layer(s) with piezoelectric cantilever 72. For example, in some embodiments, piezoelectric material 71 that is used for piezoelectric cantilever 72 can be used for the dielectric in capacitor(s) 67. Thus, manufacturing costs can be reduced by providing capacitor(s) 67, portion(s) thereof, and piezoelectric cantilever 72 in common deposition and patterning steps (e.g., a common patterned photolithographic deposition). Additionally, in some embodiments, terminals for capacitor(s) 67 can be formed in common deposition and patterning steps with first and second electrodes 54, 56. In some embodiments, capacitor(s) 67 can use different materials from piezoelectric cantilever 72, for example using a different dielectric material formed in a different patterned deposition step.

Capacitor(s) 67 can have an area of 50×50 to 200×200 microns squared. iLEDs 30 can be horizontal or vertical LEDs, such as inorganic light-emitting diodes 30, and can have a size of 8×15 microns to 50×80 microns or larger. Power component 62, controller 40, iLED(s) 30, and, optionally, capacitor(s) 67, are at least a portion of (e.g., all of) a circuit 42 that emits light from iLED 30 in response to power received from (e.g., and generated by) power component 62. Other components can be included in circuit 42 beyond power component 62, controller 40, light-emitting diode(s) 30, and capacitor(s) 67, for example if more complex control or power generation, management, or distribution is desired.

Document 20 can have a document substrate with a document surface 24 and circuit 42 can be disposed on document surface 24, iLEDs 30 can be disposed on document surface 24, power component 62 can be disposed on document surface 24, controller 40 can be disposed on document surface 24, or capacitor(s) 67 can be disposed on document surface 24. Document 20 can be flexible and can be a banknote, for example made from a paper, such as a cotton fiber paper, or polymer material or a combination thereof. Piezoelectric cantilever 72 can extend over document 20 (e.g., over document surface 24) or can extend within document 20 in a cantilever plane 76 that is non-orthogonal to document surface 24 of document 20 and piezoelectric cantilever 72 can be operable to oscillate in a direction non-parallel to cantilever plane 76. In some embodiments, cantilever plane 76 can be substantially parallel to document surface 24 of document 20 and piezoelectric cantilever 72 is operable to oscillate in a direction substantially orthogonal to cantilever plane 76. By substantially parallel or substantially orthogonal (e.g., perpendicular) is meant as preferably intended or desired (e.g., within 20%, within 10%, within 5%, within 2%, within 1%, or within the capabilities of a manufacturing process). For example, cantilever plane 76 can be intended or desired to be parallel to document surface 24 and can be intended or desired to oscillate in a direction perpendicular to document surface 24 even if some slight deviation exists in the final manufactured product.

According to some embodiments, hybrid document 10 comprises a component 36 comprising a component substrate 38 disposed on document 20 and power component 62, controller 40, and inorganic light-emitting diode(s) 30 are disposed on or in component substrate 38 of component 36. For example, component substrate 38 can be a semiconductor (such as silicon) substrate, a polymeric substrate, or an inorganic dielectric substrate. Component substrate 38 can have a length or width (or both) of, for example no greater than 1 mm, no greater than 500 microns, no greater than 250 microns, no greater than 100 microns, no greater than 50 microns. Component substrate 38 can have a thickness no greater than 50 microns, no greater than 20 microns, no greater than 15 microns, no greater than 12 microns, no greater than 10 microns, and no greater than 5 microns. In some embodiments, component substrate has a thickness from 10 microns to 15 microns, e.g., 12 microns. According to some embodiments, a hybrid document 10 includes a plurality of components 36 each comprising a respective component substrate 38 and a respective circuit 42, for example that includes a respective controller 40, respective power component 62, and one or more respective light-emitting diodes 30. Each circuit 42 is disposed on a different component substrate 38 and each component 36 and component substrate 38 is independent and separate from any other component 36 and component substrate 38 and can operate or function independently, for example respective power components 62 can be activated (e.g., pressed) independently based on components 36 being spatially distributed over document 20. In some embodiments, respective independent and spatially separated power components 62 can be activated at the same time, for example by a motion of hybrid document 10. Each separate and independent component substrate 38 with a corresponding circuit 42 disposed therein or thereon (comprising an individual and separate component 36) can be disposed on document surface 24 or otherwise disposed in or on document 20, for example in a defined area, randomly over a defined area, or in a pattern forming a graphic in a defined area.

Figure 30:
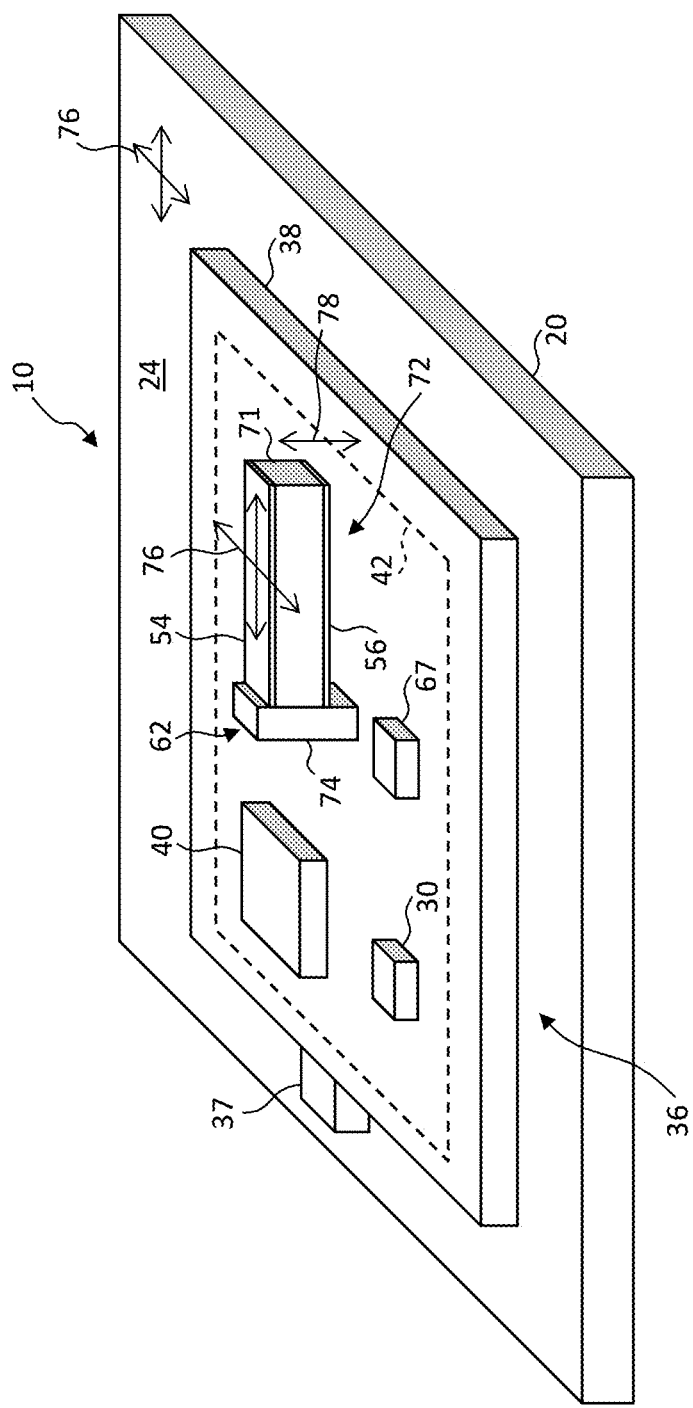
FIG. 30 is a schematic perspective of a component disposed on a banknote according to illustrative embodiments of the present disclosure.

Certain embodiments, such as those illustrated in FIG. 30, comprise a single component 36 that can be disposed, for example by micro-transfer printing, onto document 20, for example on document surface 24. Documents 20 can have a locally non-planar, three-dimensional topographical structure (e.g., such as in a typical cloth or paper structure, which is locally rough though macroscopically planar) and components 36 can be disposed anywhere on document surface 24 or in document 20, for example on or in security structures (e.g., threads, ribbons 70, cavities, foils, seals, stamps, or patches) that are disposed on or in (e.g., integrated with, embedded in, affixed to, or applied to) document 20, and not necessarily on or directly on document surface 24. Thus, in some embodiments, components 36, including power components 62, light-emitting diodes 30, controllers 40, and capacitor(s) 67, if present, are disposed on or in security structures (e.g., in a one to one correspondence or several to one correspondence, for example spatially distributed over a security structure) prior to disposing the security structure on or in document 10, which may simplify manufacturing processes or align with current manufacturing processes such that significant retooling is not necessary.

Figure 31A:
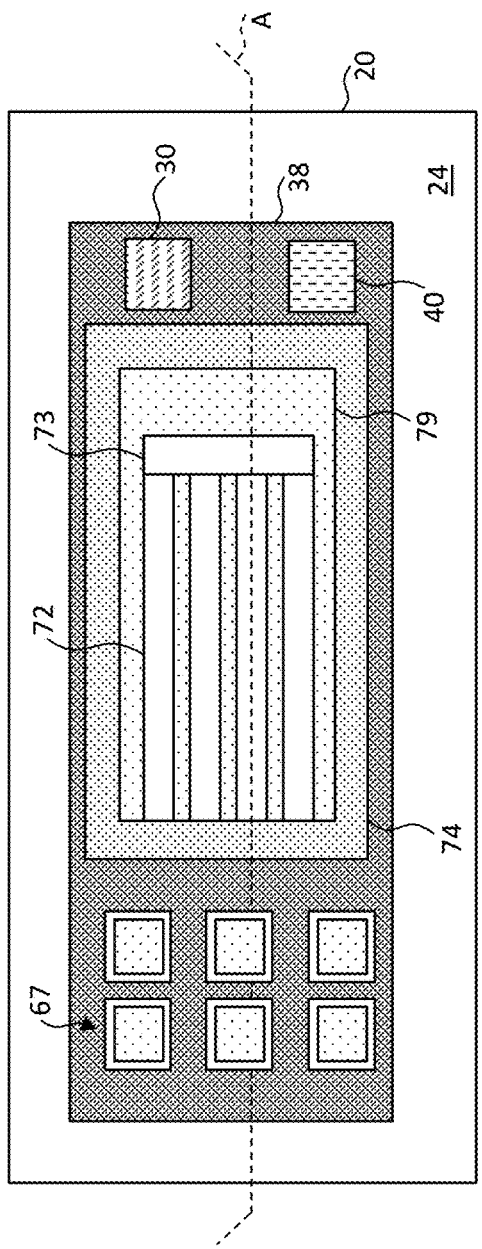
FIG. 31A is a schematic cut-away plan view of a component disposed on a banknote according to illustrative embodiments of the present disclosure.
Figure 31B:
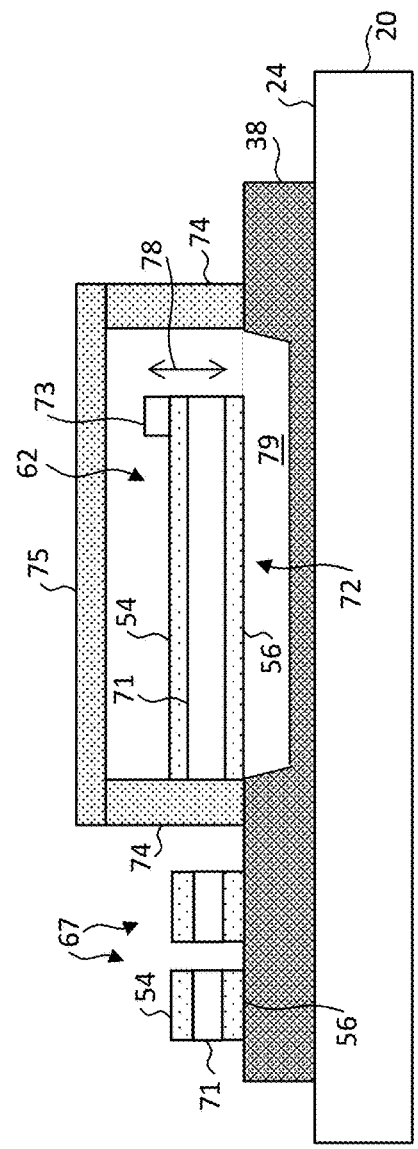
FIG. 31B is a schematic cross section of a component disposed on a banknote taken across cross section line A of FIG. 31A according to illustrative embodiments of the present disclosure.
Figure 32:
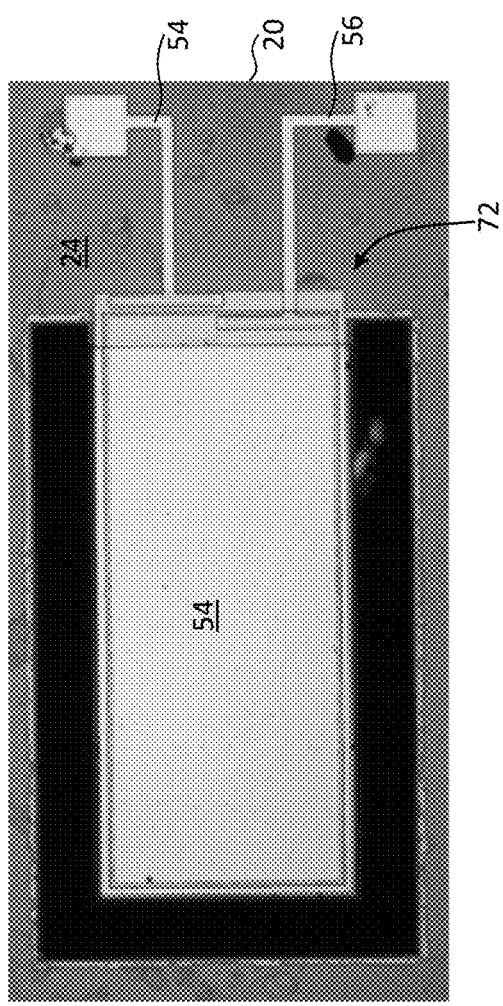
FIG. 32 is a micrograph of a power component according to illustrative embodiments of the present disclosure.

Piezoelectric cantilever 72 can be a single cantilever (e.g., as shown in FIG. 30 and FIG. 32 discussed subsequently) or can comprise separated cantilever fingers and (optionally) a mass 73 disposed thereon at an end of the fingers opposite power support 74 to which the fingers of piezoelectric cantilever 72 are affixed (e.g., as shown in FIGS. 31A-B). The use of fingers of a predetermined length and width and a mass 73 enables the stiffness and mass of piezoelectric cantilever 72 to be adjusted to a desired flexibility and oscillation frequency corresponding to a desired method of operation. Mass 73 can comprise a part of piezoelectric cantilever 72 or can be separate and can comprise similar material and structure as the remainder of piezoelectric cantilever 72 or a different material and structure, e.g., a dielectric such as silicon dioxide or silicon nitride. Each finger can have a separate mass 73 disposed on an end thereof or a common mass 73 can be disposed across some or all fingers at common ends thereof.

As shown in FIG. 31B (and in FIG. 31A), according to some embodiments of the present disclosure, power component 62 is disposed over a cavity 79 in component substrate 38. Cavity 79 can provide space for piezoelectric cantilever 72 to oscillate in oscillation direction 78 while remaining protected from the ambient environment.

According to some embodiments, component 36 comprises a component tether 37, for example extending from a component substrate 38 thereof, controller 40 comprises a controller tether 65, iLED 30 comprises an LED tether 31, capacitor 67 can have a capacitor tether (not shown in the Figures), or any one or combination of these. In some embodiments, any one or more of controller 40, iLED 30, and capacitor 67 can be micro-transfer printed from a corresponding source wafer to component substrate 38. Furthermore, component substrate 38 or component 36 can be micro-transfer printed from a component source wafer 39 to document 20, as discussed further below. Thus, if present, any one or more of component tether 37, controller tether 65, LED tether 31, or a capacitor tether, can be a fractured or separated tether.

Figure 33:
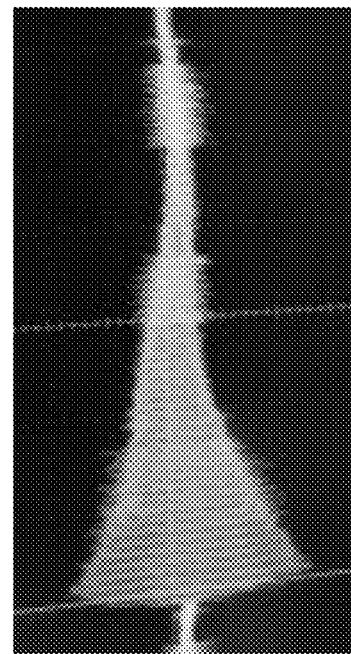
FIG. 33 is a representation of an electrical signal corresponding to the power output from a power component according to illustrative embodiments of the present disclosure.

As shown in FIG. 32, according to some embodiments of the present disclosure, a piezoelectric cantilever 72 with piezoelectric material 71 and first and second electrodes 54, 56 was constructed. According to some embodiments, mechanically stimulated piezoelectric cantilever 72 generates electrical power that is transmitted from first and second electrodes 54, 56. An example of a piezoelectric cantilever 72 operating to generate power is shown by the oscilloscope traces of FIG. 33 showing output voltage versus time from initial mechanical stimulation for an embodiment of piezoelectric cantilever 72. According to some embodiments, constructed piezoelectric cantilevers 72 with lengths and widths no greater than 100-1000 microns can respond to suitable mechanical stimulation (e.g., by mechanical movement of power component 62) by providing electrical current at 1-50 mV (e.g., 2-20 mV). By using a piezoelectric cantilever 72 in particular, as opposed to other arrangements of piezoelectric power generation components, mechanical deformation that causes power to be generated due to voltage can be imparted without having to directly physically interact with piezoelectric cantilever 72. That is, mechanical movement of hybrid document 10, such as by rapid movement followed by movement cessation of hybrid document 10, can be sufficient to cause deformation of the cantilever that leads to a short term oscillation of the cantilever that can generate sufficient power to operate light-emitting diode 30. It is thus not necessary to directly deform piezoelectric cantilever 72, which could be practically difficult (e.g., to apply force in a very precise location) or even damage the cantilever (e.g., if too much force were applied). Moreover, piezoelectric cantilever 72 can be enclosed in a cavity 79 to further protect from damage while maintaining operability of the oscillation-based power generation mechanism.

In operation, hybrid document 10 with piezoelectric cantilever 72 is mechanically stimulated (e.g., physically moved), in order to cause piezoelectric cantilever 72 to move. Piezoelectric material 71 in piezoelectric cantilever 72 is mechanically stressed (e.g., by bending caused by power component 62 movement) in response to the physical movement and makes electrical power transmitted through first and second electrodes 54, 56 and provided to controller 40 and light-emitting diodes 30, and optionally capacitor(s) 67, causing iLEDs 30 to emit light 88. In some embodiments of the present disclosure, light 88 is emitted immediately, for example without a perceptible delay between the physical movement and the light emission, for example no greater than 100 milliseconds, no greater than 50 milliseconds, no greater than 1 millisecond, no greater than 500 microseconds, no greater than 100 microseconds, or no greater than 10 microseconds.

Figure 35:
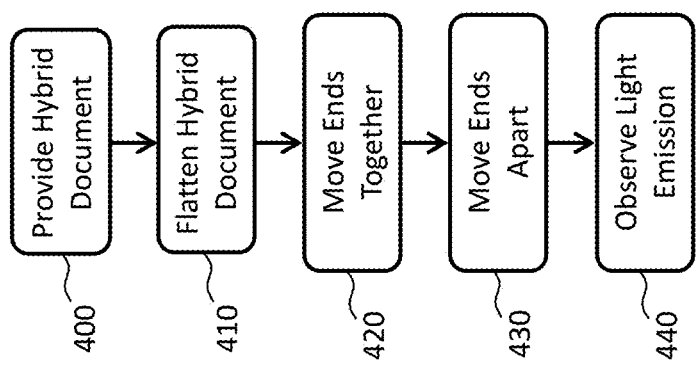
FIG. 35 is a flow diagram according to embodiments of the present disclosure.

As shown in FIGS. 34A-34C and the flow diagram of FIG. 35, according to some embodiments, a method of operating a hybrid document 10 comprises providing a flexible hybrid document 10 with opposing first and second ends in step 400, for example in a lengthwise direction longer than a width direction, grasping hybrid document 10 at the first end and at the second end (e.g., with fingers of different hands) wherein the first end is separated from the second end or separating the first end from the second end to horizontally flatten hybrid document 10 in step 410 and as shown in FIG. 34A, moving the first end and the second end closer together in a horizontal direction so that hybrid document 10 is at least partially folded or bent in a vertical direction in step 420 as shown in FIG. 34B with the movement indicated by the arrows (or in some embodiments movement in a vertical direction is downward, opposite to FIG. 34B, not shown), moving the first end and the second end apart in step 430, for example to flatten hybrid document 10 in a horizontal direction again as shown in FIG. 34C with the movement indicated by the arrows, thereby causing component 36 to move in a vertical direction and mechanically stimulating piezoelectric cantilever 72, causing iLED 30 to emit light 88, and in step 440 observing light 88. Light 88 can also be emitted after step 420 but can be more difficult to observe on a folded document surface 24 than a flatted document surface 24 in step 440. In some embodiments, grasping comprises grasping with one or more fingers of one or more hands. In some embodiments, light 88 is emitted with no perceptible delay between moving the first end and the second end apart (in step 430) and light 88 emission in step 440. An immediately observed light emission is enabled by grasping hybrid document 10 at locations spatially remote from a location of light-emitting diode(s) 30, so that for example light 88 emitted from iLED 30 is not obscured by grasping or pressing fingers.

Hybrid document 10 can be flattened in step 410 in a substantially or partially horizontal plane. By moving first and second ends together in step 420, a central portion 26 of hybrid document 10 is moved substantially or partially vertically (e.g., up as shown in FIG. 34B or down). By disposing component 36 in a central portion 26 of hybrid document 10 closer to a center of hybrid document 10 than to an edge of hybrid document 10, component 36 is likewise moved in a vertical direction. By locating cantilever plane substantially parallel to document surface 24, piezoelectric cantilever 72 can likewise move in a vertical direction so that when the first and second ends of hybrid document 10 are moved apart in step 430, piezoelectric cantilever 72 moves vertically (e.g., thereby causing oscillation), generating electrical power that is processed and controlled to cause iLED(s) 30 to emit light 88. Horizontal and vertical directions are arbitrary designations; hybrid document 10 can be grasped in any orientation, so long as the movement of the ends causes power component 62 to accelerate or decelerate.

Step 420 shown in FIG. 34B can be performed relatively slowly and step 430 shown in FIG. 34C can be performed relatively rapidly. Thus, piezoelectric cantilever 72 can be mostly at rest after step 420 but, after the sudden motion of step 430, piezoelectric cantilever 72 is rapidly accelerated and, according to Newton's first law of motion, piezoelectric cantilever 72 will resist the motion with respect to power support 74 and will therefore bend, compressing piezoelectric material 71 and generating electrical power. Furthermore, the sudden cessation of motion after step 430 will cause further piezoelectric cantilever 72 motion as power support 74 suddenly decelerates. This piezoelectric cantilever 72 motion can be an oscillation that continues to move piezoelectric cantilever 72 after step 430 and generates additional electrical power even after step 430 is complete.

Figure 36E:
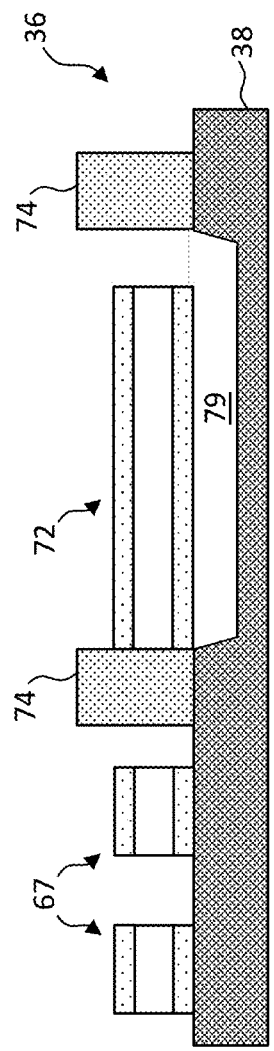
Figure 36F:
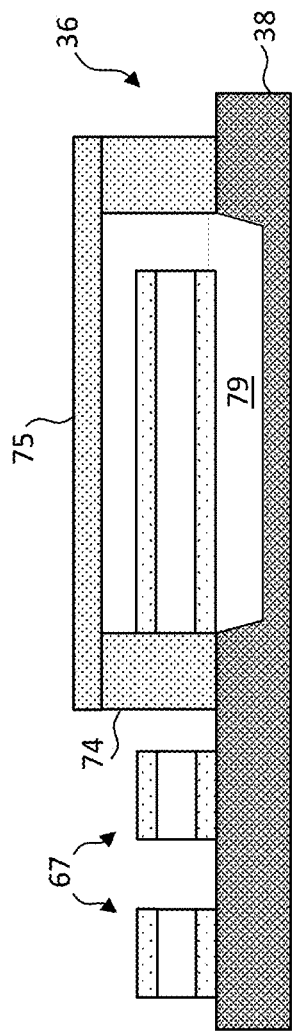
Figure 36G:
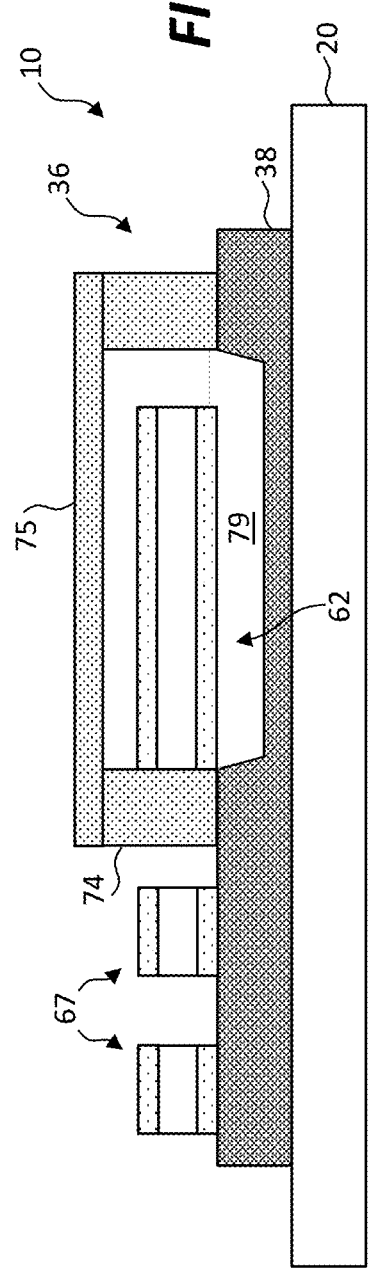
Figure 37:
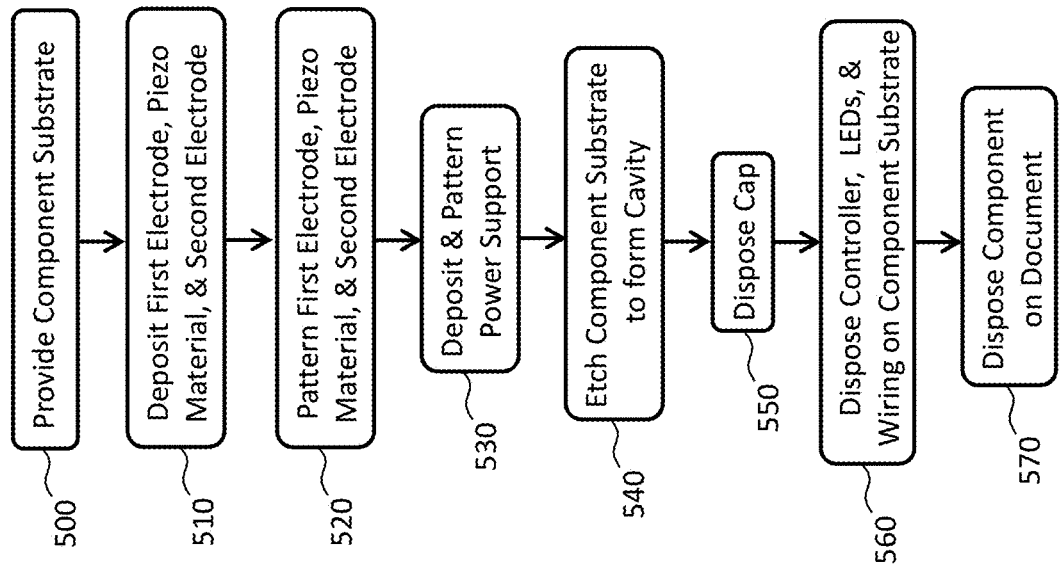

According to some embodiments of the present disclosure and as illustrated in FIGS. 36A-36G and the flow diagram of FIG. 37, a method of making hybrid document 10 comprises providing a component substrate 38 on a component source wafer 39 in step 500 and as shown in FIG. 36A; depositing in step 510 as shown in FIG. 36B and patterning in step 520 as shown in FIG. 36C, a first electrode 54, piezoelectric material 71, and a second electrode 56 on component substrate 38; depositing and patterning a power support 74 in contact with piezoelectric material 71 on component substrate 38 in step 530 as shown in FIG. 36D; releasing first electrode 54, piezoelectric material 71, and second electrode 56 from component substrate 38 in step 540 and as shown in FIG. 3E to form a released piezoelectric cantilever 72 (e.g., by pattern-wise etching component substrate 38 with an etchant such as tetramethylammonium hydroxide (TMAH) or potassium hydroxide (KOH) at an elevated temperature such as 50-100 degrees C., 60-90 degrees C. or 70-80 degrees C.); and capping released piezoelectric cantilever 72 in step 550 with cap 75 and as shown in FIG. 36F. In some embodiments, capacitor(s) 67 are formed as part of the construction process for piezoelectric cantilever 72 on component substrate 38 in common deposition and patterning steps and with common materials. In some embodiments, rather than forming capacitor(s) 67 as part of the construction process for piezoelectric cantilever 72, capacitor(s) 67 are separately formed on component substrate 38 or disposed on component substrate 38, for example by microtransfer printing. iLEDs 30 and controller 40 can be microtransfer printed to component substrate 38 and electrically connected using photolithographic processes to form component 36 in step 560. Completed component 36 can be further processed, for example component substrate 38 can be thinned (e.g., by grinding, etching, or chemical polishing) and multiple components 36 on component substrate 38 can be singulated, e.g., by dicing, diamond cutting, or laser cutting, such that they are separate and individual, and disposed in step 570 on one or more documents 20 (e.g., document surface 24) to form hybrid document(s) 10, as shown in FIG. 36G (where a single component 36 is on single document 20). Component 36 can be disposed on (e.g., adhered to) document 20 or to a security structure (e.g., ribbon 70) and the security structure can be disposed on or in (e.g., adhered to) document 20, for example during a process of forming document 20 (e.g., a papermaking process).

Additional layers and structures can be provided for component 36, for example dielectric layers electrically insulating first or second electrodes 54, 56 from component substrate 38 and can remain on first or second electrodes 54, 56 after under-etching piezoelectric cantilever 72 from component substrate 38 to form cavity 79 (e.g., in step 540). Cap 75 can be provided to enclose cavity 79. Cap 75 can be disposed on (e.g., adhered to) power support 74 and, if present, one or more other side walls disposed by power support 74 (e.g., as shown in FIGS. 36F-G). Cap 75 can include one or more side walls (not shown). Component substrate 38 can be a semiconductor-on-insulator (SOI) wafer with a bulk substrate, a buried oxide layer, and an epitaxial layer. A dielectric layer can be disposed on the epitaxial layer, the structures of FIGS. 36B-36D formed on the dielectric layer, and the epitaxial layer etched to form cavity 79. The SOI component substrate 38 can then be processed as described to disposed component 36 on document 20.

In some embodiments and as illustrated in FIGS. 40A-40F and FIGS. 38 and 39, piezoelectric cantilever 72 (and optionally capacitor(s) 67) are transferred to an intermediate substrate 39 (e.g., a silicon, inorganic dielectric, or dielectric substrate) and iLEDs 30 and controller 40 (and optionally capacitor(s) 67) disposed and electrically connected on intermediate substrate 39. As shown in FIG. 40A, an encapsulation layer 58 (e.g., silicon dioxide or silicon nitride) providing a tether 37 and anchor 35 is disposed over cap 75 and any other elements of component 36 present on component substrate 38. Component substrate 38 is then etched to release the elements of component 36 present on component substrate 38 (e.g., piezoelectric cantilever 72), as shown in FIG. 40B.

An intermediate substrate 39 (e.g., an SOI wafer with a bulk layer 59A, a buried oxide layer 59B, and an epitaxial layer 50C) is provided with a cavity 79 (e.g., by etching epitaxial layer 59C) as shown in FIG. 40C and the release elements are transfer printed to an intermediate substrate 39 (as shown in FIG. 40D and step 555 of FIG. 38). Any further processing of component 36 is performed (e.g., disposing any further components such as one or more of controller 40 and iLED(s) 30 and wires 52) in step 565 and the completed component 36 is under-etched to release it from intermediate substrate 59, as shown in FIG. 40E. The buried oxide layer can provide an etch stop for an anisotropic etch process in bulk layer 59A that releases component 36 from bulk layer 59A. Thus, piezoelectric cantilever 72 can be first transfer printed from a source wafer to an intermediate wafer 59. Released completed component 36 can then be disposed in a second transfer step onto document 20 or a security structure (e.g., ribbon 70 or thread) subsequently incorporated into document 20, for example by micro-transfer printing and as shown in FIG. 40F. When a process is used to release and print component 36 (e.g., portion thereof), from component substrate 38 and dispose (e.g., print) component 36 (e.g., portion thereof) on intermediate substrate 59, intermediate substrate 59 can itself act as a component substrate 38. In some embodiments, a portion of intermediate substrate 59 (e.g., a bulk layer 59A) is separated by laser ablation or grinding to reduce a thickness of component 36 making it suitable for disposing on or in document 20. As shown in FIG. 39, in some embodiments, cap 75 can be disposed in step 550 after component 36 is disposed on intermediate substrate 38.

By providing intermediate substrate 59 and etching it to release component 36, thin components 36 can be provided without back grinding or etching component substrate 38, reducing manufacturing costs and risk of damage to component 36.

According to some embodiments of the present disclosure and as shown in FIG. 25, component 36 comprises a plurality of power components 62. The power components 62 can be electrically connected in parallel to increase the current available to component 36 or can be electrically connected in series to increase the voltage available to component 36, for example as shown in FIG. 25. Similarly, fingers of piezoelectric cantilever 72 can be electrically connected in series or in parallel (or connected in series within groups that are then connected to each other in parallel) for the same reasons. iLEDs 30 can operate with currents of a few micro-amps and voltages of 0.5 to 5 volts, for example 2.2 volts and 5 micro-amps. Thus, by suitably electrically connecting piezoelectric cantilever 72 fingers and multiple power components 62, with or without capacitor(s) 67, electrical power of the appropriate voltage and current can be provided to controller 40 and iLEDs 30.

As shown in FIG. 31A and FIG. 41A-41C, embodiments of the present disclosure provide a piezoelectric power source 60 comprising one or more power components 62. In some embodiments, power component 62 is formed on a component substrate 38 that is also a component source wafer 39 on which power component 62 operates. In such embodiments, power component 62 is not micro-transfer printed and has no need of component tethers 37. Other devices such as power convertor 64, LEDs 30, or controller 40 can also be provided on component substrate 38 (e.g., by micro-transfer printing) and electrically connected to power component 62, for example using photolithographic methods and materials. According to some embodiments of the present disclosure, power component 62 is printed (e.g., micro-transfer printed) from component source wafer 39 to a system substrate, either with or without component substrate 38. In some such cases, power component 62 can comprise a component tether 37, or be physically attached to a component tether 37, that is fractured or separated as a consequence of micro-transfer printing from component source wafer 39 to the system substrate. A system substrate can be any useful target or destination substrate, for example an intermediate substrate 59 or document 20 (e.g., a security paper or banknote 20). Embodiments of the present disclosure enable micro-assembled systems, for example a micro-system comprising micro-components (e.g., iLEDs 30, controller 40, and capacitors 67), that receive electrical power from micro-assembled piezoelectric micro-devices (power components 62) in response to mechanical perturbation (e.g., shaking, vibrating, or accelerating power component 62) of the micro-assembled system.

Figure 41A:
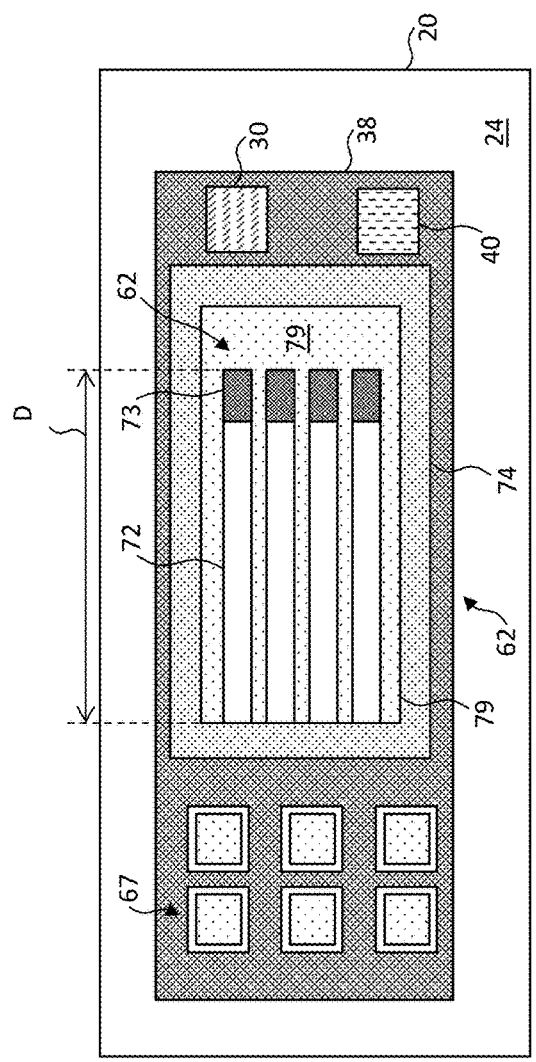
FIGS. 41A-41C are plan views of piezoelectric power components comprising multiple piezoelectric cantilevers extending in a common direction and having various mass configurations according to illustrative embodiments of the present disclosure.
Figure 41B:
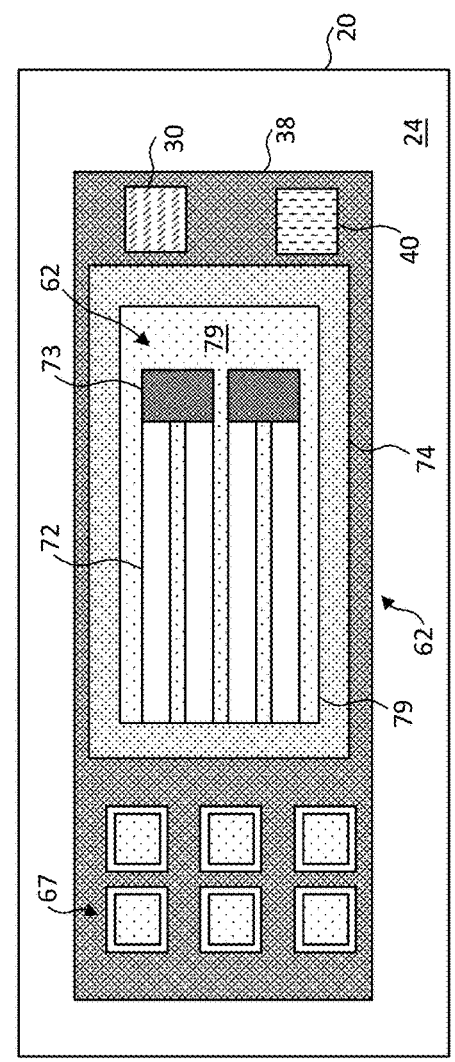
Figure 41C:
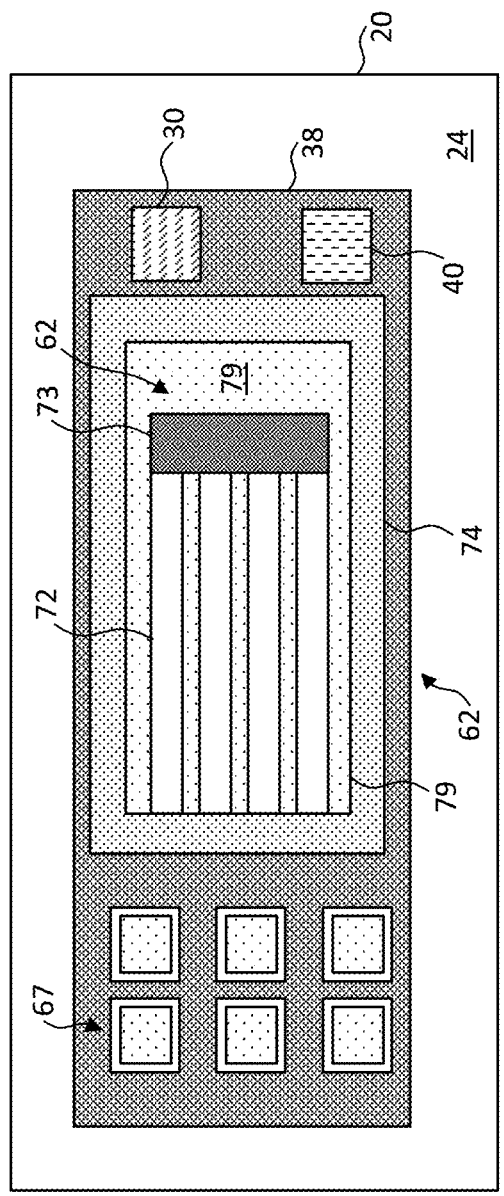

According to some embodiments of the present disclosure and as illustrated in FIGS. 41A-41C, a piezoelectric power component 62 comprises a power support 74 and multiple piezoelectric cantilevers 72 extending from power support 74 over cavity 79 on or in a component substrate 38 disposed on document surface 24 of document 20 with one or more additional electrically connected components, such as LEDs 30, controller 40 and capacitors 67. As illustrated in FIGS. 31A and 41A, piezoelectric cantilevers 72 can comprise multiple separate cantilever piezoelectric fingers (e.g., cantilever piezoelectric fingers each of which individually produces electrical power when mechanically stressed) that together form a piezoelectric power component 62. Thus, according to embodiments of the present disclosure, each cantilever finger can be an individual piezoelectric cantilever 72 (for example when each finger is physically separate) and multiple piezoelectric cantilevers 72 can be multiple piezoelectric fingers.

Piezoelectric cantilevers 72 can extend different lengths or distances from power support 74. According to some embodiments of the present disclosure, at least two of piezoelectric cantilevers 72 can extend a common distance D from power support 74 and can be spatially disposed in parallel. According to some embodiments of the present disclosure, all of piezoelectric cantilevers 72 extend a common distance D from power support 74 so that each piezoelectric cantilever 72 has the same common length, for example as shown in FIG. 41A. Each piezoelectric cantilever 72 can comprise a layer of piezoelectric material 71, a first electrode 54 disposed on a first side of piezoelectric material 71 and a second electrode 56 on a second side of piezoelectric material 71 opposite the first side. (In some embodiments, first and second electrodes 54, 56 are arbitrarily designated to correspond to top and bottom electrodes on piezoelectric material 71 and the names could be exchanged without changing the nature of the structure.) According to some embodiments, the layer of piezoelectric material 71 can extend the length of piezoelectric cantilever 72, for example as shown in FIG. 31B. According to some embodiments, the layer of piezoelectric material 71 can extend less than the entire length of piezoelectric cantilever 72, for example as shown in FIGS. 42A-43B. Similarly, according to some embodiments, first and second electrodes 54, 56 can extend the length of piezoelectric cantilever 72, for example as shown in FIG. 31B or, according to some embodiments, one or more of first and second electrodes 54, 56 can extend less than the entire length of piezoelectric cantilever 72, for example as shown in FIGS. 42A-43B. In some embodiments, where one or more of first and second electrodes 54, 56 extend less than the entire length of piezoelectric cantilever 72, electrical power is only collected from portions of piezoelectric material 71 where first and second electrodes 54, 56 are disposed, even where piezoelectric material 71 extends the length of piezoelectric cantilevers 72. For example, if one or more of first electrode 54 and second electrode 56 are not present over or near a portion of piezoelectric material 71 then power cannot be collected from that portion. In some embodiments, for example as shown in FIGS. 42C-42F, a portion of no more than two of piezoelectric layer 71, first electrode 54, and second electrode 56 are comprised in masses 73 (for each of piezoelectric cantilevers 74A, 74B), thereby inhibiting collection of power from masses 73. In some embodiments, a mass 73 is inert in that power cannot be collected from it. In some embodiments, a mass 73 is physically separate and operative (such that power can be collected from it), for example in embodiments according to FIGS. 42C-D if masses 73 (e.g., and first and second electrodes 54, 56) were electrically connected to provide power to an electrical load.

As illustrated in FIG. 14, according to some embodiments, at least two piezoelectric cantilevers 72 of the multiple piezoelectric cantilevers 72 (e.g., multiple piezoelectric fingers) are electrically connected in series. As also illustrated in FIG. 14, in some embodiments at least two piezoelectric cantilevers 72 of the multiple piezoelectric cantilevers 72 are electrically connected in parallel. According to some embodiments, some of the multiple piezoelectric cantilevers 72 are electrically connected in series and some in parallel. Where the multiple piezoelectric cantilevers 72 are electrically connected together they also make up a common power component 62 or power source 60. By providing multiple piezoelectric cantilevers 72 electrically connected in series, in parallel, or in both, an electrical power component 62 or power source 60 having the desired voltage and current can be provided. In particular, because piezoelectric material 71 can provide relatively small voltages, e.g., microvolts or millivolts, piezoelectric electrical power components 62 connected in series can provide electrical power at voltages typically used or easily converted for use in electronic systems (e.g., 1 to 5 volts). Thus, separate piezoelectric cantilevers 72 electrically connected together rather than a single, larger piezoelectric cantilever 72 can produce electrical power that is easier to use or convert for use in electrical systems, even if the net power produced by the single, larger piezoelectric cantilever 72 and the separate multiple piezoelectric cantilevers 72 are the same.

As shown in FIGS. 31A and 31B, a mass 73 can be provided on the end of piezoelectric cantilevers 72. According to some embodiments, mass 73 is a portion of piezoelectric material 71 at the distal end of piezoelectric cantilevers 72 opposite the location of a physical connection between piezoelectric cantilever 72 and power support 74 (the proximal end). According to some embodiments, mass 73 comprises additional material disposed on piezoelectric material 71 at the end of piezoelectric cantilevers 72 opposite the location of a physical connection between piezoelectric cantilever 72 and power support 74, as shown in FIG. 31B. The additional material can be any material suitably disposed on the piezoelectric material 71 or first or second electrodes 54, 56, for example a dielectric material. Mass 73 can be disposed on a top side of piezoelectric material 71 (as shown in FIG. 31B) or a bottom side of piezoelectric material 71 (not shown in the Figures). Where first and second electrodes 54, 56 extend the entire length of piezoelectric cantilevers 72, mass 73 can be disposed on first or second electrodes 54, 56 (as shown in FIG. 31B on first electrode 54). Where first and second electrodes 54, 56 extend less than the entire length of piezoelectric cantilevers 72, mass 73 can be disposed on piezoelectric material 71. Mass 73 can be disposed directly on cantilever support layer 77. Mass 73 can be disposed adjacent to piezoelectric layer 71 (e.g., and physically separate from piezoelectric layer 71). Mass 73 can be disposed nearer to a distal end of cantilever support layer 77 than a portion of piezoelectric layer 71, for example as illustrated in FIGS. 42A-42F. Mass 73 can be physically separate from at a least a portion of (e.g., all of) one or more of (e.g., each of) piezoelectric layer 71, first electrode 54, and second electrode 56. Mass 73 can be or comprise a dielectric (e.g., a non-piezoelectric dielectric).

As illustrated in FIG. 41A, an individual, separate mass 73 can be provided on the end of each piezoelectric cantilever 72 so that each piezoelectric cantilever 72 can operate (e.g., vibrate) individually and independently. According to some embodiments and as illustrated in FIG. 41B, some adjacent piezoelectric cantilevers 72 (e.g., pairs, as shown, or adjacent groups of three or four or more) piezoelectric cantilevers 72 have a single unitary mass 73 disposed thereon in common. Adjacent piezoelectric cantilevers 72 are piezoelectric cantilevers 72 that have no other piezoelectric cantilevers 72 disposed between the adjacent piezoelectric cantilevers 72. As illustrated in FIG. 41C (and FIG. 31A), a common, single unitary mass 73 is disposed on the end of all of the individual piezoelectric cantilevers 72. In some embodiments, piezoelectric cantilevers 72 with separate, individual masses 73 can oscillate and produce power independently in response to different kinds of mechanical motion; in some embodiments, piezoelectric cantilevers 72 with a single, common unitary mass 73 can oscillate and produce power together, are more mechanically robust, and can be easier to construct.

Figure 42A:
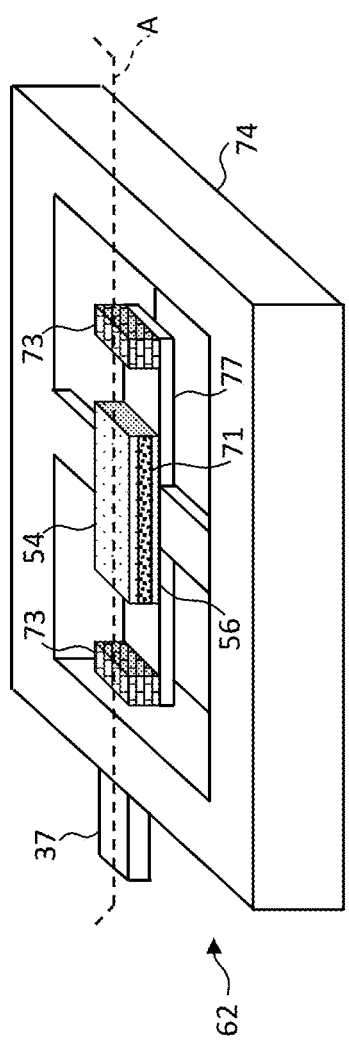
FIG. 42A is a perspective and FIG. 42B is a cross section taken along cross section line A of FIG. 42A of a piezoelectric power component comprising suspended piezoelectric cantilevers extending in opposite directions and a cap affixed to a power support, according to illustrative embodiments of the present disclosure.
Figure 42B:
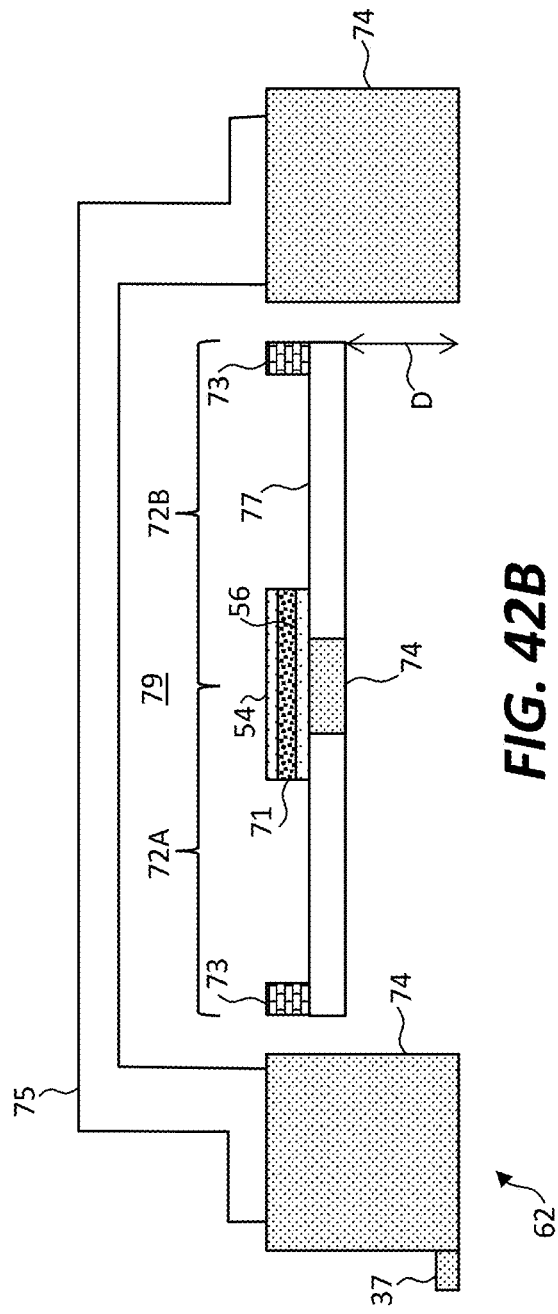
Figure 42C:
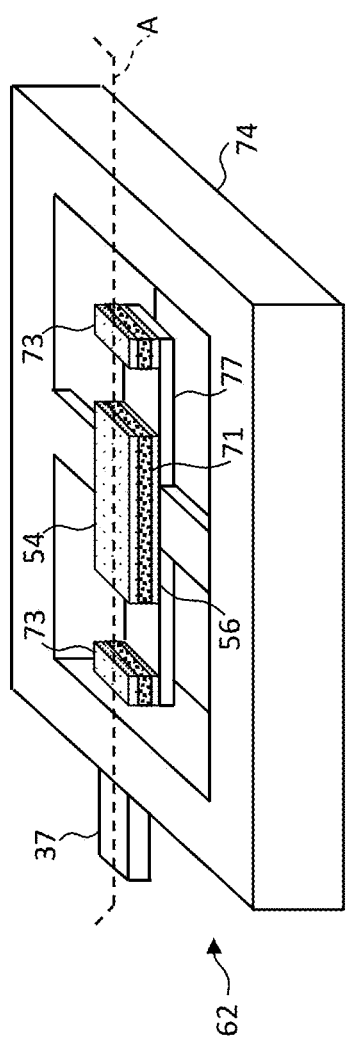
FIG. 42C is a perspective and FIG. 42D is a cross section taken across cross section line A of FIG. 42C of a piezoelectric power component comprising suspended piezoelectric cantilevers extending in opposite directions where masses are formed by patterning the piezoelectric layer, first electrode, and second electrode according to illustrative embodiments of the present disclosure.
Figure 42D:
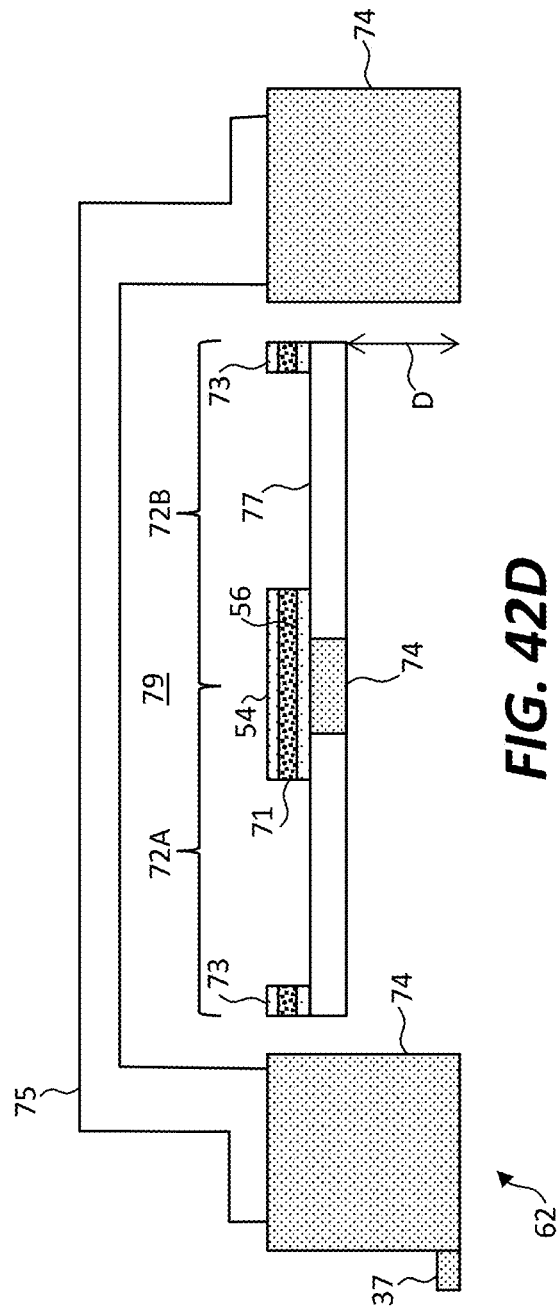
Figure 42E:
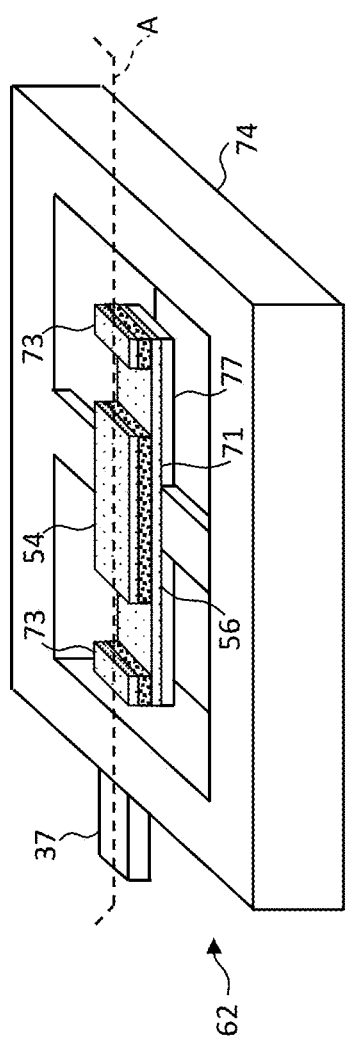
FIG. 42E is a perspective and FIG. 42F is a cross section taken across cross section line A of FIG. 42E of a piezoelectric power component comprising suspended piezoelectric cantilevers extending in opposite directions where masses are formed by patterning the piezoelectric layer and first electrode according to illustrative embodiments of the present disclosure
Figure 42F:
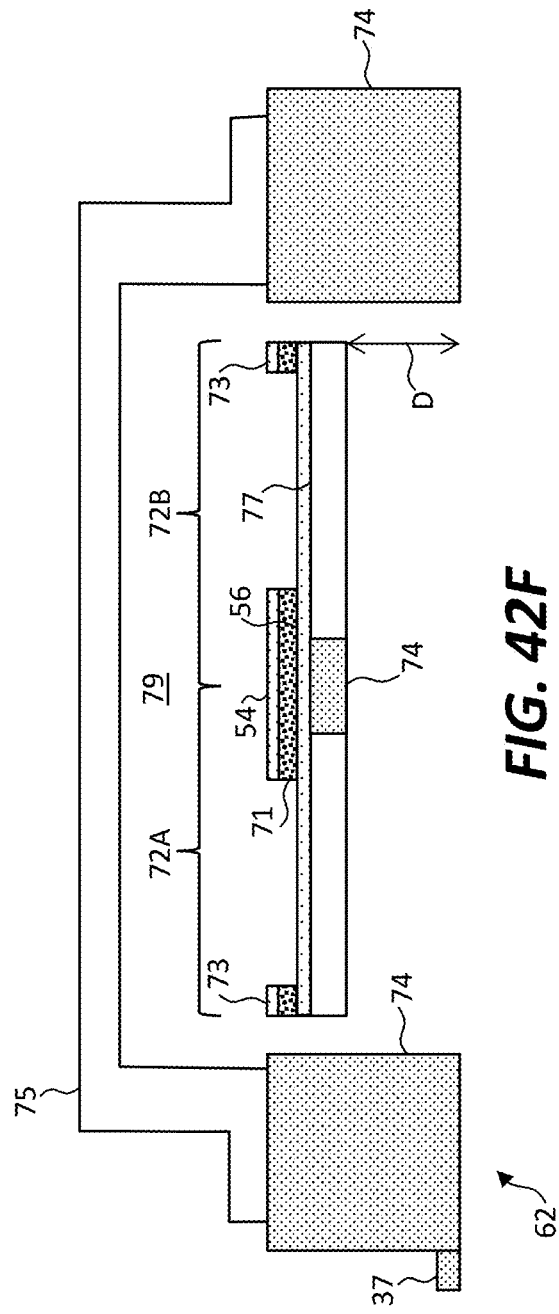

As shown in FIGS. 42A, 42B and in other Figures, piezoelectric cantilevers 72 can comprise a cantilever support layer 77 (cantilever support 77). Second (bottom) electrode 56 can be disposed on cantilever support layer 77, a layer of piezoelectric material 71 can be disposed on second electrode 56, and first (top) electrode 54 is disposed on and over piezoelectric material 71. As described herein, piezoelectric material 71 and first electrode 54 are also considered to be disposed "on" cantilever support layer 77, although not necessarily in direct contact with cantilever support layer 77. According to some embodiments, first electrode 54, piezoelectric material 71, and second electrode 56 extend less than the entire length of cantilever support layer 77, as shown in FIGS. 42A, 42B. In some embodiments, first electrode 54, piezoelectric material 71 and second electrode 56 extend the entire length of cantilever support layer 77, for example as shown in FIG. 31B. According to some embodiments, first electrode 54 and second electrode 56 extend less than the entire length of cantilever support layer 77 and piezoelectric material 71 extends farther than (beyond) first electrode 54 and second electrode 56, for example on the entire length of cantilever support layer 77. Piezoelectric material 71 that extends beyond first and second electrodes 54, 56 can act as mass 73. Piezoelectric material 71 can be patterned (optionally with one or both of first and second electrodes 54, 56 or not) to provide a physically separate mass 73, for example at a distal end of cantilever support layer 77. According to some embodiments, additional mass 73 is disposed on piezoelectric material 71 (e.g., as shown in FIG. 31B). By using piezoelectric material 71 as a mass 73, a single deposition step for piezoelectric material 71 providing both a power generating source 60 (between first and second electrodes 54, 56) and mass 73 (where piezoelectric material 71 extends beyond first and second electrodes 54, 56 and is optionally patterned), reducing manufacturing steps and complexity and reducing costs.

In some embodiments and as shown for example FIGS. 31A-32 and 41A-42A, power support 74 extends completely around piezoelectric cantilevers 72, for example in a plane corresponding to or parallel to a surface extending in the length (longest) direction of piezoelectric cantilevers 72, Power support 74 can form a polygon, for example a rectangle, around piezoelectric cantilevers 72. Piezoelectric cantilevers 72 can extend from a common side of power support 74, for example as shown in FIGS. 41A-41C. Thus, according to embodiments of the present disclosure a piezoelectric power component 62 comprises a power support 74 and a piezoelectric cantilever 72 extending from power support 74. Piezoelectric cantilever 72 comprises a layer of piezoelectric material 71, a first electrode 54 on a first side of piezoelectric material 71 and a second electrode 56 on a second side of piezoelectric material 71 opposite the first side. In some embodiments, a component tether 37 is directly or indirectly attached to power support 74.

FIGS. 31A and 41A-41C illustrate piezoelectric cantilevers 72 that extend in a common direction from a common side of a rectangular power support 74. In other embodiments of the present disclosure, piezoelectric cantilevers 72 in a common piezoelectric power component 62 or attached to a common power support 74 extend in different directions from power support 74, for example as shown in the partial perspective of FIG. 42A and corresponding cross section of FIG. 42B taken across cross section line A of FIG. 42A. (For clarity of illustration, FIG. 42A excludes cap 75 shown in FIG. 42B.) A portion of power support 74 can also intrude, protrude, or extend into the area enclosed by a perimeter (e.g., a convex hull) of power support 74 surrounding piezoelectric cantilevers 72, for example bisecting the area, as shown in FIG. 42A. The portion of power support 74 bisecting the area within the perimeter supports two piezoelectric cantilevers 72A, 72B extending in opposite directions from the bisecting portion of power support 74. More generally, piezoelectric cantilevers 72 can extend in a common direction or in different directions from a common side or different sides of power support 74 or from power support 74 structures (portions) internal to a perimeter of power support 74. Thus, according to some embodiments, at least one piezoelectric cantilever 72 extends in a first direction from power support 74 and at least one piezoelectric cantilever 72 extends in a second direction from power support 74, and the first direction is different from the second direction, for example opposite or orthogonal.

Power support 74 can form a cavity 79 enclosure surrounding or enclosing piezoelectric cantilevers 72, for example in a horizontal direction parallel to a surface of piezoelectric cantilevers 72 and orthogonal to an oscillation direction 78, as shown in FIG. 31B. The internal power support 74 structures or portions can be connected to a perimeter portion of power support 74. In some embodiments internal power support 74 structures or portions are not directly connected to a perimeter portion of power support 74, for example disconnected internal portions of power support 74 can extend from a bottom of cavity 79 as a post.

According to some embodiments of the present disclosure and as illustrated in FIGS. 42A and 42B, piezoelectric cantilevers 72 each comprise a cantilever support layer 77. Piezoelectric layer 71 is disposed between first and second electrodes 54, 56 on cantilever support layer 77. According to some embodiments of the present disclosure, power support 74 comprises or is physically connected to a component tether 37. Thus, piezoelectric power component 62 can be provided in a piezoelectric power component 62 source wafer (e.g., power component source wafer 39) and can be micro-transfer printed to comprise a micro-transfer printed piezoelectric power component 62 with a separated or fractured component tether 37.

FIGS. 42A and 42B illustrate power support 74 extensions or protrusions connected to piezoelectric cantilever 72 that do not extend from a top side of power support 74 to a bottom side of power support 74 but are rather suspended over an area enclosed by a perimeter or convex hull of power support 74, as are piezoelectric cantilevers 72. In some embodiments and as illustrated in the partial perspective of FIG. 43A and the corresponding cross section of FIG. 43B taken across cross section line A of FIG. 43A, power support 74 extensions or protrusions on which piezoelectric cantilever 72 is disposed extend from beneath piezoelectric cantilever 72 to a bottom of power support 74. (For clarity of illustration, FIG. 43A excludes cap 75 shown in FIG. 43B.) Power support 74 protrusions or extensions can be considered to be a part of a singular power support 74 or as a second power support 74 that is physically connected to a first power support 74. Thus, according to some embodiments, power support 74 is a first power support, piezoelectric cantilever 72 is a first piezoelectric cantilever 72, and a piezoelectric power component 62 comprises a second power support 74 and a second piezoelectric cantilever 72 extending from second power support 74, where second piezoelectric cantilever 72 comprises a layer of piezoelectric material 71, a first electrode 54 on a first side of piezoelectric material 71 and a second electrode 56 on a second side of piezoelectric material 71 opposite the first side. Second power support 74 and second piezoelectric cantilever 72 are disposed within first power support 74 so that piezoelectric power component 62 is a nested power component 62, as discussed further below.

Figure 43A:
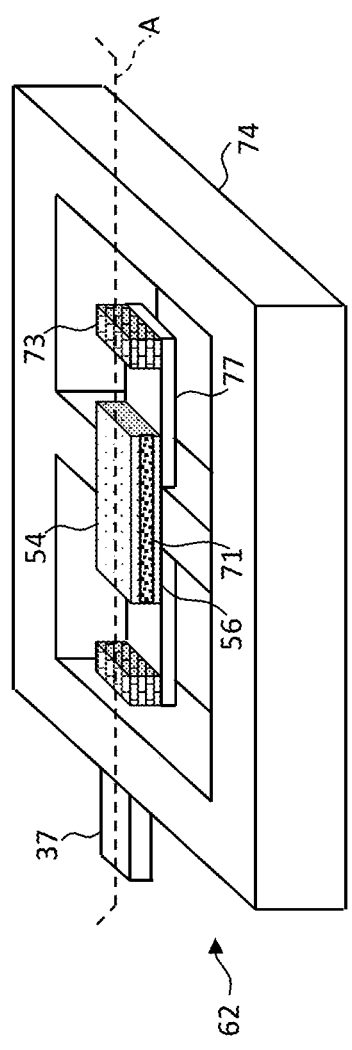
FIG. 43A is a perspective and FIG. 43B is a cross section taken along cross section line A of FIG. 43A of a piezoelectric power component comprising piezoelectric cantilevers extending in different directions supported by a power support post and a cap affixed to a target substrate according to illustrative embodiments of the present disclosure.
Figure 43B:
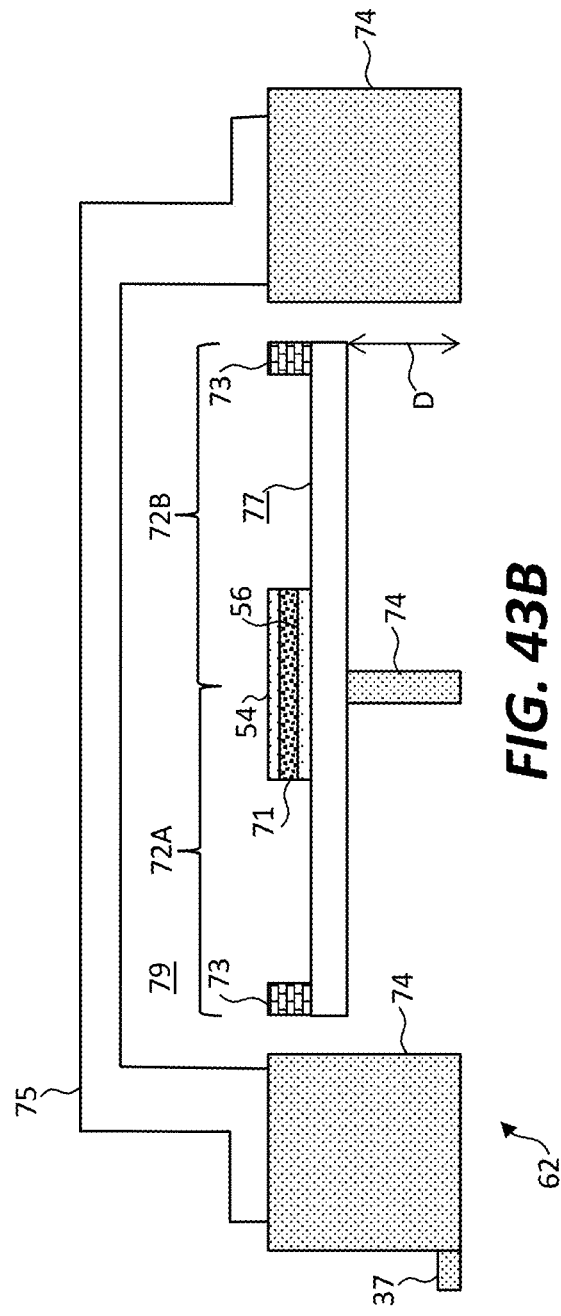
Figure 44A:
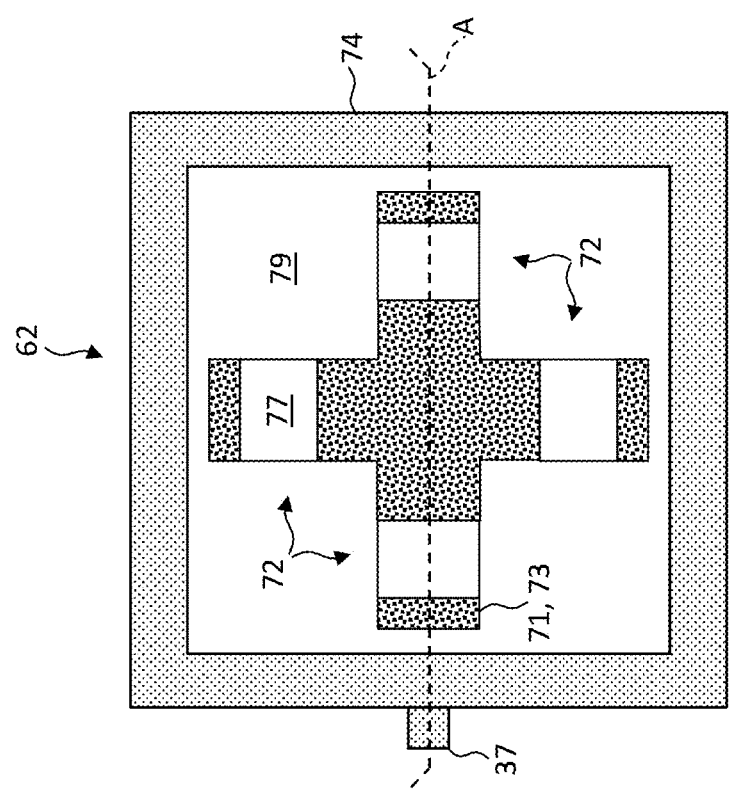
FIG. 44A is a top view and FIG. 44B is a cross section taken along cross section line A of FIG. 44A of a piezoelectric power component comprising piezoelectric cantilevers extending in opposite and in orthogonal directions and a cap affixed to a document or intermediate substrate according to illustrative embodiments of the present disclosure.
Figure 44B:
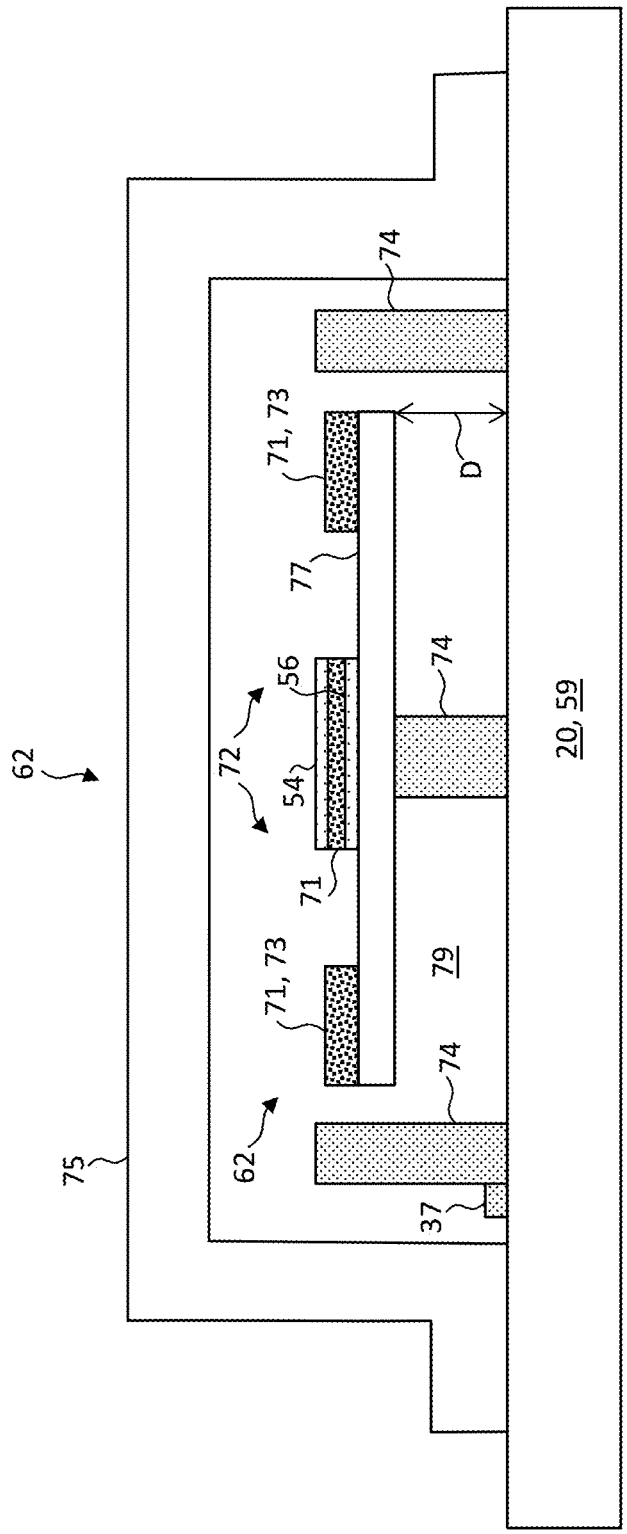

FIGS. 42B and 43B illustrate cap 75 affixed to power support 74; in some other embodiments of the present disclosure, cap 75 is affixed to a target substrate, e.g., component substrate 38, intermediate substrate 59, or document 20, as shown in FIG. 44B. In both cases, power component 62 is enclosed and protected (e.g., from environmental contamination) at least in part by cap 75.

According to embodiments of the present disclosure, power component 62 and power support 74 are open on the bottom, for example as shown in FIGS. 42A-43B. When micro-transfer printed to a target substrate, for example intermediate substrate 59 or document 20, the target substrate can form a bottom and cap 75 forms a top of cavity 79 enclosing power component 62 to protect power component 62 from the environment. If cap 75 is adhered to power support 74, power support 74 also encloses power component 62, along with cap 75 and the target substrate (e.g., document 20). In some embodiments, component substrate 38 forms a bottom for cavity 79, e.g., as shown in FIG. 31B. When not micro-transfer printed, component substrate 38 on which power component 62 is constructed can provide a bottom to power component 62, for example as shown in FIGS. 22, 30, 31B, and 36E-36G.

According to some embodiments of the present disclosure and as illustrated in FIGS. 42A-44B, piezoelectric cantilever 72 comprises a cantilever support layer 77. Second electrode 56 is disposed on only a portion of piezoelectric cantilever 72, piezoelectric material 71 is disposed on second electrode 56, and first electrode 54 is disposed on piezoelectric material 71 opposite second electrode 56. Thus, the operative portion of piezoelectric cantilever 72 (from which power can be collected) corresponding to the disposition of first and second electrodes 54, 56 extends along only a portion of cantilever support layer 77, for example less than or equal to one half, one third, one quarter, or one fifth of the length of cantilever support layer 77. In some embodiments, an operative portion of piezoelectric layer 71 extends along cantilever support layer 77 by a distance of no more than half of a length of cantilever support layer 77. In some embodiments, one or more of piezoelectric layer 71, first electrode 54, and second electrode 56 comprises two or more physically separate portions (e.g., where first portions thereof are operative and second portions thereof are inert or both first portions thereof and second portions thereof are operative). According to some embodiments of the present disclosure, when piezoelectric cantilever 72 is mechanically perturbed (e.g., vibrated, shaken, or accelerated) the greatest stress on piezoelectric material 71 (and hence the greatest electrical power generated) is at the physical connection between cantilever support layer 77 and power support 74. At the same time, piezoelectric material 71 and first and second electrodes 54, 56 provide undesirable capacitance that inhibits the efficient conversion of electrical power produced by mechanically perturbing piezoelectric cantilever 72. Thus, according to embodiments of the present disclosure, piezoelectric material 71 is provided on less than all of cantilever support layer 77 (to reduce capacitance) and preferably on locations of cantilever support layer 77 greatest stress (to increase electrical power generation and collection). Where piezoelectric material 71 is provided along the entire length of cantilever support layer 77 to provide at least a portion of mass 73, first and second electrodes 54, 56, can extend along piezoelectric cantilever support layer 77 less than an entire length of cantilever support layer 77 to reduce a capacitance of piezoelectric material 71. Instead of extending operative portions of piezoelectric layer 71, first electrode 54, and second electrode 56, inert mass 73 can increase deflection of cantilever support layer 77 therefore enhancing stress on piezoelectric material 71 at the physical connection between cantilever support layer 77 and power support 74 to improve power generation and collection without adding capacitance.

According to embodiments of the present disclosure, a piezoelectric power generation structure such as piezoelectric power component 62 can act as a capacitor C electrically connected in parallel with a charge generator. The charge generator can be a current source that outputs a current impulse with a defined current I that is active for a fixed amount of time T when mechanically stressed, resulting in the application of a fixed amount of charge Q to the capacitor C according to the equation:

$Q=I*T.$

The voltage V across capacitor C1 as a result of the active current I can be calculated from the fundamental equation: $Q=C*V$. Therefore, $V=Q/C$ so that the generated voltage is inversely dependent on capacitance C. If capacitance C is increased without a corresponding increase in charge Q, the voltage is decreased.

If first and second electrodes 54, 56 are additionally disposed on portions of piezoelectric material 71 that are not mechanically stressed, no additional electrical power is generated in those portions but capacitance C is increased, reducing the voltage V of piezoelectric power component 62. Thus, a piezoelectric power component 62 that predominantly (e.g., only) collects power from more strongly stressed portions of piezoelectric materials 71 can produce a greater voltage. In comparison, a piezoelectric power component 62 that collects power from strongly and weakly stressed portions of piezoelectric materials 71 can produce a slightly greater charge Q but, because of the increased capacitance C, will have a reduced voltage V.

For example, a strongly stressed portion of piezoelectric material 71 (portion 1) that produces charge Q1 has a capacitance C1 and an additional portion of piezoelectric material 71 that is not strongly stressed (portion 2) produces charge Q2 and has a capacitance C2, so that:

$V_{1+2}=(Q1+Q2)/(C1+C2),$

Because portion 2 of piezoelectric material 71 is weakly stressed, if at all, portion 2 produces no or very little charge (Q2<<Q1) but has an additional capacitance C2 that can be equal to or greater than C1. Thus, in an extreme case:

$V_{1+2}=(Q1)/(C1+C2)$ and $V_{1+2}<<V.$

In summary, a passive capacitor of any type electrically connected in parallel with an active piezoelectric harvester will decrease the output voltage for a given applied stress and associated injected charge. Thus, according to some embodiments of the present disclosure, a desirable piezoelectric power component 62 will have the largest practical ratio of Q to C to provide the greatest electrical voltage and useful electrical power from a mechanically stressed piezoelectric power component 62.

According to embodiments of the present disclosure, piezoelectric cantilevers 72 can be disposed in various number, directions, and configurations and attached to power support 74 in a variety of locations. FIG. 44A is a top view with a cross section line corresponding to the cross section of FIG. 44B (excluding cap 75) illustrating embodiments in which power support 74 extends around and beneath piezoelectric cantilevers 72. Piezoelectric cantilevers 72 extend from a power support 74 post within the perimeter of power support 74 surrounding piezoelectric cantilevers 72 in four directions corresponding to the arms of a plus ('+') sign or an 'x', e.g., orthogonal and opposite directions.

Figure 46:
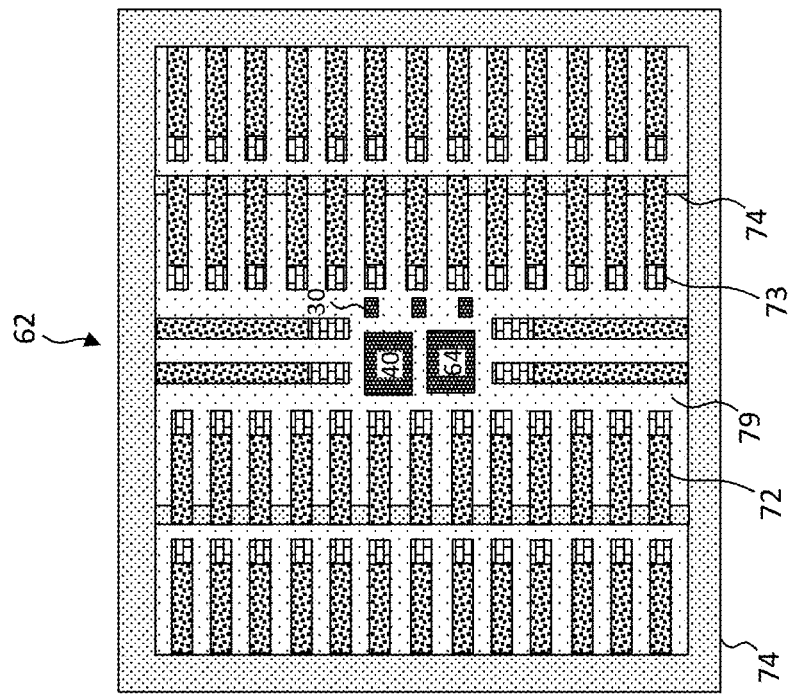
FIGS. 45 and 46 are plan views of a piezoelectric power component comprising various arrangements of piezoelectric cantilevers extending in different directions according to illustrative embodiments of the present disclosure.
Figure 45:
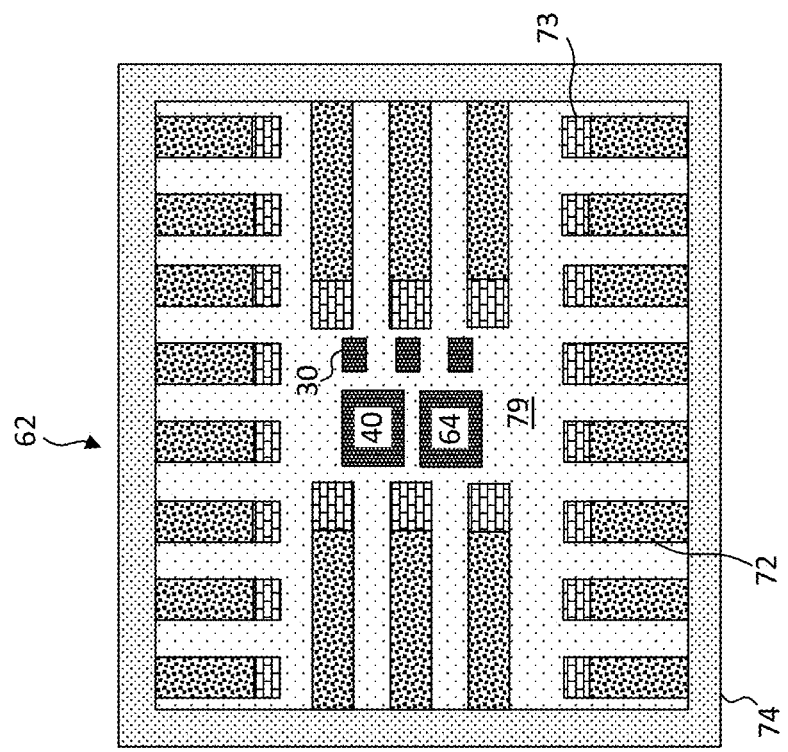

Referring to FIGS. 45 and 46, according to some embodiments of the present disclosure, multiple piezoelectric cantilevers 72 can be disposed around the periphery (perimeter) of power support 74 and can extend from multiple sides of a rectangular power support 74. Power support 74 can extend into cavity 79 formed by a perimeter of power support 74 to support additional piezoelectric cantilevers 72 in a nested configuration, as shown in FIG. 46. In some embodiments, additional mass 73 material is deposited on piezoelectric material 71 (e.g., as shown in FIG. 31B). The multiple piezoelectric cantilevers 72 can be electrically connected in any desirable combination of series or parallel electrical connections. A central portion of cavity 79 formed by power support 74 surrounding piezoelectric cantilevers 72 can be used for disposing other components, for example a controller 40, power convertor 64, or inorganic LEDs 30 forming an electrical circuit that can be powered by mechanical perturbation (agitation, vibration, shaking, etc.) of piezoelectric cantilevers 72. Masses 73 can be formed at least in part by piezoelectric material 71 or material used in first and second electrodes 54, 56.

Figure 47A:
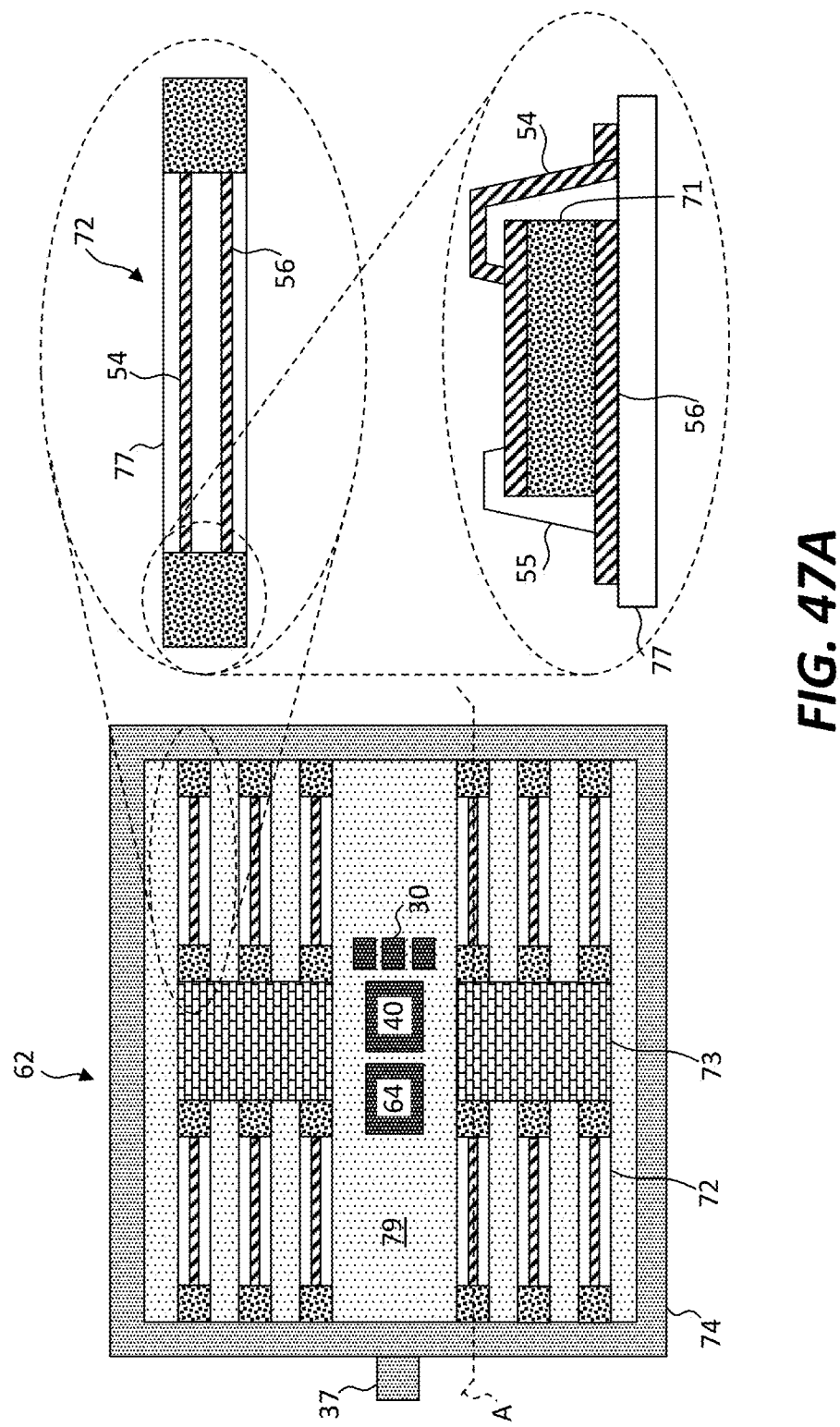
FIG. 47A is a plan view and detail of a piezoelectric power component comprising piezoelectric cantilevers extending in opposite directions with a common mass and FIG. 47B is a cross section corresponding to cross section line A of FIG. 47A according to illustrative embodiments of the present disclosure.
Figure 47B:
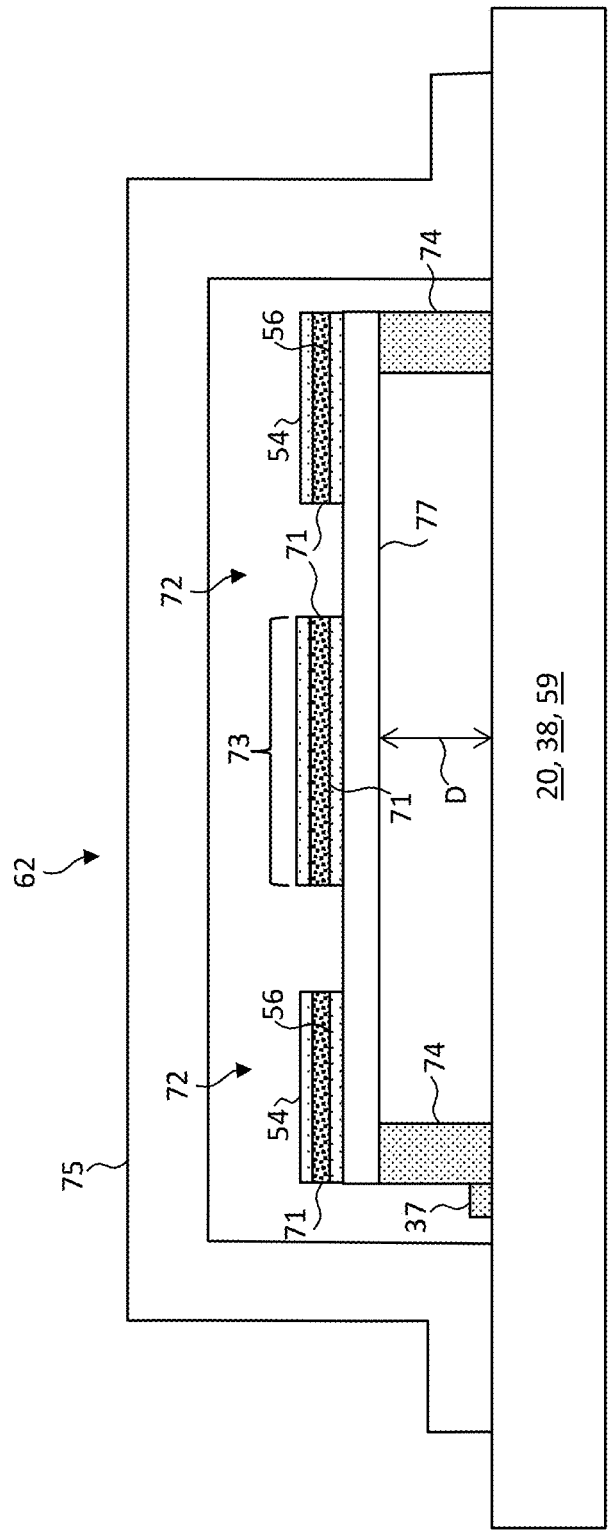

FIG. 47A and the corresponding cross section of FIG. 47B illustrate embodiments of the present disclosure. In these embodiments, an individual and unitary mass 73 is physically connected to multiple piezoelectric cantilevers 72 that extend in different directions and are physically attached to different sides of power support 74 so that mass 73 can move up and down in a direction D in a central portion of cavity 79. In order to efficiently generate electrical power and avoid striking a substrate (e.g., document 20, intermediate substrate 59, or component substrate 38), piezoelectric cantilever 72 can extend from power support 74 a height above a bottom of power support 74 a distance D that is no less than a displacement distance of piezoelectric cantilever 72 (e.g., the distance mass 73 moves when mechanically perturbed), which can be determined based on structure (e.g., geometry and composition) and assumptions regarding the range of forces likely to be applied. The location (height) of piezoelectric cantilever 72 above the bottom of power support 74 can be adjusted to control distance D. For example, piezoelectric cantilever 72 can be disposed with a top surface of piezoelectric cantilever 72 in a common plane with a top surface of power support 74. According to some embodiments, for example where piezoelectric cantilever 72 is supported from below by a power support 74 post (e.g., as shown in FIG. 44B), the height of the post can determine distance D. According to some embodiments, piezoelectric cantilever 72 is physically attached to a side wall of power support 74 that is not in a plane with a top surface of power support 74, for example as illustrated in FIG. 31B. In some embodiments, a target substrate on which power component 62 is disposed (e.g., component substrate 38, intermediate substrate 59, or document 20 substrate) comprises a cavity 79 or sacrificial portion disposed beneath piezoelectric cantilever 72 to increase distance D and enable a greater displacement distance for mass 73, e.g., as shown in FIGS. 31B and 40D, thereby enabling greater power generation with greater mechanical movement.

Piezoelectric material 71 can be disposed in two or more separate portions along cantilever support layer 77 and each portion can extend along cantilever support layer 77 a distance less than one half of the length of cantilever support layer 77 (e.g., a length of piezoelectric cantilever 72). According to some embodiments, piezoelectric material 71 is disposed on cantilever support layer 77 between power support 74 and one half of the length of cantilever support layer 77. According to some embodiments, piezoelectric material 71 is disposed on cantilever support layer 77 between mass 73 and one half of the length of cantilever support layer 77. In some embodiments, and as shown in FIGS. 47A and 47B, piezoelectric material 71 is disposed at both ends of cantilever support layer 77. First and second electrodes 54, 56 can extend over and under piezoelectric material 71, respectively and can extend the length of cantilever support layer 77 to electrically connect the piezoelectric material 71 at each end of cantilever support layer 77, for example in a series electrical connection. Piezoelectric material 71 experiences the greatest stress (and generates the most electrical power) where piezoelectric material 71 is physically connected to power support 74 and to mass 73. Therefore, providing piezoelectric material 71 only at those locations combines efficient power generation with reduced capacitance. Thus, according to some embodiments, piezoelectric layer 71, first and second electrodes 54, 56, or both comprise first and second separate portions along cantilever support layer 77 and the first portion is adjacent to a first end of cantilever support layer 77 proximate to power support 74 and the second portion is adjacent to a second end of cantilever support layer 77 opposite (distal) to the first end. The separate piezoelectric material 71 locations on cantilever support layer 77 can be electrically connected by electrodes (e.g., first and second electrodes 54, 56) in series to increase the voltage of the power component 62 or in parallel to increase the current. The piezoelectric material 71 and first and second electrodes 54, 56 can extend over or form a part of mass 73 at one end of piezoelectric cantilever 72 and over power support 74 at an opposite end of piezoelectric cantilever 72.

Figure 48A:
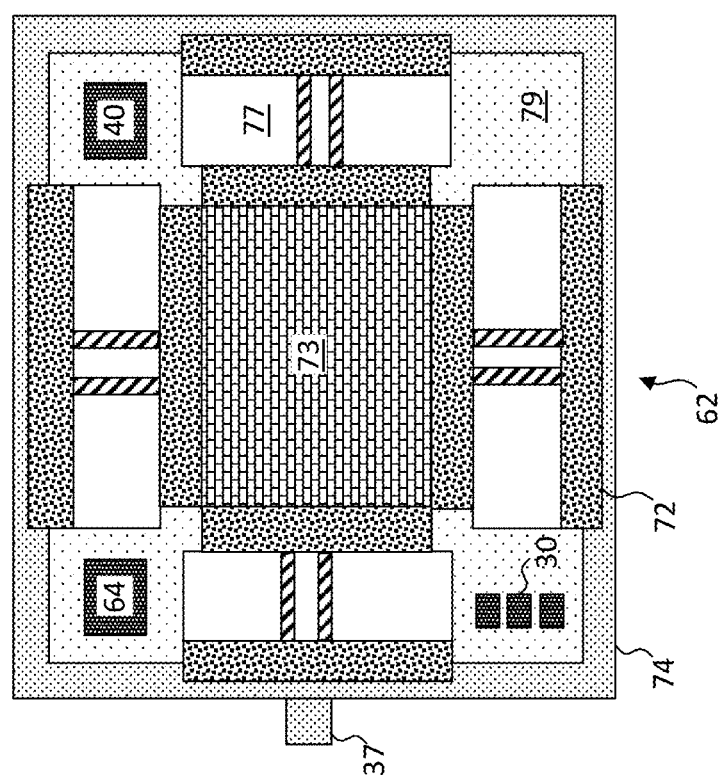
FIG. 48A-48C are plan views of piezoelectric power components comprising piezoelectric cantilevers extending in orthogonal and opposite directions with a common mass according to illustrative embodiments of the present disclosure.
Figure 48C:
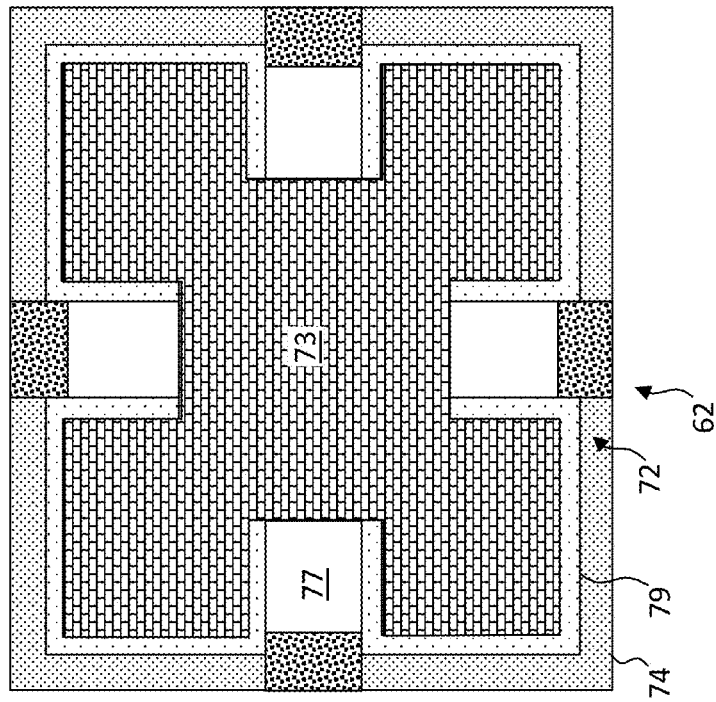
Figure 48B:
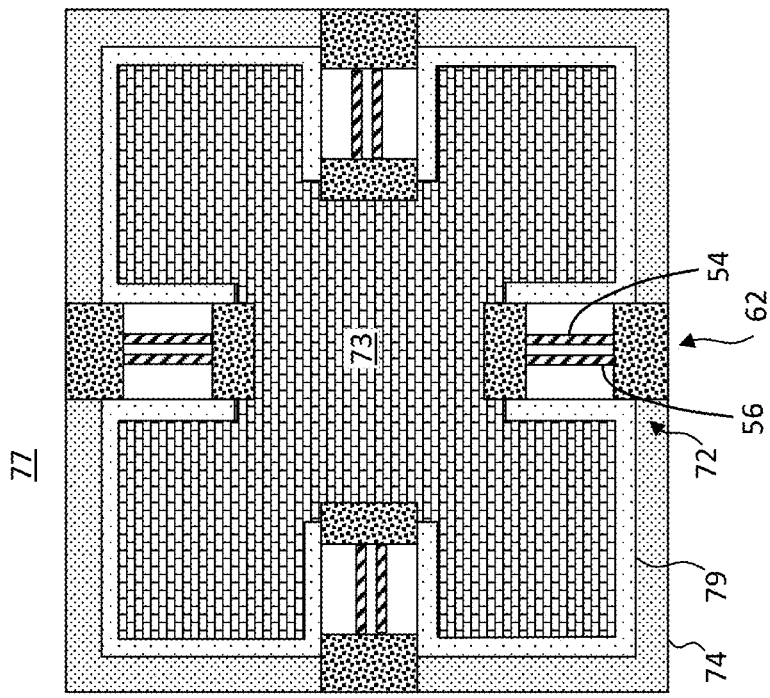

FIGS. 47A and 47B illustrate embodiments in which two groups of piezoelectric cantilevers 72 extend in opposite directions of parallel lines and each group shares a common unitary mass 73. In some embodiments and as illustrated in FIGS. 48A-51 and FIGS. 53-55, piezoelectric cantilevers 72 extend in orthogonal directions, for example on four sides of a rectangle or square. As shown in FIGS. 48A-48C, mass 73 is disposed in a center of cavity 79 surrounded by rectangular power support 74. Four piezoelectric cantilevers 72 are each physically attached to a different side of mass 73 and to a different side of power support 74. Piezoelectric material 71 and first and second electrodes 54, 56 are disposed at each end of each piezoelectric cantilever 72. As shown for example in FIGS. 48A-48C, in some embodiments, piezoelectric material 71 and first and second electrodes 54, 56 extend at least partially over mass 73 or power support 74, or both, to experience the greatest mechanical stress when mechanically perturbed. The electrical connections for the power component 62 of FIGS. 48A-48C can be similar to those illustrated in the insets of FIG. 47A.

Figure 49:
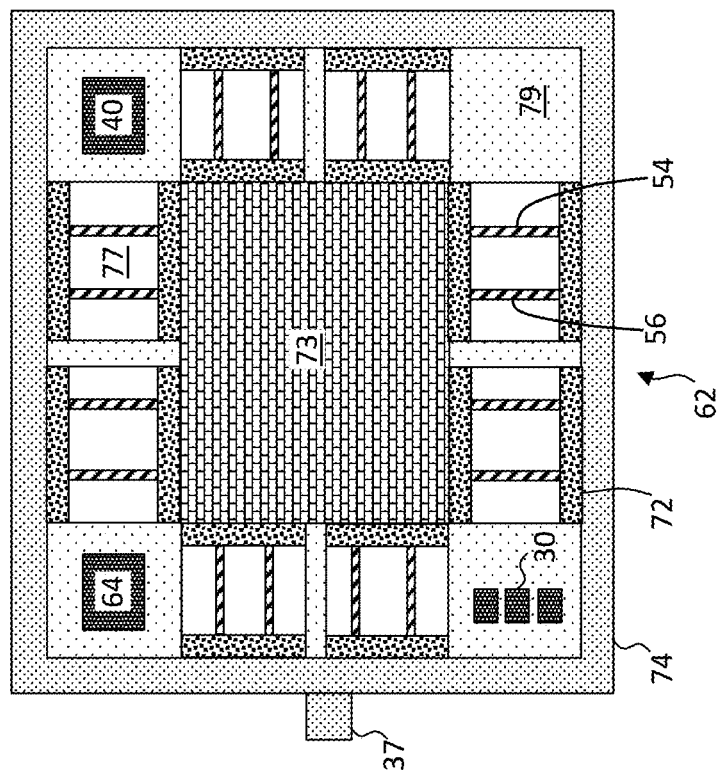
FIG. 49 is a plan view of a piezoelectric power component comprising two piezoelectric cantilevers on each side of a rectangular power support with a common mass according to illustrative embodiments of the present disclosure.

Since mass 73 is disposed in the center of cavity 79, other components can be disposed around the corners of cavity 79 (as shown in FIG. 48A) or completely exterior to power component 62 and power support 74 (as shown in FIGS. 48B and 48C). FIG. 48B illustrates embodiments in which mass 73 is also provided in the corners of cavity 79 surrounded by power support 74, increasing the potential power generation by adding stress to piezoelectric material 71 when power component 62 is accelerated. FIG. 48C illustrates embodiments in which piezoelectric material 71 and first and second electrodes 54, 56 are disposed only at locations where piezoelectric cantilever 72 is in contact with power support 74. In some embodiments, the greatest stress in piezoelectric material 71 is at locations where piezoelectric cantilever 72 is in contact with power support 74 and locations where piezoelectric material 71 and first and second electrodes 54, 56 are in contact with mass 73 provide less electrical power, for example if mass 73 is at least semi-flexible and deforms in response to mechanical perturbation thereby reducing mechanical stress (and power generation) in piezoelectric material 71 in contact with mass 73. By providing first and second electrodes 54, 56 only at the power support 74 end of piezoelectric cantilever 72, capacitance in piezoelectric material 71 is reduced. FIG. 49 illustrates embodiments in which multiple piezoelectric cantilevers 72 are disposed on each side of cavity 79 formed by power support 74. Multiple piezoelectric cantilevers 72 can be serially connected to provide higher voltages.

Figure 50:
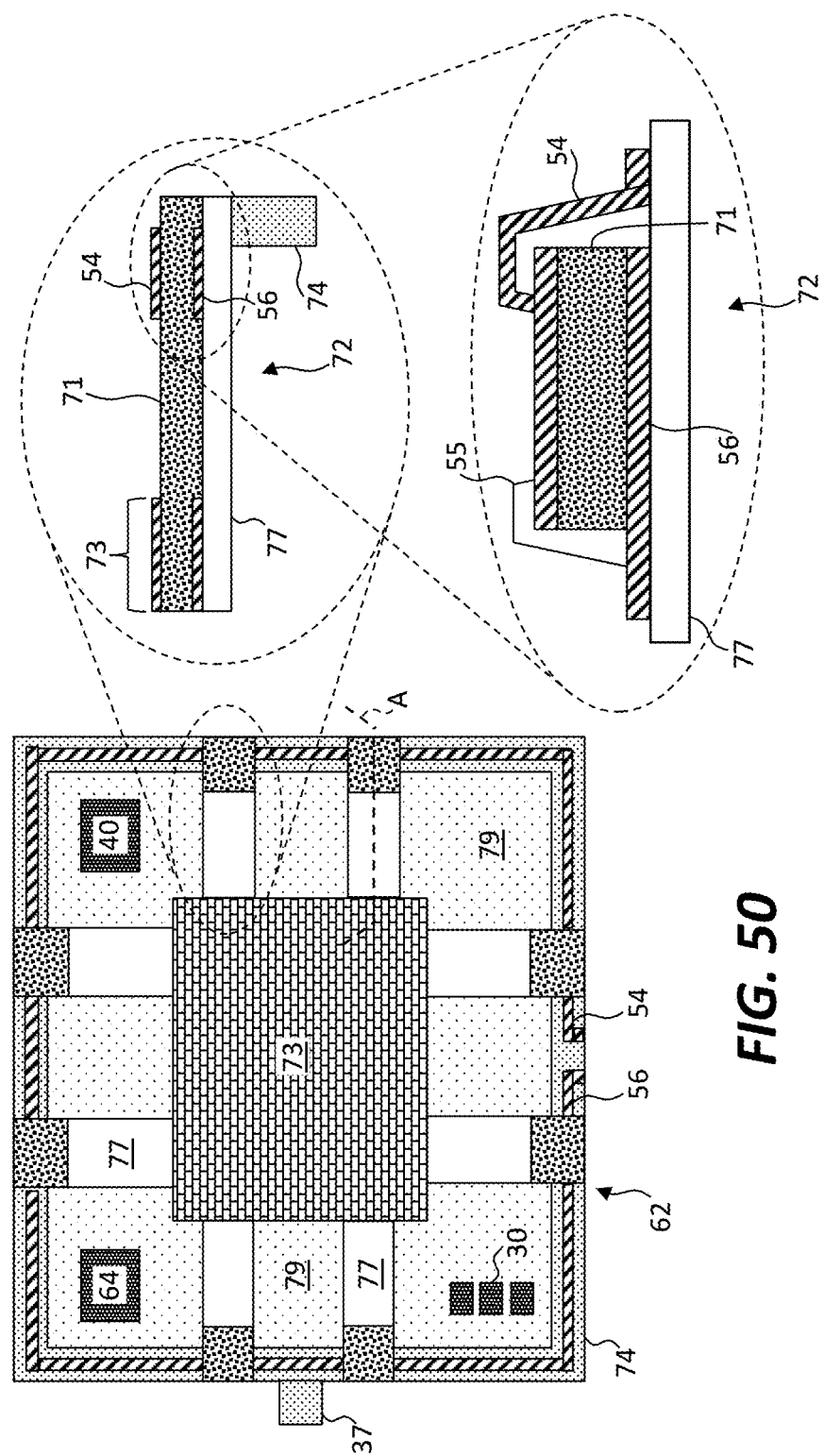
FIG. 50 is a plan view and cross sectional detail of a piezoelectric power component comprising two piezoelectric cantilevers on each side of a rectangular power support with a common mass according to illustrative embodiments of the present disclosure.

For clarity of illustration, FIGS. 41A-49 exclude electrical connections between piezoelectric cantilevers 72. As illustrated in FIG. 50 and according to embodiments of the present disclosure, electrical connections (e.g., first and second electrodes 54, 56) can electrically connect piezoelectric cantilevers 72 in serial or in parallel, for example with first and second electrodes 54, 56 that extend or are disposed on power support 74. FIG. 50 illustrates rectangular power support 74 enclosing cavity 79. Two piezoelectric cantilevers 72 are connected to each side of rectangular power support 74 and extend to mass 73 disposed in the center of cavity 79. Components (e.g., controller 40, LEDs 30, and power convertor 64) are disposed in the corners of cavity 79. Each piezoelectric cantilever 72 comprises a cantilever support layer 77 on which is disposed second electrode 56, piezoelectric material 71, and first electrode 54. First electrode 54, piezoelectric material 71, and second electrode 56 form a piezoelectric power component 62 that produces electrical power when mass 73 and piezoelectric cantilever 72 are mechanically perturbed or agitated (e.g., by any one or more of vibration, shaking, and acceleration). Piezoelectric material 71 and first and second electrode material (e.g., aluminum or copper or other metals or metal alloys), but not first and second electrodes 54, 56 extend along cantilever support layer 77 to provide mass 73 and can be deposited in common steps with piezoelectric material 71 and first and second electrodes 54, 56. As shown in FIG. 50, the additional metal mass 73 is not electrically connected to first and second electrodes 54, 56, thus providing a desirable combination of power generation and reduced capacitance. In some embodiments, for example as shown in FIGS. 47A-49, the additional metal is electrically connected as part of first and second electrodes 54, 56, either serially or in parallel. Each piezoelectric cantilever 72 is electrically connected in any desired combination of serial and parallel with electrodes, for example first and second electrodes 54, 56 disposed on power support 74.

Figure 51:
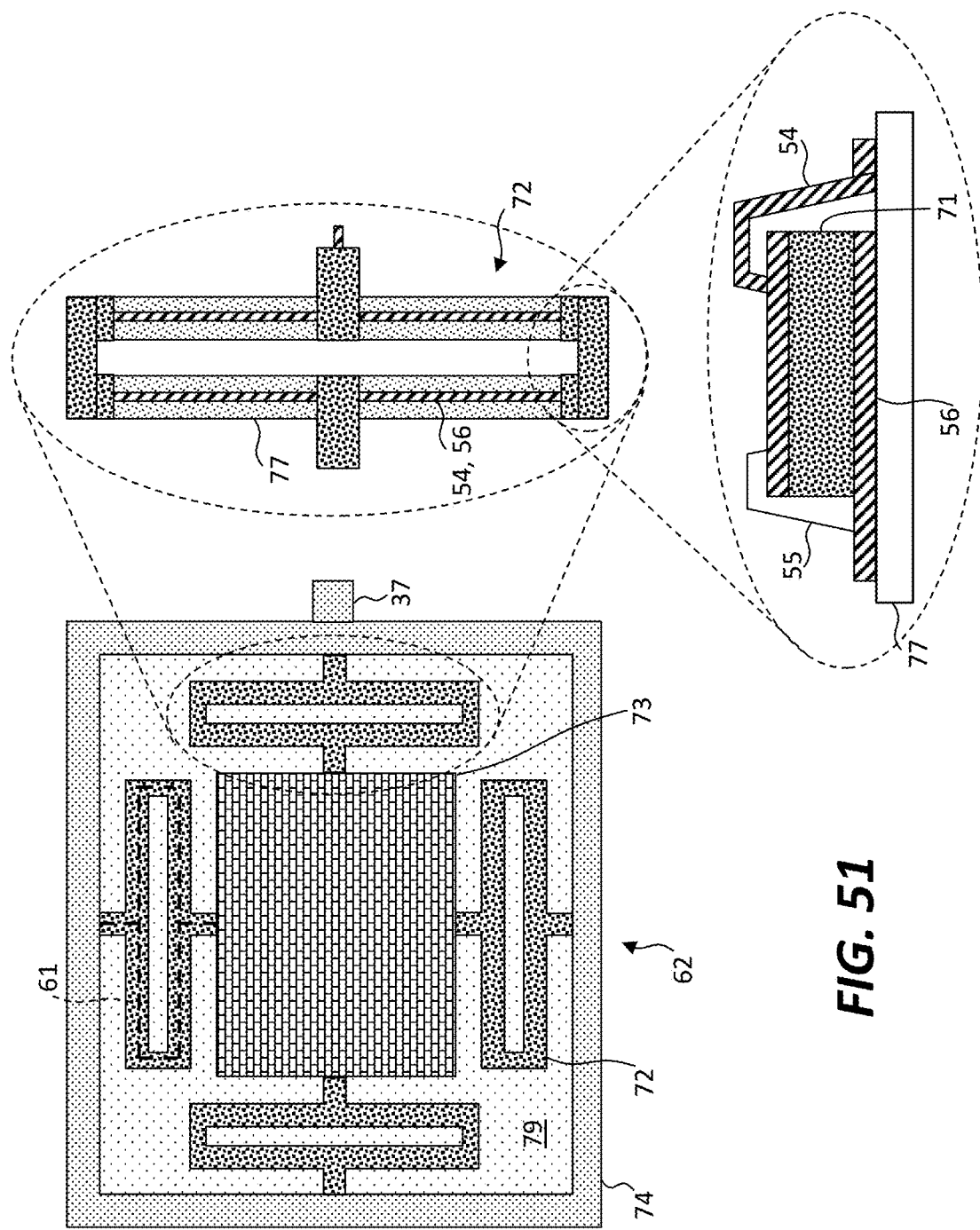
FIG. 51 is a plan view and cross sectional detail of a piezoelectric power component comprising non-linear piezoelectric cantilevers piezoelectric extending in orthogonal directions with a common and unitary mass according to illustrative embodiments of the present disclosure.
Figure 53:
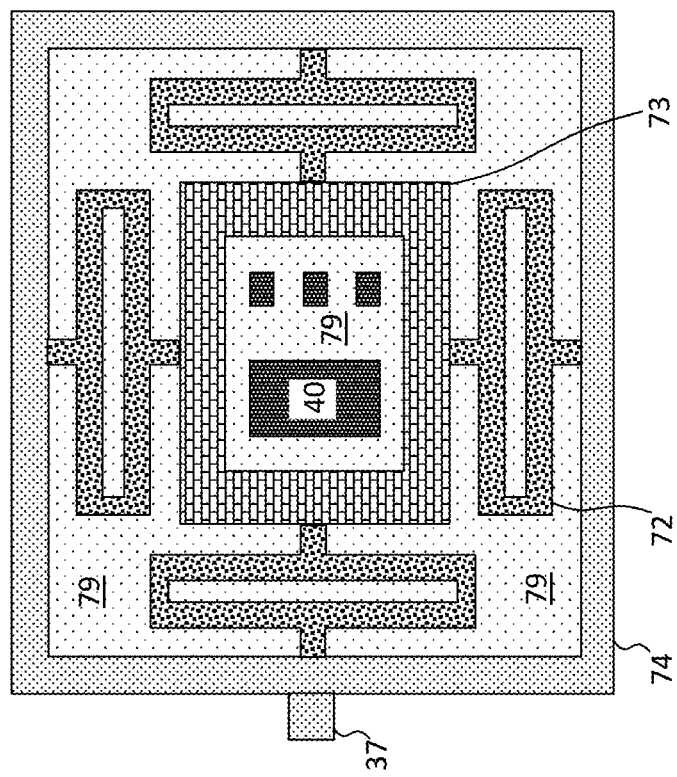
FIG. 53 is a plan view of a non-linear piezoelectric power component comprising piezoelectric cantilevers extending in orthogonal directions with a common mass surrounding components according to illustrative embodiment of the present disclosure.
Figure 54:
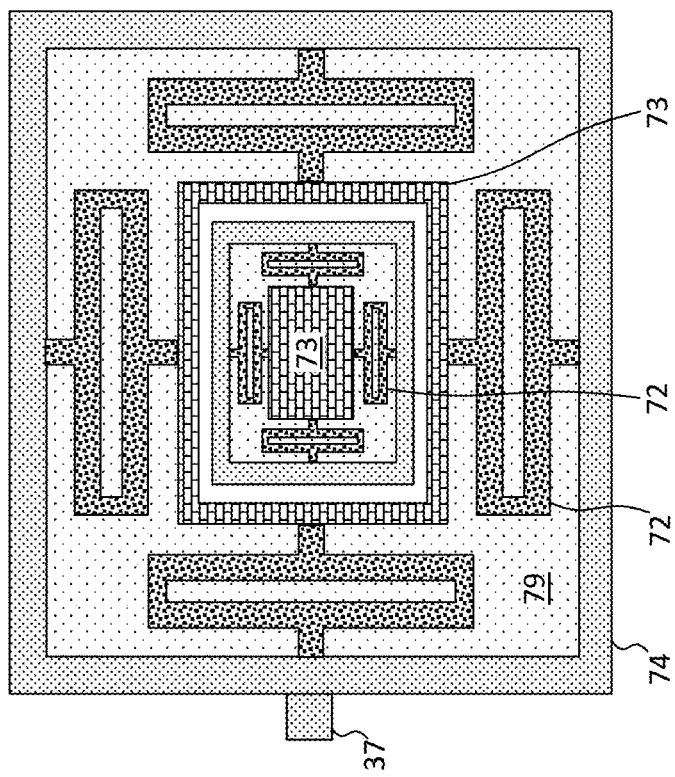
FIG. 54 is a plan view of a piezoelectric power components comprising nested non-linear piezoelectric cantilevers according to illustrative embodiments of the present disclosure.

In some embodiments of the present disclosure and as illustrated in FIGS. 51, 53, and 54, piezoelectric cantilevers 72 are non-linear. A non-linear piezoelectric cantilever 72 has at least one mid-line 61 that is not in a single straight line. Instead, a non-linear piezoelectric cantilever 72 has a mid-line 61 that comprises multiple line segments that are not in a common straight line, for example a mid-line 61 that is curved, a mid-line 61 that forms a U-shape, or a mid-line 61 that separates or splits into multiple legs or extensions, for example splits into two physically separate portions, e.g., forms a Y. The two physically separate portions can be opposed or can be mirror images or reflections, e.g., two opposed U-shapes as shown in each piezoelectric cantilever 72 of FIG. 51. Non-linear piezoelectric cantilevers 72 can concentrate mechanical stress in particular locations so that piezoelectric material 71 power generation is concentrated in particular locations, reducing the size of piezoelectric material 71 needed for a certain power generation and hence the capacitance. Thus, non-linear piezoelectric cantilevers 72 can generate more power for collection than equivalently sized linear piezoelectric cantilevers 72 due to point(s) of non-linearity providing points of concentration for mechanical stress. According to some embodiments, the greatest mechanical stress for perturbed non-linear piezoelectric cantilevers 72 is located where piezoelectric cantilevers 72 attach to power support 74, to mass 73, where piezoelectric cantilever 72 splits into two physically separate portions (e.g., at a mid-line 61 fork), or where mid-line 61 segments change direction, e.g., at the bottom of a U-shape. Portions of piezoelectric layer 71 and first and second electrodes 54, 56 can be disposed only at (e.g., overlapping) such locations of greatest mechanical stress to reduce capacitance while efficiently generating power.

Such non-linear piezoelectric cantilevers 72 can enable greater movement of mass 73 or facilitate construction by improving etch rates undercutting piezoelectric cantilevers 72. FIG. 51 illustrates a non-linear piezoelectric cantilever 72 attached to each side of rectangular mass 73 and to enclosing rectangular power support 74. Mechanical stress in such a non-linear piezoelectric cantilever 72 is concentrated at the power support 74, mass 73, and U-shaped corners of piezoelectric cantilever 72. Piezoelectric material 71 and first and second electrodes 54, 56 are concentrated at those points, enabling a desirable combination of electrical power generation and capacitance. In some such embodiments, piezoelectric cantilever 72 forms a spring enabling mechanical oscillation of mass 73. Thus, according to some embodiments of the present disclosure, a piezoelectric power component 62 comprises a power support 74 and a piezoelectric cantilever 72 extending from power support 74. Piezoelectric cantilever 72 comprises a layer of piezoelectric material 71, a first electrode 54 on a first side of piezoelectric material 71 and a second electrode 56 on a second side of piezoelectric material 71 opposite the first side. Piezoelectric cantilever 72 can, but does not necessarily, comprise a mass 73. According to some embodiments of the present disclosure, piezoelectric cantilever 72 is a non-linear piezoelectric cantilever 72 physically connecting mass 73 to power support 74. Non-linear piezoelectric cantilever 72 can be curved, folded, or comprise line segments that are not in a common line (as shown in FIG. 51). Non-linear piezoelectric cantilevers 72 can comprise a plurality of power generation portions of piezoelectric material 71 electrically connected in parallel, in serial, or in both. Power component 62 can comprise a plurality of non-linear piezoelectric cantilevers 72 each attached to a corresponding separate location on power support 74. The separate locations can be distributed substantially equidistant around a perimeter of power support 74, as shown in FIG. 51. As with linear piezoelectric cantilevers 72, non-linear piezoelectric cantilevers 72 can extend in different directions.

FIG. 52A illustrates a serial electrical connection of multiple piezoelectric cantilevers 72, either linear or non-linear. First and second electrodes 54, 56 insulated by patterned dielectrics 55 and disposed on either side of piezoelectric material 71 in each piezoelectric cantilever 72 are electrically connected in serial. FIG. 52B illustrates an embodiment of a non-linear piezoelectric cantilever 72 in which the piezoelectric material 71 at the corners of the piezoelectric cantilever 72 are electrically connected in parallel and are electrically connected in serial with the piezoelectric material 71 adjacent to mass 73 and power support 74, for example corresponding to embodiments such as those shown in FIG. 51.

In some embodiments of the present disclosure in which different portions of piezoelectric material 71 (e.g., attached to power support 74 and mass 73) in a common piezoelectric cantilever 72 are stressed in different directions, for example as shown in FIGS. 47A-49 and 51, the polarity (shown with '+' and '−' signs) of the electrical voltage can be different for the different piezoelectric material 71 portions. Therefore, an electrically serial connection of the differently stressed piezoelectric material 71 portions can be reversed, as shown in FIG. 52C. FIG. 52C shows a first piezoelectric cantilever 72 and a second piezoelectric cantilever 72A stressed in an opposite direction (making oppositely charged currents) electrically connected in serial.

In some embodiments of the present disclosure and as shown in FIG. 53, mass 73 disposed in a central portion of cavity 79 can have a hole 63 to enable disposition of components in hole 63 and, if one of the components is an LED 30, enable light emitted from LED 30 to be seen when disposed in alignment with hole 63 (if, as in some embodiments, an underlying substrate or overlying cap are transparent to emitted light).

According to some embodiments and as illustrated in FIG. 54, multiple piezoelectric cantilevers 72 or power components 62 can be nested, one disposed within the cavity 79 of another. The piezoelectric cantilevers 72 and power components 62 of FIG. 54 can each correspond to power components 62 of FIGS. 53 and 51.

Figure 55:
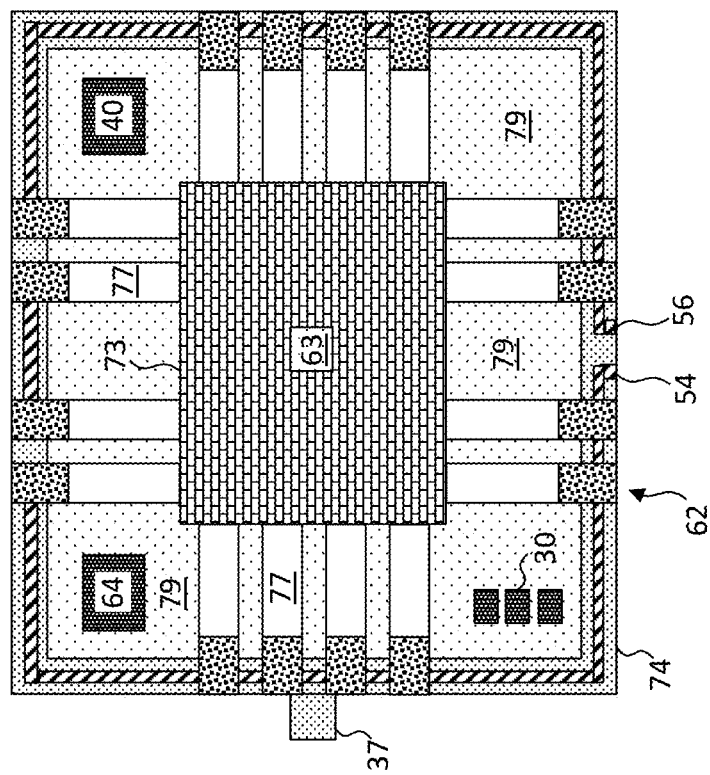
FIG. 55 is a plan view of piezoelectric power components comprising orthogonal piezoelectric cantilevers with holes in a common unitary mass according to illustrative embodiments of the present disclosure.

Power components 62 comprising piezoelectric cantilevers 72 of the present disclosure can be micro-components, for example having a length or width less than 1 mm, no greater than 750 microns, no greater than 500 microns, no greater than 200 microns, or no greater 100 microns. Mass 73 can be separated from component source wafer 39, typically by etching, so that mass 73 is physically attached only to cantilever support layer(s) 77. The process of undercutting mass 73 by etching can be longer than desired, depending on the material system used. A hole in the tethers, for example as described in U.S. patent application Ser. No. 17/006,498 entitled Non-Linear Tethers for Suspended Devices or in the mass as described in U.S. patent application Ser. No. 17/066,448 entitled Micro-Device Structures with Etch Holes, each of which is hereby incorporated by reference herein in its entirety, can facilitate the etching process by exposing additional area or crystal planes of component source wafer 39 to the etchant and reducing the etching time. In some embodiments of the present disclosure and as illustrated in FIG. 55, a hole 63 can be provided in mass 73 to facilitate release. Such holes 63 can expose crystal planes in a power component source wafer 39 and allow ingress for etchants etching beneath mass 73, improving the release of piezoelectric cantilevers 72 and power components 62.

Modeling of embodiments of the present disclosure has shown that for piezoelectric materials 71 such as potassium sodium niobate (KNN) with power supports 74 having dimensions no greater than 500 microns, piezoelectric cantilevers 72 can provide electrical power at 50-100 millivolts and 50-500 micro-amps and, when electrically connected in serial, can generate or converted to generate no less than 1.5 volts with sufficient current to operate an electrical load when mechanically perturbed. Such voltages and currents can, or can be converted to, drive one or more LEDs 30 or other electrical or opto-electronic circuits.

Figure 61A:
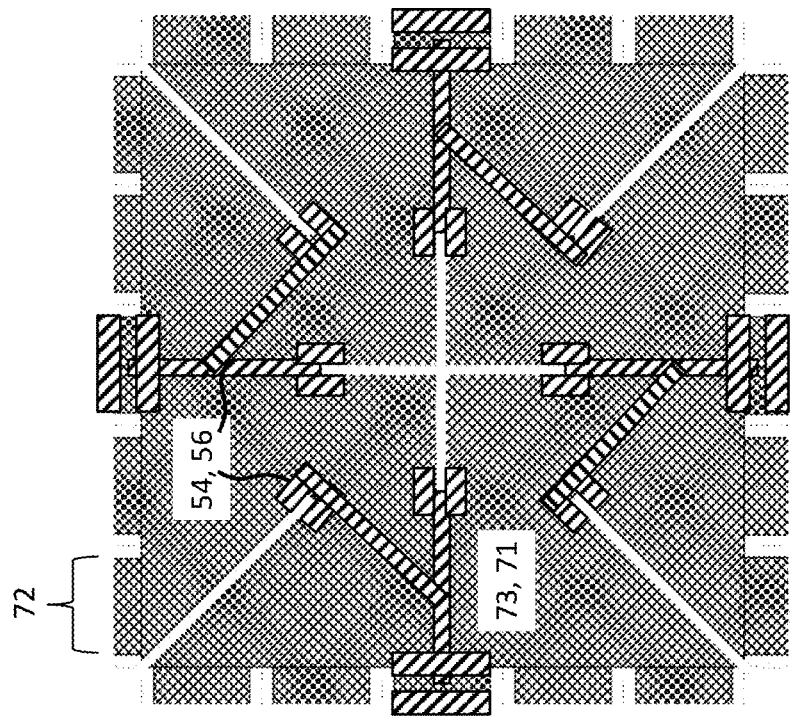
FIG. 61A is a schematic plan view of a mass with openings according to embodiments of the present disclosure.
Figure 61B:
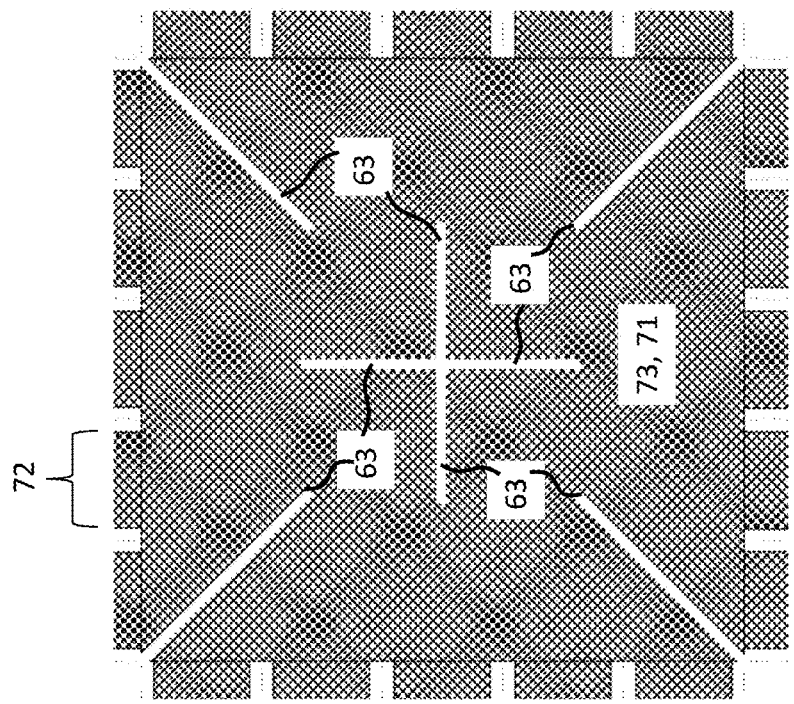
FIG. 61B is a schematic plan view of a mass with openings and electrodes according to embodiments of the present disclosure.

According to some embodiments of the present disclosure and as illustrated in FIG. 61A, one or more (e.g., multiple) openings 63 can be disposed in mass 73 to enable ingress of an etchant to areas under piezoelectric cantilever 72 and/or mass 73 and increase the rate at which piezoelectric cantilever 72 and/or mass 73 can be under-etched and released from an underlying substrate (e.g., document substrate 20). As illustrated in FIGS. 61A and 61B, multiple openings 63 having a high (large) aspect ratio are disposed in mass 73, as taught in co-pending U.S. Provisional Patent Application No. 63/173,988, filed on Apr. 12, 2021, the disclosure of which is hereby incorporated by reference in its entirety. The openings 63 can, for example, be slits that form high-aspect-ratio rectangles that have a length much greater than a width, for example no less than 2:1, 4:1, 8:1, 20:1, 50:1, or 100:1. Some of the slits can intersect to form openings 63 that are plus ('+') shaped, as shown, or form 'T', 'Y', 'X', right angle, or have other shapes (not shown). The high-aspect ratio openings 63 can extend parallel or orthogonally to an edge of mass 73 or can extend diagonally (for example at 45 degrees) with respect to an edge of mass 73. By increasing the rate at which mass 73 is under-etched, damage to mass 73, piezoelectric cantilever 72, or power support 74 is reduced or prevented.

According to some embodiments of the present disclosure, opening(s) 63 in mass 73 can increase stress in piezoelectric cantilever 72 at particular locations, for example the increased stress can be concentrated at the location where piezoelectric cantilever 72 attaches to mass 73 (e.g., at a distal end of piezoelectric cantilever 72). Additionally or alternatively, increased stress can be especially concentrated at the location where piezoelectric cantilever 72 attaches to power support 74 (e.g., at a proximal end of piezoelectric cantilever 72). Similarly, one or more openings 63 in piezoelectric material 71 (e.g., that are not in mass 73) can increase stress in piezoelectric cantilever(s) 72 that include the piezoelectric material 71, which can be concentrated at the location of such piezoelectric material 71 and/or where piezoelectric cantilever 72 attaches to power support 74. According to some embodiments of the present disclosure, a power component 62 comprising a mass 73 and/or piezoelectric material 71 disposed at or forming a distal end of a piezoelectric cantilever 72 with opening(s) 63 in mass 73 and/or piezoelectric material 71 can generate more electrical power than a power component 62 comprising an otherwise equivalent mass 73 and/or piezoelectric material 71 without opening(s) 63. Surprisingly, despite increased flexibility of mass 73 and/or piezoelectric material 71 due to opening(s) 63, modelling has shown that the increase in power collected in such a power component 62 can be significant, for example not less than 1.5 times, 2 times, 4 times, or 8 times as large, when opening(s) are appropriately placed (e.g., as in FIGS. 61A-B). Different arrangements of opening(s) 63 in mass 73 and/or piezoelectric material 71 (e.g., different in one or more of: size, shape, position, and orientation) can result in different (e.g., in magnitude) enhanced piezoelectric responses (e.g., in a piezoelectric power component 62, e.g., based specifically on behavior of mass 73 and/or piezoelectric material 71, how power component 62 is constructed, or both). Not all arrangements of opening(s) 63 (whether in mass 73 or piezoelectric material 71 or both) will result in an enhanced piezoelectric response for a given power component 62. Commercially available computer modelling software can be used to determine whether an enhanced piezoelectric response will be exhibited in a given power component 62.

In some embodiments, one or more openings 63 are disposed in mass 73. In some embodiments, one or more openings 63 are disposed in piezoelectric material 71 in one or more piezoelectric cantilevers 72 (e.g., whether part of mass 73 and/or an operative portion of one or more piezoelectric cantilever 72). As explained in detail elsewhere, mass 73 can be operative (e.g., with first and second electrodes 54, 56) or inert. Mass 73 with one or more openings 63 can be made from or comprise piezoelectric material or non-piezoelectric material. If mass 73 comprises one or more openings 63 and is made of a non-piezoelectric material, it may be used in conjunction with piezoelectric cantilevers 72 in piezoelectric power component 62. If mass 73 comprises one or more openings 63 and is made of a piezoelectric material, it may be used with or without piezoelectric cantilevers 72 in a piezoelectric power component 62.

According to some embodiments of the present disclosure, piezoelectric power component 62 comprises a piezoelectric material 71 having one or more openings 63 disposed such that an applied stress results in an enhanced (greater) piezoelectric response relative to an equivalent piezoelectric material 71 without the one or more openings 63. According to some embodiments, piezoelectric power component 62 comprises mass 73 having one or more openings 63 disposed on one or more piezoelectric cantilevers 72 with mass 73 disposed such that an applied stress results in an enhanced (greater) piezoelectric response in one or more piezoelectric cantilevers 72 relative to an equivalent mass 73 without the one or more openings 63. The presence of the one or more openings 63 (in mass 73 and/or piezoelectric material 71 of piezoelectric cantilever 72) enhances the piezoelectric response by at least a factor of 1.5 (e.g., at least a factor of 2, at least a factor of 4, at least a factor of 6, or at least a factor of 8). In some embodiments, a mass 73 or piezoelectric material 71, the enhanced piezoelectric response is at least 1.5×, at least 2×, at least 3×, at least 4×, at least 5×, at least 6×, or at least 8× and, optionally, no more than 15× or no more than 10× higher than when there are no openings 63.

Figure 62:
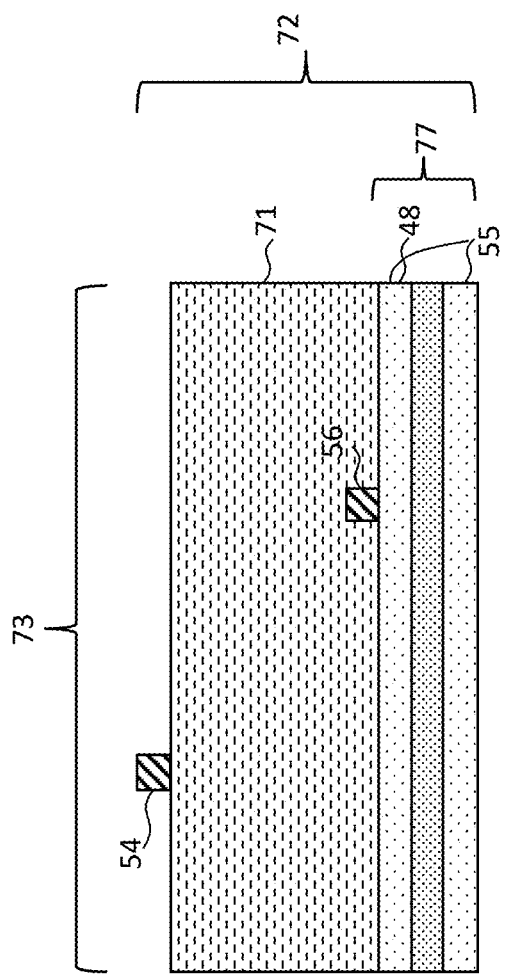
FIG. 62 is a cross section of a mass with offset electrodes according to embodiments of the present disclosure.

According to some embodiments, piezoelectric power component 62 is a piezoelectric power source 60. According to some embodiments, the power generated by piezoelectric power component 62 is determined by an amount of power output by piezoelectric material 71. One or more openings 63 can be disposed in a mass 73 at the end of a piezoelectric cantilever 72 affixed to a power support 74 in power component 62. According to some embodiments of the present disclosure, openings 63 or portions of openings 63 have a length much greater than a width (e.g., opening 63 forms a slit that is a high-aspect-ratio opening 63). When mass 73 is mechanically perturbed, because mass 73 is not perfectly rigid and because openings 63 decrease mass 73 rigidity, mass 73 will flex. Flexing in mass 73 may dissipate some mechanical energy but mass 73 flexing also concentrates mechanical energy at particular locations in mass 73 and/or piezoelectric cantilever 72. In particular, mechanical stress in mass 73 resulting from the flexing can be concentrated at the ends of openings 63 in the length direction as well as at the proximal end of piezoelectric cantilever 72 (and, to a lesser extent where piezoelectric cantilever 72 attaches to mass 73). As shown in FIG. 61B, when piezoelectric material 71 together with first and second electrodes 54, 56 on opposite sides of piezoelectric material 71 is disposed only at the ends of openings 63 in the length direction and mass 73 is accelerated, electrical power can be generated and concentrated at the ends of openings 63 in the length direction and collected by first and second electrodes 54, 56 that extend over and under piezoelectric material 71 to power support 74. Piezoelectric material 71 together with first and second electrodes 54, 56 can, for example, surround the end of the slit in the length direction on one side, two sides, or three sides for a distance at least equal to the width of the slit. If the entire top and bottom surfaces of mass 73 are coated with first and second electrodes 54, 56, the additional electrical power generated in mass 73 with openings 63 is also collected, but the capacitance of power component 62 is detrimentally increased. Where power is not desired to be collected (e.g., not at the ends of openings 63 because of the additional capacitance and relatively little amounts of power), first and second electrodes 54, 56 can be offset in a horizontal direction parallel to top side 24 (and are, therefore, not disposed directly opposite each other on opposite sides of piezoelectric material 71) to reduce the capacitance of first and second electrodes 54, 56 and piezoelectric material 71 where first and second electrodes 54, 56 are offset, for example as shown in FIG. 62.

In some embodiments, as shown in FIG. 44B, piezoelectric material 71 can be disposed in mass 73 without first and second electrodes 54, 56. In some embodiments, as shown in FIG. 47B, piezoelectric material 71 and material corresponding to first and second electrodes 54, 56 (e.g., metal) can be disposed in mass 73 without electrically connecting to first and second electrodes 54, 56. By depositing piezoelectric material 71 and material of first and second electrodes 54, 56, material is provided to mass 73 with fewer processing steps (e.g., provided in a common step with material deposited on a proximal end of piezoelectric cantilever 72) and without increasing the electrical capacitance of piezoelectric cantilever 72. Thus, according to some embodiments, first and second electrodes 54, 56 are disposed on the power support 74, piezoelectric cantilever 72, and mass 73 at locations of significant mechanical stress when mass 73 is physically perturbed. According to some embodiments, openings 63 have a large aspect ratio with a length much greater than a width and first and second electrodes 54, 56 are disposed at the ends of openings 63 in the length direction.

According to some general embodiments of the present disclosure, a piezoelectric power component 62 comprises a piezoelectric material 71 having one or more openings 63 disposed such that an applied stress results in an enhanced piezoelectric response relative to an equivalent piezoelectric material 71 without the one or more openings 63. One or more openings 63 can extend through piezoelectric material 71 from a top side 24 of piezoelectric material 71 to a bottom side 26 of piezoelectric material 71 and through any material corresponding to first and second electrodes 54, 56.

Some embodiments of the present disclosure comprise a power component 62 comprising a power support 74, wherein a proximal end of piezoelectric material 71 is attached to power support 74, and wherein an enhanced piezoelectric response is located at least partly at the proximal end.

The one or more openings 63 can form high-aspect-ratio rectangles having lengths that are greater than widths and the enhanced piezoelectric response can be concentrated at least partly at the ends of the slits in the length direction.

Figure 56:
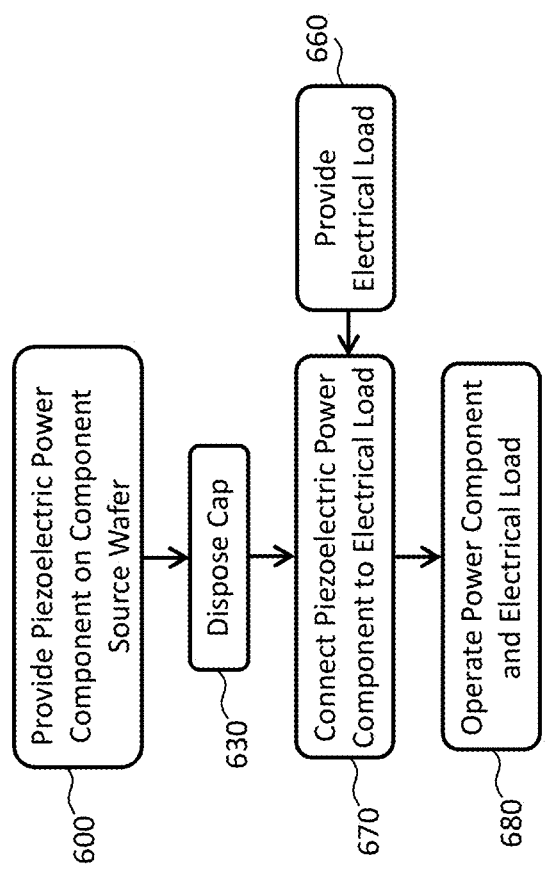
FIGS. 56-57 are flow diagrams according to illustrative embodiments of the present disclosure.

FIG. 56 is a flow diagram illustrating methods according to embodiments of the present disclosure. As shown in FIG. 56, a piezoelectric power component 62 on a power component source wafer 39 is provided in step 600. Such a component source wafer 39 can be constructed using photolithographic processes on a semiconductor-on-insulator (SOI) wafer (e.g., component source wafer 39), as shown in the FIGS. 58A and 58B cross sections. In some examples, the SOI component source wafer 39 can have a substrate of Si {100} or Si {111} and a 200 nm buried oxide ($BO_x$) layer (e.g., dielectric 55) on component source wafer 39. (In some embodiments, materials other than silicon are used for the component source wafer 39, e.g., compound semiconductors or dielectrics such as sapphire.) A 400 nm layer of device silicon (e.g., epi 48) is disposed over the $BO_x$ layer and an optional dielectric 55 layer disposed on the epi 48. A 200 nm second metal layer (e.g., second electrode 56) is disposed on epi 48, followed by a 2 μm layer of piezoelectric material 71 (e.g., potassium sodium niobate (K,Na) $NbO_3$ (KNN)), and a 200 nm first metal layer (e.g., first electrode 54). A 4-6 μm sputtered oxide layer (e.g., dielectric 55) is deposited and patterned and first and second electrodes 54, 56 can be extended with 500 nm of additional metal electrodes connected through vias in the oxide layer dielectric 55 layer. If desired, the entire power component 62 can be encapsulated with 2 μm of nitride, for example silicon nitride (not shown in the Figures). A portion of component source wafer 39 defines an etchable cavity 79 or an etchable sacrificial portion release layer beneath dielectric 55 layer. The $BO_x$ layer (lower dielectric 55 layer) directly above cavity 79 can protect the upper layers (e.g., epi 48, first and second electrodes 54, 56, and piezoelectric material 71 from an etchant used to etch cavity 79 from component source wafer 39 to suspend piezoelectric cantilever 72. Thus, piezoelectric cantilever 72 can have a thickness of no more than 20 microns (e.g., no more than 15 microns, no more than 10 microns, no more than 7 microns, no more than 5 microns, or no more than 3 microns). Any encapsulating layer (e.g., a layer of silicon oxide or silicon nitride having a thickness of 1-2 microns) can increase the thickness of piezoelectric cantilever 72 so that piezoelectric cantilever 72 can have a thickness of, for example 5 microns.

Figure 58A:
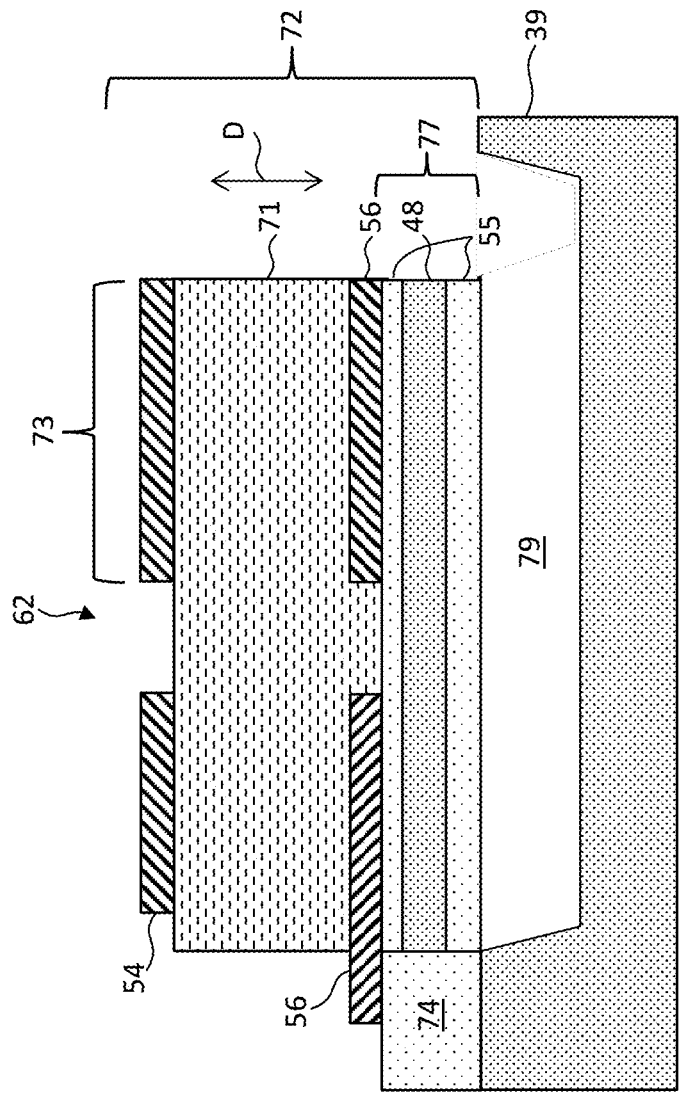
FIGS. 58A and 58B are cross sections of piezoelectric cantilevers suspended over a component source wafer according to embodiments of the present disclosure.
Figure 58B:
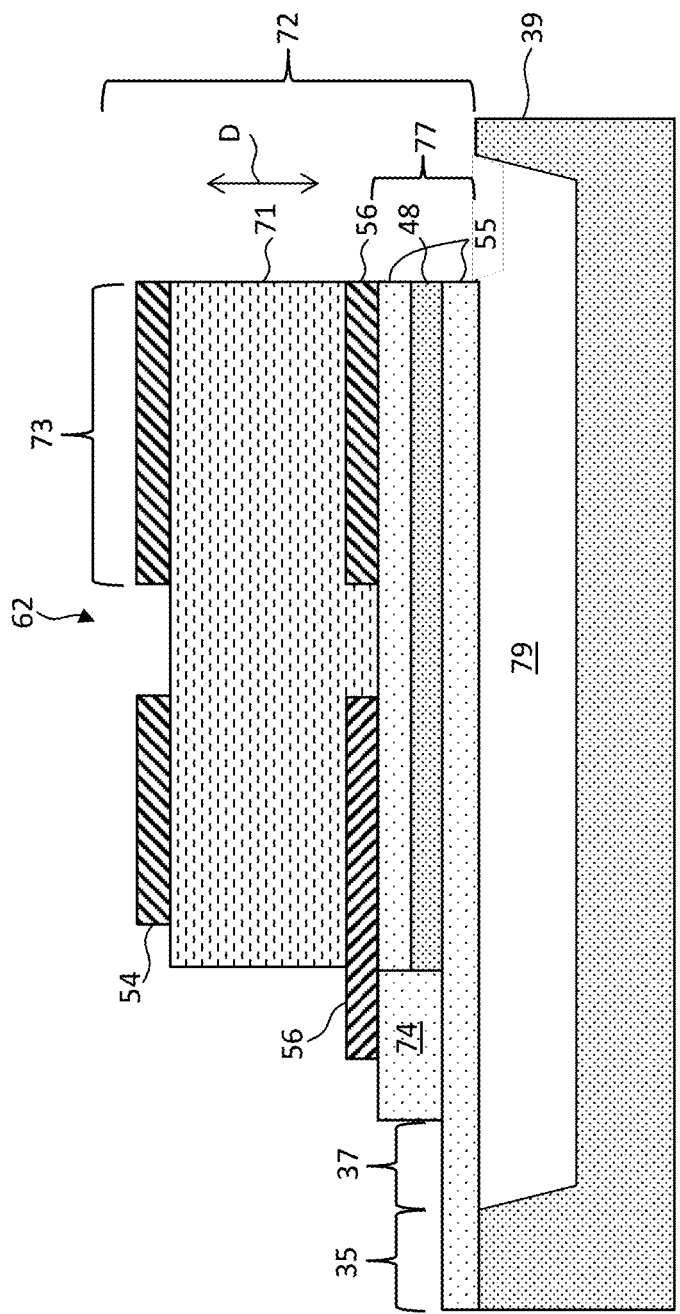

Piezoelectric cantilevers 72 and mass 73 can be undercut with an etchant, for example TMAH or KOH, that removes the sacrificial portion forming cavity 79, suspending piezoelectric cantilever 72 over component source wafer 39. According to some embodiments of the present disclosure, power support 74 is not undercut and remains attached to component source wafer 39, as shown in FIG. 58A, forming a non-transfer-printable power component 62. According to some embodiments of the present disclosure, power support 74 is undercut and remains attached to component source wafer 39 with a tether, enabling power component 62 to be printed (e.g., micro-transfer printed), as shown in FIG. 58B.

Cap 75 can be disposed on power support 74 (as shown in FIG. 43B) or on component source wafer 39 (as shown in FIG. 47B) in step 630. An electrical load (e.g., components such as controller 40, power convertor 64, and LEDs 30) can be provided, for example by micro-transfer printing to component source wafer 39 in step 660 and can be electrically connected to power component 62 in step 670 (for example using wires formed by photolithographic methods and processes). According to embodiments of the present disclosure, piezoelectric cantilever 72 can extend in a direction substantially parallel to a surface of the system substrate and can mechanically oscillate in a direction D substantially orthogonal to the surface of the system substrate. Substantially can mean within manufacturing tolerance, within 1, 2, 5, 10, 20, 30, or 45 degrees, or as intended. Power component 62 and the electrical load can then be operated on component source wafer 39 or system substrate in step 680.

Figure 57:
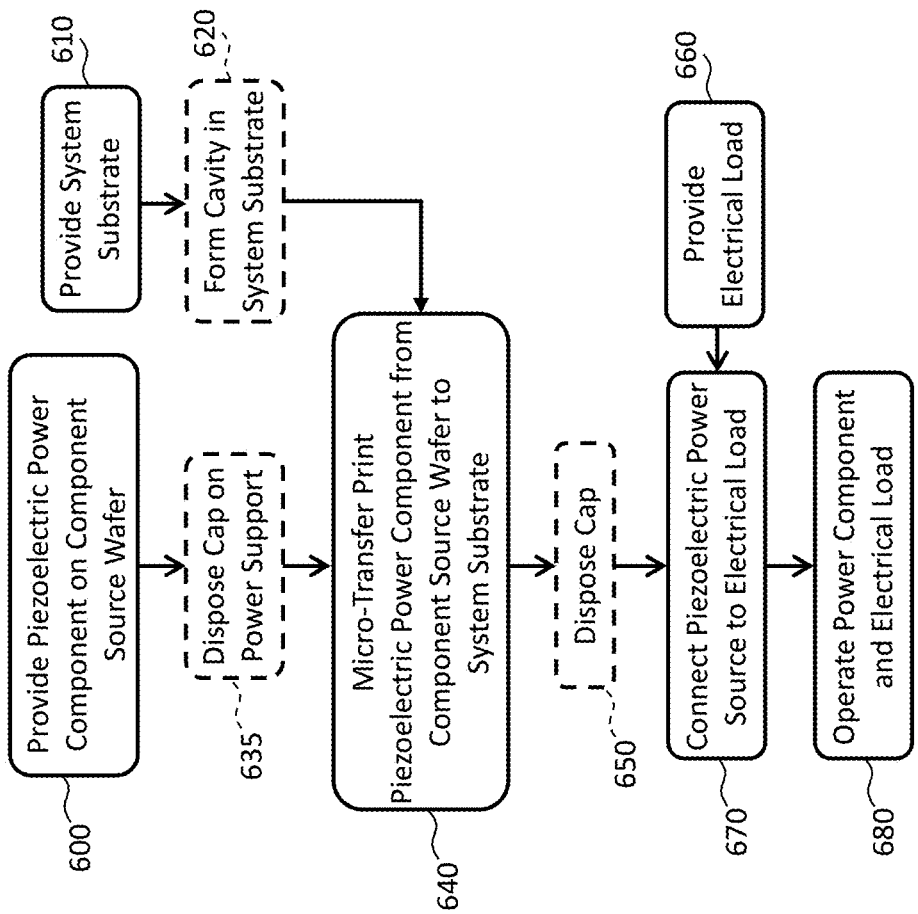

In some embodiments, sacrificial portion 48 extends under power support 74 and power support 74 is undercut by an etchant and micro-transfer printed to a separate system substrate, fracturing component tether 37. According to some embodiments and as shown in FIG. 58B, power support 74 is also undercut with the etchant to release power component 62 so that power component 62 is connected by component tether 37 to component anchor 35 (as shown in FIGS. 40A and 40B). As shown in FIG. 57, in step 610, a system substrate is provided. The system substrate can be any suitable target substrate, either rigid or flexible, and can be, for example, an intermediate substrate 59, secure document, an element of a secure document, a document 20 (e.g., banknote 20), an element of a document 20, a foil, or a ribbon. Optionally, a cavity 79 (or portion of cavity 79) is formed in the system substrate in step 620, e.g., in document substrate 20 or intermediate substrate 59, as shown in FIG. 40F. In optional step 630, a cap 75 can be disposed on power support 74, for example by micro-transfer printing cap 75 from a cap source wafer to power support 74. Released power component 62 can then be micro-transfer printed in step 640 from component source wafer 39 to the system substrate. If power component 62 is disposed on component substrate 38, component substrate 38 can form a bottom for power component 62. If power component 62 has an open bottom, the system substrate, with or without a cavity 79, can form a bottom for power component 62, e.g., power support 74 is disposed directly on the system substrate. If at least a portion of cavity 79 is provided in the system substrate, power component 62 is disposed over cavity 79.

If cap 75 was not provided in step 635, one can be disposed on power support 74 or the system substrate in optional step 650. An electrical load can be provided in step 660 and electrically connected in step 670 as described with respect to FIG. 56. Power component 62 and the electrical load can then be operated on component source wafer 39 or system substrate in step 680.

Thus, according to embodiments of the present disclosure, a method of making a piezoelectric power system comprises providing a piezoelectric power component 62 physically connected to a component source wafer 39 with a component tether 37, providing a system substrate, and micro-transfer printing piezoelectric power component 62 from the component source wafer 39 to the system substrate. Piezoelectric power component 62 comprises a layer of piezoelectric material 71, a first electrode 54 disposed on a first side of piezoelectric material 71, and a second electrode 56 disposed on a second side of piezoelectric material 71 opposite the first side. Methods of the present disclosure can comprise any one or more of fracturing or separating component tether 37 by printing (e.g., micro-transfer printing) piezoelectric power component 62 from component source wafer 39 to the system substrate, disposing a cap 75 over piezoelectric power component 62, disposing cap 75 on power support 74, and disposing cap 75 on the system substrate.

Thus, according to some embodiments, piezoelectric power component 62 comprises power support 74 and piezoelectric cantilever 72 extending from power support 74 and methods of the present disclosure comprise disposing cap 75 on power support 74 over piezoelectric cantilever 72, either before or after printing piezoelectric power component 62 from component source wafer 39 to a system substrate.

Some methods of the present disclosure comprise forming a cavity 79 in the system substrate and micro-transfer printing the piezoelectric power component 62 to the system substrate with piezoelectric cantilever 72 disposed over cavity 79.

Some methods of the present disclosure comprise electrically connecting first electrode 54 and second electrode 56 to an electrical load. The electrical load can be disposed on the system substrate. Some methods of the present disclosure comprise operating an electrical load with power produced by power component 62.

Figure 59:
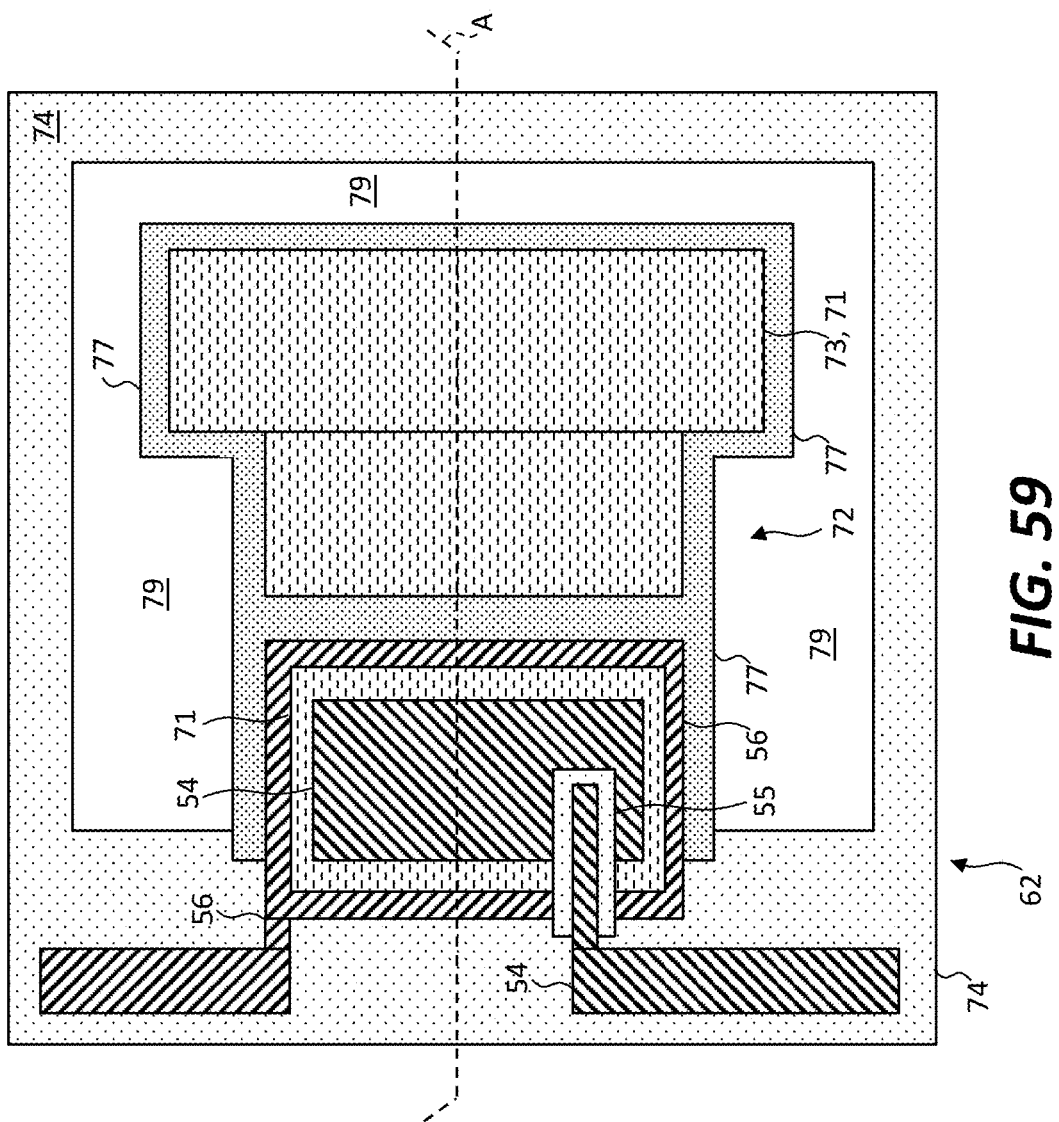
FIG. 59 is a top view of a piezoelectric cantilever with cross section line A corresponding to the cross sections of FIGS. 58A and 58B according to embodiments of the present disclosure.

FIG. 59 is a top view of a power component 62 according to embodiments of the present disclosure with a cross section line A corresponding to the embodiments illustrated in FIGS. 58A and 58B. (For simplicity, FIG. 59 illustrates only one piezoelectric cantilever 72 surrounded by power support 74 but according to some embodiments, power component 62 comprises multiple piezoelectric cantilevers 72, e.g., as shown in FIGS. 41A-51 and 53-55B.) In power component 62 of FIG. 59, a cantilever support layer 77 is physically connected to and surrounded by a power support 74. A second electrode 56 is patterned over a portion of cantilever support layer 77 and power support 74 where power is to be generated. FIG. 59 illustrates second electrode 56 disposed over a portion of power support 74 and cantilever support layer 77 where cantilever support layer 77 connects to power support 74. Second electrode 56 extends onto power support 74 to provide connection pads or serial or parallel electrical connections to other piezoelectric cantilevers 72 or external electronic circuits (e.g., an electrical load, controller 40, circuit 42, or power converter 64). No second electrode 56 material is disposed and patterned on mass 73 in embodiments according to FIG. 59 (but, according to some embodiments, a material of second electrode 56 could be disposed as a portion of mass 73 but not connected to second electrode 56, for example as shown in FIG. 47B). A layer of piezoelectric material 71 is disposed over second electrode 56 to generate power and is disposed over a distal end of cantilever support layer 77 to provide mass 73. A first electrode 54 can be disposed over piezoelectric material 71 in correspondence with second electrode 56. A material of first electrode 54 could be disposed as a portion of mass 73 and not connected to first electrode 54, for example as shown in FIG. 47B, but is omitted in embodiments according to FIG. 59. Dielectric 55 material is disposed over a portion of second electrode 56 and piezoelectric material 71 to insulate additional material of first electrode 54 from second electrode 56 and piezoelectric material 71 and provide connection pads or serial or parallel electrical connections to other piezoelectric cantilevers 72 or external electronic circuits. The additional first electrode 54 material can electrically connect to the first material electrode 54 material disposed on piezoelectric material 71 through a via in dielectric 55 material. Dielectric 55 material could be disposed and patterned as a portion of mass 73 but is omitted in FIG. 59. According to some embodiments, sacrificial material beneath piezoelectric cantilever 72 is sacrificed to form cavity 79 and enable piezoelectric cantilever 72 to mechanically oscillate and generate electrical power. According to some embodiments, sacrificial material extends beneath power support 74 so that power component 62 is connected to an anchor portion of power component substrate 38 with a component tether 37 so that power component 62 can be micro-transfer printed from power component substrate 38 (e.g., as shown in FIGS. 42A and 42B but not shown in FIG. 59).

Performance of embodiments of the present disclosure, such as those illustrated in FIGS. 41C, 50, 51, 55B, and 59, has been simulated. According to some embodiments, mass 73 is substantially square and has edges that range in size from 300 to 1000 microns, component tethers 37 that range in length from 50 to 200 microns and in width from 50 to 100 microns. According to some embodiments, piezoelectric material 71 and first and second electrodes 54, 56 can have a power-generating length of 30 to 50 microns. Piezoelectric cantilever can have a thickness of, for example 1-100 microns (e.g., 1-50 microns, 1-20 microns, 1-10 microns, 1-5 microns, 1-4 microns, 1-3 microns, 1-2 microns, or 1 micron). In some embodiments, for example, power component 62 has a thickness of 2-6 microns or 3-5 microns. In some embodiments, the number of component tethers per side of mass 73 and power support 74 can range from 1 to 14. However, embodiments of the present disclosure are not limited to these experimental power components 62.

Figure 60:
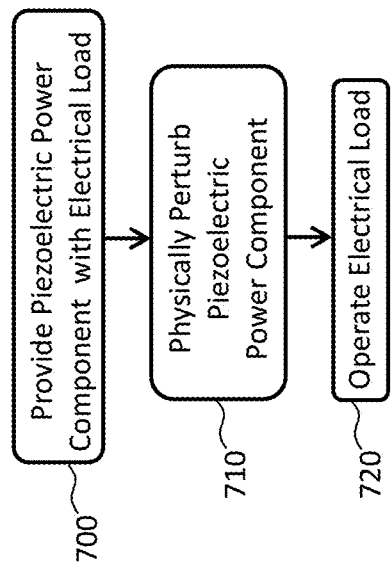
FIG. 60 is a flow diagram according to embodiments of the present disclosure.

FIG. 60 is a flow diagram illustrating the operation or use of power component 62 according to embodiments of the present disclosure. As shown in FIG. 60, a piezoelectric power component 62 electrically connected to an electrical load is provided in step 700, for example on a system substrate or component substrate 38. The piezoelectric power component 62 and electrical load are physically perturbed (e.g., agitated, rotated, accelerated, vibrated or otherwise spatially moved) in step 710 to generate electrical power with power component 62 that operates the electrical load in step 720. Thus, according to embodiments of the present disclosure, a method of operating a piezoelectric power system (e.g., a power component 62 electrically connected to an electrical load) comprises providing a piezoelectric power component 62 electrically connected to an electrical power load, mechanically perturbing piezoelectric power component 62 to generate electrical power, and operating the electrical load with the power generated by power component 62. Piezoelectric power component 62 comprises a piezoelectric cantilever 72 comprising a layer of piezoelectric material 71, a first electrode 54 on a first side of piezoelectric material 71, and a second electrode 56 on a second side of piezoelectric material 71 opposite the first side. The electrical power load is electrically connected to first electrode 54 and the second electrode 56. According to some embodiments, piezoelectric power component 62 comprises a fractured component tether 37. According to some embodiments, piezoelectric power component 62 has a thickness less than 1 mm (e.g., no greater than 500, 200, 100, 50, 20, 10, 5, 1, or 0.5 microns). According to some embodiments, piezoelectric power component 62 has a length or width less than 1 mm (e.g., no greater than 500, 200, 100, 50, 20, or 10 microns).

According to some embodiments, a piezoelectric power component system comprises a piezoelectric power component 62 disposed on a substrate (e.g., a system substrate or target substrate). Piezoelectric power component 62 can be non-native to the substrate. Piezoelectric power component 62 can have an open bottom adjacent to the substrate. Piezoelectric power component 62 can comprise a cap 75 disposed over piezoelectric power component 62 affixed to the substrate or to piezoelectric power component 62. Piezoelectric power component 62 can have a thickness no greater than 5, 10, 20, 50, 100, 200, or 500 microns. Piezoelectric power component 62 can have a length or width no greater than 10 mm (e.g., no greater than 5 mm, no greater than 2 mm, no greater than 1 mm, no greater than 500 microns, no greater than 250 microns, no greater than 200 microns, no greater than 100 microns, no greater than 50 microns, or no greater than 20 microns. Piezoelectric power component 62 length or width can be in a direction parallel to, and thickness can be in a direction orthogonal to a system substrate on which non-native piezoelectric power component 62 is disposed. Piezoelectric power component 62 can comprise a fractured or separated component tether 37. Such small piezoelectric power components 62 can be constructed using photolithography and integrated into micro-assembled systems, for example using micro-transfer printing and operated and used, for example, in small portable electronic systems or devices or components (such as security materials) comprising small portable electronic systems.

A component source wafer 39 can be any wafer, for example an SOI wafer or wafers as are found in the integrated circuit arts, that can be suitably processed to construct component 36 and from which component 36 can be released and optionally disposed on intermediate substrate 59 or document 20, for example by micro-transfer printing. In some embodiments, a semiconductor (e.g., silicon) wafer or a dielectric (e.g., glass or polymer) wafer can be used. First and second electrodes 54, 56 can be a metal or other electrical conductors, piezoelectric material 71 can be KNN or PZT or other piezoelectric material 71, and can be deposited using photolithographic methods, for example evaporation or sputtering, and can be patterned using photolithographic methods and materials, for example photoresist deposition, exposure to patterned electromagnetic radiation, pattern-wise etching, and stripping. Power support 74 can be an organic or inorganic dielectric (e.g., a polymer or silicon dioxide) patterned and can be similarly patterned using photolithographic methods and materials. Power support 74 can be constructed before, after, or as part of the process steps used to construct and pattern first and second electrodes 54, 56 or piezoelectric material 71 or both. Power support 74 can be disposed adjacent to piezoelectric cantilever 72 (e.g., as shown in FIGS. 30, 31B, and 40F) or can be disposed under an end of piezoelectric cantilever 72 (e.g., forming an L-shape with piezoelectric cantilever 72 extending further horizontally than power support 74 extends vertically) (not shown). Capacitor(s) 67 can also be constructed with similar or the same materials and in common step(s) with first and second electrodes 54, 56 or piezoelectric material 71 or both or can be constructed or disposed separately. For example, capacitor(s) 67 can comprise a first electrode 54, a second electrode 56, and piezoelectric material 71 between first and second electrodes 54, 56 in a common layer with piezoelectric cantilever 72 and as shown in FIG. 36C. Controller 40 and inorganic light-emitting diodes 30 can be disposed on component substrate 38, for example by micro-transfer printing, and electrically connected with wires 52, for example using photolithographic methods and materials.

First and second electrodes 54, 56 and piezoelectric material 71 can be released by etching component substrate 38 beneath first and second electrodes 54, 56 and piezoelectric material 71, for example by anisotropically etching (e.g., a silicon component substrate 38) or by etching a sacrificial oxide (buried oxide) layer disposed on or as a part of component substrate 38 and over which first and second electrodes 54, 56 and piezoelectric material 71 are disposed, for example with TMAH or KOH.

Cap 75 can be disposed on and adhered to power support(s) 74, for example by micro-transfer printing cap 75 onto power support(s) 74 with an adhesive layer. Cap 75 can comprise a cap tether. Cap 75 can, for example, be disposed on power support 74 and one or more other side wall structures to enclose piezoelectric cantilever 72 in cavity 79 or can itself include one or more side walls and be disposed over piezoelectric cantilever 72 (and optionally power support 74) to enclose cavity 79.

One of ordinary skill in the art will appreciate that throughout the description where an embodiment or embodiments are described as including one or more "iLEDs," "light-emitting diodes," or "inorganic light-emitting diodes," analogous embodiments are contemplated where other light-controlling elements are used instead, making any needed modifications necessary or desirable for operability to be maintained, for example sizing, orientation, or location of electrodes used to provide power to or otherwise control the light-controlling elements. More specifically, where an "inorganic light-emitting diode" is expressly described, unless otherwise clear from context, other light-emitting diodes can be substituted to form analogous embodiments to the expressly described one(s). Various different light-controlling elements that can be used in embodiments of the disclosure have been described throughout, but the disclosure is not limited thereto.

As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the disclosure should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

The invention has been described in detail with particular reference to certain embodiments thereof, but it will be understood that variations and modifications can be effected within the spirit and scope of the invention.

PARTS LIST

A cross section line
D direction/distance
10 hybrid currency banknote/hybrid document
20 banknote/document/flexible banknote/document substrate
22 visible markings
24 document surface
26 central portion
30 inorganic light-emitting diode/iLED/light-emitting diode/LED/light-controlling element
31 LED tether
32 light pipe
34 light leak/diffuser
35 component anchor
36 component
37 component tether
38 component substrate
39 component source wafer
40 controller
42 circuit 44 memory
46 shield
48 epi/epitaxy/epitaxial layer
50 power input connection
52 wires
54 first electrode
55 dielectric
56 second electrode
58 encapsulation layer
59 intermediate substrate
59A bulk layer
59B buried oxide layer
59C epitaxial layer
60 power source/piezoelectric power source
61 mid-line
62 power component/piezoelectric power component
63 hole/opening
64 power convertor
65 convertor tether/controller tether
66 power connection pads
67 capacitor
68 capacitive touch sensor
69 connection post
70 ribbon
71 piezoelectric material/piezoelectric layer/layer of piezoelectric material
72 piezoelectric cantilever/cantilever
72A piezoelectric cantilever/cantilever
72B piezoelectric cantilever/cantilever
73 mass
74 power support
75 cap
76 cantilever plane
77 cantilever support/cantilever support layer
78 oscillation direction
79 cavity
80 display
82 red inorganic light-emitting diode
84 green inorganic light-emitting diode
86 blue inorganic light-emitting diode
88 light
90 hybrid currency teller machine
91 slot
92 reader
93 writer
94 input device
96 optional teller machine display
98 teller machine controller
100 provide banknote with markings step
110 provide ribbon step
120 provide iLED wafer step
130 provide controller source wafer step
140 micro-transfer print iLEDs on ribbon step
150 micro-transfer print controller on ribbon step
160 optional micro-transfer print power source on ribbon step
170 form connections/pads on ribbon step
180 integrate ribbon in banknote step
200 receive banknote step
210 provide power to banknote step
220 view emitted light step
250 insert banknote in teller step
260 read stored value step
270 input value step
280 store new value step
290 return banknote step
300 provide component wafer step
310 print iLEDs on component step
320 print controller on component step
330 dispose component on ribbon step
340 dispose power source on component step
400 provide hybrid document step
410 flatten hybrid document step
420 move ends together step
430 move ends apart step
440 observe light emission step
500 provide component substrate
510 deposit first electrode, piezo material, & second electrode step
520 pattern first electrode, piezo material, & second electrode step
530 deposit and pattern power support step
540 etch component substrate to form cavity step
550 dispose cap step
555 dispose component on intermediate substrate step
560 dispose controller, LED(s) and wiring on component substrate step
565 dispose controller, LED(s) and wiring on intermediate substrate step
570 dispose component on document step
600 provide piezoelectric power component on source wafer step
610 provide system substrate step
620 optional form cavity in system substrate step
630 dispose cap step
635 optional dispose cap on power support step
640 micro-transfer print piezoelectric power component to system substrate step
650 optional dispose cap step
660 provide electrical load step
670 connect piezoelectric power component to electrical load step
680 operate power component and electrical load step
700 provide piezoelectric power component step
710 physically perturb piezoelectric power component step
720 operate electrical load step

What is claimed:

1. A piezoelectric power component, comprising:
a power support; and
piezoelectric cantilevers extending from the power support, wherein each of the piezoelectric cantilevers comprises a piezoelectric layer comprising piezoelectric material, a first electrode on a first side of the piezoelectric material, and a second electrode on a second side of the piezoelectric material opposite the first side, wherein the power support forms a polygon around the piezoelectric cantilevers and the piezoelectric cantilevers extend from a common side of the polygon.

2. The piezoelectric power component of claim 1, wherein at least one of the piezoelectric cantilevers extends in a first direction from the power support and at least one of the piezoelectric cantilevers extends in a second direction from the power support, wherein the first direction is different from the second direction.

3. The piezoelectric power component of claim 1, wherein the power support forms an enclosure surrounding the piezoelectric cantilevers and the power support extends into the enclosure.

4. The piezoelectric power component of claim 1, wherein the power support comprises a component tether.

5. The piezoelectric power component of claim 4, wherein the component tether is fractured.

6. The piezoelectric power component of claim 1, wherein the power support has an open bottom.

7. The piezoelectric power component of claim 1, wherein the piezoelectric cantilevers extend from the power support a height above a bottom of the power support a distance that is no less than a displacement distance of the piezoelectric cantilever.

8. The piezoelectric power component of claim 1, wherein for at least two of the piezoelectric cantilevers, the layer of piezoelectric material is a common layer.

9. A piezoelectric power component, comprising:
a power support;
piezoelectric cantilevers extending from the power support, wherein each of the piezoelectric cantilevers comprises a piezoelectric layer comprising piezoelectric material, a first electrode on a first side of the piezoelectric material, and a second electrode on a second side of the piezoelectric material opposite the first side; and
(i) a separate single, unitary mass disposed on an end of each of the piezoelectric cantilevers, (ii) a single, unitary mass disposed in common on two or more adjacent ones of the piezoelectric cantilevers, or (iii) a single, unitary mass disposed in common on ends of all of the piezoelectric cantilevers.

10. A piezoelectric power component, comprising:
a power support; and
piezoelectric cantilevers extending from the power support, wherein each of the piezoelectric cantilevers comprises a piezoelectric layer comprising piezoelectric material, a first electrode on a first side of the piezoelectric material, and a second electrode on a second side of the piezoelectric material opposite the first side,
wherein the piezoelectric cantilevers each comprise a cantilever support layer and the piezoelectric layer, the first electrode and the second electrode are disposed in two or more separate portions along the cantilever support layer and each portion extends along the cantilever support layer a distance less than one half of a length of the cantilever support layer.

11. The piezoelectric power component of claim 10, wherein the piezoelectric layer is disposed on the cantilever support layer between the power support and no more than one half of the length of the cantilever support layer.

12. A piezoelectric power component, comprising:
a power support; and
piezoelectric cantilevers extending from the power support, wherein each of the piezoelectric cantilevers comprises a piezoelectric layer comprising piezoelectric material, a first electrode on a first side of the piezoelectric material, and a second electrode on a second side of the piezoelectric material opposite the first side,
wherein the piezoelectric cantilevers each comprise a cantilever support layer and the piezoelectric layer, the first electrode, and the second electrode each comprise a physically separate first portion and second portion along the cantilever support layer and the first portion is adjacent to a first end of the cantilever support layer proximate to the power support and the second portion is adjacent to a second end of the cantilever support layer opposite to the first end.

13. A piezoelectric power component, comprising:
a power support; and
piezoelectric cantilevers extending from the power support, wherein each of the piezoelectric cantilevers comprises a piezoelectric layer comprising piezoelectric material, a first electrode on a first side of the piezoelectric material, and a second electrode on a second side of the piezoelectric material opposite the first side,
wherein (i) the piezoelectric power component comprises a component substrate and the power support and piezoelectric cantilevers are disposed on the component substrate, (ii) the piezoelectric power component is disposed on a system substrate, or (iii) the piezoelectric power component comprises a component substrate, the power support and piezoelectric cantilevers are disposed on the component substrate, and the component substrate is disposed on a system substrate.

14. The piezoelectric power component of claim 13, wherein the piezoelectric cantilever extends from the power support at a height above a bottom of the power support that is less than a displacement distance of the piezoelectric cantilever and the component substrate or destination substrate comprises a cavity or sacrificial portion disposed beneath the piezoelectric cantilever.

15. The piezoelectric power component of claim 13, wherein the component support or system substrate, or both, form a bottom for the power component.

16. The piezoelectric power component of claim 13, wherein the power support and the component substrate or system substrate, or both, form an enclosure enclosing the piezoelectric cantilevers.

17. A piezoelectric power component, comprising:
a power support; and
piezoelectric cantilevers extending from the power support, wherein each of the piezoelectric cantilevers comprises a piezoelectric layer comprising piezoelectric material, a first electrode on a first side of the piezoelectric material, and a second electrode on a second side of the piezoelectric material opposite the first side,
wherein the power support comprises a first power support portion and a second power support portion, the piezoelectric cantilevers comprise a first piezoelectric cantilever extending from the first power support portion and a second piezoelectric cantilever extending from the second power support portion, and
wherein the second power support portion and the second piezoelectric cantilever are disposed within an area surrounded by the first power support portion so that the piezoelectric power component is a nested power component.

18. A piezoelectric power component, comprising:
a power support; and
piezoelectric cantilevers extending from the power support, wherein each of the piezoelectric cantilevers comprises a piezoelectric layer comprising piezoelectric material, a first electrode on a first side of the piezoelectric material, and a second electrode on a second side of the piezoelectric material opposite the first side,
wherein the power support comprises a first power support portion and a second power support portion, the piezoelectric cantilevers comprise a first piezoelectric cantilever extending from the first power support portion and a second piezoelectric cantilever extending from the second power support portion, and
wherein for at least two of the piezoelectric cantilevers, the layer of piezoelectric material is a common layer, and each of the at least two of the piezoelectric cantilevers extends in a different direction.

* * * * *